(12) United States Patent
Liao et al.

(10) Patent No.: US 12,727,141 B2
(45) Date of Patent: Sep. 1, 2026

(54) VERTICAL GATE-ALL-AROUND (GAA) MEMORY CELL AND METHOD FOR FORMING THE SAME

(71) Applicant: Taiwan Semiconductor Manufacturing Company, Ltd., Hsinchu (TW)

(72) Inventors: Shih-Yu Liao, Hsinchu City (TW); Chung-Liang Cheng, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 349 days.

(21) Appl. No.: 18/425,202

(22) Filed: Jan. 29, 2024

(65) Prior Publication Data

US 2025/0089229 A1 Mar. 13, 2025

Related U.S. Application Data

(60) Provisional application No. 63/581,714, filed on Sep. 11, 2023.

(51) Int. Cl.
*H10B 10/00* (2023.01)
*H10D 30/01* (2025.01)
(Continued)

(52) U.S. Cl.
CPC .......... *H10B 10/125* (2023.02); *H10B 10/15* (2023.02); *H10D 30/014* (2025.01); *H10D 30/43* (2025.01);
(Continued)

(58) Field of Classification Search
CPC ...... H10B 10/125; H10B 10/15; H10B 10/12; H10D 30/014; H10D 30/43;
(Continued)

(56) References Cited

U.S. PATENT DOCUMENTS 10,957,392 B2 3/2021 Lee et al.
2006/0170031 A1 8/2006 Kang et al.
(Continued)

OTHER PUBLICATIONS

Intrinsic ID "SRAM PUF Technology" The date of publication is unknown. Retrieved online on Oct. 18, 2023 from https://www.intrinsic-id.com/sram-puf/#:~:text=SRAM%20PUF%20Technology&text=Using%20this%20technology%2C%20security%20keys,%2C%20guessed%2C%20stolen%20or%20shared.

*Primary Examiner* — Mohammed R Alam
(74) *Attorney, Agent, or Firm* — Eschweiler & Potashnik, LLC

(57) ABSTRACT

Various embodiments of the present disclosure are directed to a vertical gate-all-around (GAA) memory cell. A middle conductor overlies a lower conductor and decreases in width towards the lower conductor to culminate in a point spaced from the lower conductor. An insulator structure is between the lower conductor and the middle conductor. A semiconductor channel overlies the middle conductor, and a gate electrode laterally surrounds the semiconductor channel on a sidewall of the semiconductor channel. A gate dielectric layer separates the gate electrode from the semiconductor channel, and an upper conductor overlies the semiconductor channel. The lower and middle conductors and the insulator structure correspond to a resistor, whereas the middle conductor, the upper conductor, the gate electrode, the gate dielectric layer, and the semiconductor channel correspond to a transistor atop the resistor.

20 Claims, 40 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10W 20/41*** | (2026.01) |
| ***H10W 20/42*** | (2026.01) |

(52) U.S. Cl.
CPC ..... *H10D 30/6735* (2025.01); *H10D 30/6757* (2025.01); *H10D 62/121* (2025.01); *H10W 20/42* (2026.01); *H10W 20/435* (2026.01)

(58) Field of Classification Search
CPC ........... H10D 30/6735; H10D 30/6757; H10D 62/121; H10W 20/42; H10W 20/435
See application file for complete search history.

(56) References Cited

U.S. PATENT DOCUMENTS

| | | | | |
|---|---|---|---|---|
| 2011/0156119 | A1 | 6/2011 | Chung et al. | |
| 2012/0281490 | A1 | 11/2012 | Cho | |
| 2014/0003122 | A1 | 1/2014 | Wang et al. | |
| 2014/0061746 | A1 | 3/2014 | Cho et al. | |
| 2019/0035791 | A1* | 1/2019 | Zang .................... | H10D 86/451 |
| 2021/0398847 | A1* | 12/2021 | Parekh ................ | H10W 20/056 |

* cited by examiner 2500
120
126b
118
114
128a
110
126a
Mx
108/418
104
104
112

VERTICAL GATE-ALL-AROUND (GAA) MEMORY CELL AND METHOD FOR FORMING THE SAME

REFERENCE TO RELATED APPLICATION

This application claims the benefit of U.S. Provisional Application No. 63/581,714, filed on Sep. 11, 2023, the contents of which are incorporated by reference in their entirety.

BACKGROUND

Internet of Things (IoT) devices and the like are increasingly using physical unclonable function (PUF) devices to generate unique digital fingerprints. A PUF device generates a unique value based on randomness in electrical properties of the PUF device that intrinsically results from manufacturing variation. Static random-access memory (SRAM) memory cells are commonly used for PUF devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
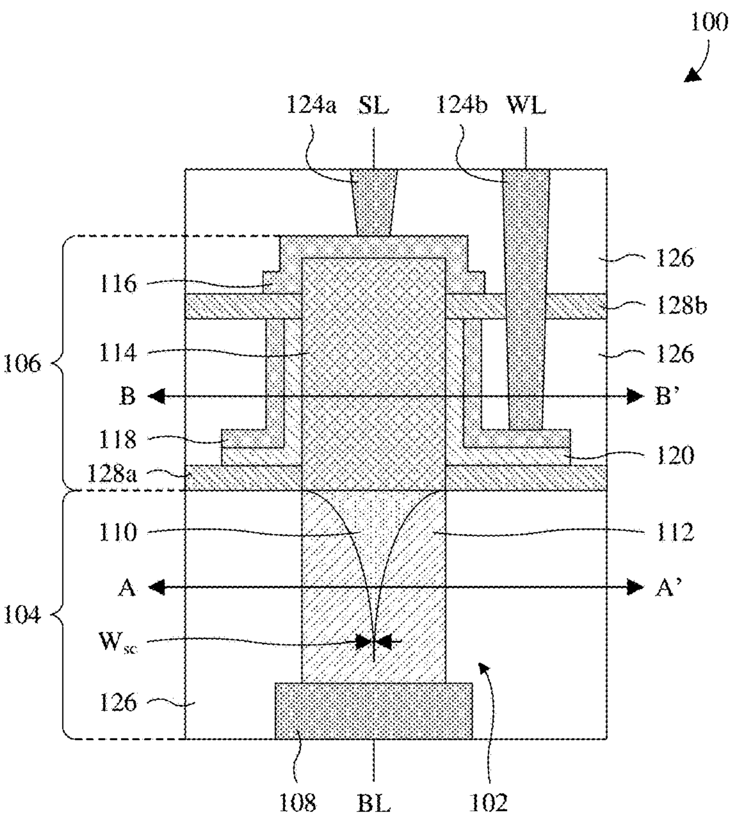
FIG. 1 illustrates a cross-sectional view of some embodiments of a vertical gate-all-around (GAA) memory cell for use as a physical unclonable function (PUF) device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random-access memory (SRAM) cells may have random differences in electrical properties, which intrinsically result from manufacturing variation. These random differences may be used to generate physical unclonable function (PUF) values (e.g., “0” or “1”) individual to the SRAM cells. For example, an SRAM cell may have a preferred state (e.g., a logic “0” or a logic “1”) upon being powered on and before initialization. This preferred state may vary randomly from SRAM cell to SRAM cell due to intrinsic manufacturing variation and may hence be used as a PUF value for the SRAM cell.

A challenge with using SRAM cells as PUF devices is that SRAM cells have low stability. Electrical properties from which PUF values are generated may vary in response to environmental conditions, such as temperature or the like. For example, preferred states of SRAM cells may vary in response to environmental conditions. Therefore, a unique digital fingerprint generated from PUF values of SRAM cells may vary with environmental conditions, which may pose problems since the unique digital fingerprint is expected to be constant regardless of environmental conditions.

Various embodiments of the present disclosure are directed to a vertical gate-all-around (GAA) memory cell for use as a PUF device. In contrast with an SRAM cell, electrical properties of the vertical GAA memory cell have high stability. For example, the electrical properties may be less affected by environmental conditions, such as temperature or the like. Accordingly, a PUF value generated by the vertical GAA memory cell has high stability compared to a PUF value generated by an SRAM cell.

It has been appreciated that the high stability results from the vertical GAA memory cell having a low number of functional elements. For example, the vertical GAA memory cell may have only two functional elements (e.g., a resistor and a transistor), whereas an SRAM cell may have six or more functional elements (e.g., six transistors). The low number of functional elements may also lead to a small size and hence high memory density.

In some embodiments, the vertical GAA memory cell comprises a resistor and a GAA transistor overlying and electrically coupled in series with the resistor. The resistor is formed by a pair of conductors that are vertically stacked and spaced from each other by an insulator structure. The pair of conductors comprises a first conductor and a second conductor. The second conductor overlies the first conductor and decreases in width vertically towards the first conductor to culminate in a point spaced over the first conductor. Resistance of the resistor varies depending on separation between the point and the first conductor.

It has been appreciated that separation between the point and the first conductor has randomness that intrinsically results from manufacturing variation. Hence, resistance of the resistor has randomness that intrinsically results from manufacturing variation. This randomness may be used to generate PUF values and hence unique digital fingerprints. Further, because the vertical GAA memory has high stability, the PUF values and the unique digital fingerprints may remain constant regardless of environmental conditions and the like.

With reference to FIG. 1, a cross-sectional view 100 of some embodiments of a vertical GAA memory cell 102 for use as a PUF device is provided. The vertical GAA memory cell 102 comprises a resistor 104 and a GAA transistor 106. As seen hereafter, the vertical GAA memory cell 102 may be regarded as a one-transistor one-resistor (1T1R) memory cell, resistive random-access memory (RRAM) memory cell, or the like.

The resistor 104 is formed by a first conductor 108 and a second conductor 110 that are vertically stacked and spaced from each other by an insulator structure 112. The first conductor 108 underlies the second conductor 110 and the insulator structure 112, and further has a flat or substantially flat surface facing the second conductor 110 and the insulator structure 112. The second conductor 110 extends into the insulator structure 112 towards the first conductor 108. Further, the second conductor 110 decreases in width $W_{sc}$ vertically towards the first conductor 108 to culminate in a point spaced over the first conductor 108.

Resistance of the resistor 104 varies depending on separation between the point and the first conductor 108. It has been appreciated that separation between the point and the first conductor has randomness that intrinsically results from manufacturing variation. Hence, resistance of the resistor 104 has randomness that intrinsically results from manufacturing variation. This randomness may be used to generate PUF values and hence a unique digital fingerprint. Further, it has been appreciated that the resistance has high stability. For example, resistance is unaffected or substantially unaffected by environmental conditions. Hence, the PUF values and the unique digital fingerprint may have high stability.

The high stability with the PUF values and the unique digital fingerprint may, for example, result from the PUF values being generated from a low number of functional elements. For example, the PUF values may be generated from only two functional elements: the resistor 104; and the GAA transistor 106. In contrast, an SRAM cell that generates PUF values from six transistors or more may generate PUF values with low stability. The low number of functional elements may also lead to a small size and hence high memory density.

The GAA transistor 106 overlies and is electrically coupled in series with the resistor 104. Further, the GAA transistor 106 shares the second conductor 110 with the resistor 104. Whereas the second conductor 110 functions as a top electrode for the resistor 104, the second conductor 110 functions as a lower source/drain for the GAA transistor 106. Source/drain may refer to a source or a drain, individually or collectively dependent upon the context.

A semiconductor channel 114 overlies the second conductor 110, and a third conductor 116 overlies the semiconductor channel 114. The semiconductor channel 114 has a columnar profile extending from the second conductor 110 to the third conductor 116. The third conductor 116 is on a top surface of the semiconductor channel 114 and is also on sidewalls of the semiconductor channel 114. In alternative embodiments, the third conductor 116 is localized to the top surface of the semiconductor channel 114. Further, the third conductor 116 functions as an upper source/drain for the GAA transistor 106. In some embodiments, the second conductor 110 serves as a drain for the GAA transistor 106, whereas the third conductor 116 serves as a source for the GAA transistor 106, or vice versa.

A gate electrode 118 laterally surrounds the semiconductor channel 114 on sidewalls of the semiconductor channel 114 and, at least in the cross-sectional view 100, has a pair of segments between which the semiconductor channel 114 is laterally sandwiched. Further, the gate electrode 118 is vertically between the second conductor 110 and the third conductor 116 and is laterally separated from the semiconductor channel 114 by a gate dielectric layer 120.

A dielectric structure surrounds the vertical GAA memory cell 102. Further, the dielectric structure comprises a plurality of interconnect dielectric layers 126, a first etch stop layer 128*a*, and a second etch stop layer 128*b*. The plurality of interconnect dielectric layers 126 are alternatingly and vertically stacked with the first and second etch stop layers 128*a*, 128*b*. The first etch stop layer 128*a* underlies the gate electrode 118 and the gate dielectric layer 120, whereas the second etch stop layer 128*b* overlies the gate electrode 118 and the gate dielectric layer 120. Further, the second etch stop layer 128*b* underlies the third conductor 116 to separate the third conductor 116 from the gate electrode 118 and the gate dielectric layer 120.

During use of the vertical GAA memory cell 102, the gate electrode 118 may be selectively biased to vary conductivity of the semiconductor channel 114 and to vary electrical coupling between the second and third conductors 110, 116. For example, under a first bias condition, a gate-source voltage may be more than a threshold. As such, the semiconductor channel 114 may have a high conductivity and may electrically couple the second and third conductors 110, 116 together. Under a second bias condition, the gate-source voltage may be less than the threshold. As such, the semiconductor channel 114 may have low conductivity and may electrically isolate the second and third conductors 110, 116 from each other.

When the semiconductor channel 114 is in the conducting state (e.g., due to the first bias condition above), the resistance of the resistor 104 may be used to generate a PUF value. For example, a low voltage may be applied across the resistor 104, from the first conductor 108 to the third conductor 116, and the resulting current may be compared to a reference current to determine a PUF value. The resulting current being less than the reference current may result in a PUF value of "0", and the resulting current being more than the reference current may result in a PUF value of "1", or vice versa. The low voltage may, for example, be low in that it does not result in dielectric breakdown of the insulator structure 112.

While the foregoing discussion assumes the vertical GAA memory cell 102 is being used as a PUF device, the vertical GAA memory cell 102 is not restricted to be used as a PUF device. In alternative embodiments, the vertical GAA memory cell 102 may be used as a one-time-programmable (OTP) memory cell with the resistor 104 being an anti-fuse.

For example, when the vertical GAA memory cell 102 is initially formed, the vertical GAA memory cell 102 may be in a high resistance state (HRS). This HRS is subject to intrinsic randomness that may be used to generate PUF values as above. Further, the vertical GAA memory cell 102 may be irreversibly changed to a low resistance state (LRS) by applying a high voltage across the resistor 104. The high voltage may, for example, burn out a portion of the insulator structure 112 separating the tip from the first conductor 108, thereby resulting in low conductivity from the tip to the first conductor 108. The HRS may, for example, represent a logic "0", and the LRS may, for example, represent a logic "1", or a vice versa.

The logic state may, for example, be determined from the resistance of the vertical GAA memory cell 102 when the semiconductor channel 114 is in the conducting state. For example, a low voltage may be applied across the resistor 104, from the first conductor 108 to the third conductor 116, and the resulting current may be compared to a reference current to determine the state of the vertical GAA memory cell 102. The low voltage may, for example, be low in that it does not result in any dielectric breakdown of the insulator structure 112.

In some embodiments, the vertical GAA memory cell 102 is one of many memory cells in a plurality of rows and a plurality of columns. In some of such embodiments, the first conductor 108 is electrically coupled to a bit line BL, the third conductor 116 is electrically coupled to a source line SL through a first via 124*a*, and the gate electrode 118 is electrically coupled to a word line WL through a second via 124*b*. The source line SL or the bit line BL may, for example, be grounded during use of the vertical GAA memory cell 102.

In some embodiments, the width $W_{sc}$ of the second conductor 110 decreases continuously from a top surface of the second conductor 110 to the point of the second conductor 110. In some embodiments, a maximum width of the second conductor 110 is at the top surface of the second conductor 110, and/or the point of the second conductor 110 is at a bottommost elevation of the second conductor 110. In some embodiments, the top surface of the second conductor 110 is level with a top surface of the isolation structure 112. In some embodiments, a maximum width of the second conductor is substantially the same as a maximum width of the insulator structure 112. In some embodiments, the width $W_{sc}$ of the second conductor 110 has a maximum width of about 130-150 nanometers or some other suitable value.

In some embodiments, the first conductor 108 is or comprises a conductive material selected from an electrode-material group. In some embodiments, the second conductor 110 is or comprises a conductive material selected from the electrode-material group. In some embodiments, the third conductor 116 is or comprises a conductive material selected from the electrode-material group. In some embodiments, the gate electrode 118 is or comprises a conductive material selected from the electrode-material group. The electrode-material group may, for example, consist essentially of or comprise titanium nitride (e.g., TiN), tantalum nitride (e.g., TaN), molybdenum nitride (e.g., MoN), tungsten nitride (e.g., WN), aluminum, tungsten, copper, molybdenum, some other suitable metal or metal nitride, or any combination of the foregoing. In some embodiments, but not in all embodiments, the first conductor 108, the second conductor 110, the third conductor 116, and the gate electrode 118 are a same material (e.g., titanium nitride or some other suitable material).

In some embodiments, the insulator structure 112 is or comprises hafnium oxide (e.g., $HfO_2$), tantalum oxide (e.g., $Ta_2O_5$), titanium oxide (e.g., $TiO_2$), zirconium oxide (e.g., $ZrO_2$), aluminum oxide (e.g., $Al_2O_3$), or any combination of the foregoing. Further, in some embodiments, the insulator structure 112 is or comprises silicon oxide (e.g., $SiO_2$), silicon nitride (e.g., SiN), silicon oxynitride (e.g., SiON), silicon carbon nitride (e.g., SiCN), silicon carbon oxynitride (e.g., SiCON), or any combination of the foregoing.

In some embodiments, the semiconductor channel 114 is or comprises amorphous silicon, indium gallium zinc oxide (IGZO), copper oxide (e.g., $Cu_2O$), nickel oxide (e.g., NiO), tin oxide (e.g., SnO), some other suitable semiconductor material, or any combination of the foregoing. Further, in some embodiments, the semiconductor channel 114 is doped with an n-type doping or an p-type doping. For example, the semiconductor channel 114 may be or comprise n-type amorphous silicon, p-type amorphous silicon, n-type IGZO, p-type copper oxide, p-type nickel oxide, or p-type tin oxide.

In some embodiments, the first conductor 108, the second conductor 110, and the third conductor 116 may also be regarded respectively as a first electrode, a second electrode, and a third electrode. Further, in some embodiments, the first conductor 108, the second conductor 110, and the third conductor 116 may also be regarded respectively as a lower conductor or electrode, a middle conductor or electrode, and an upper conductor or electrode.

Figure 2A:
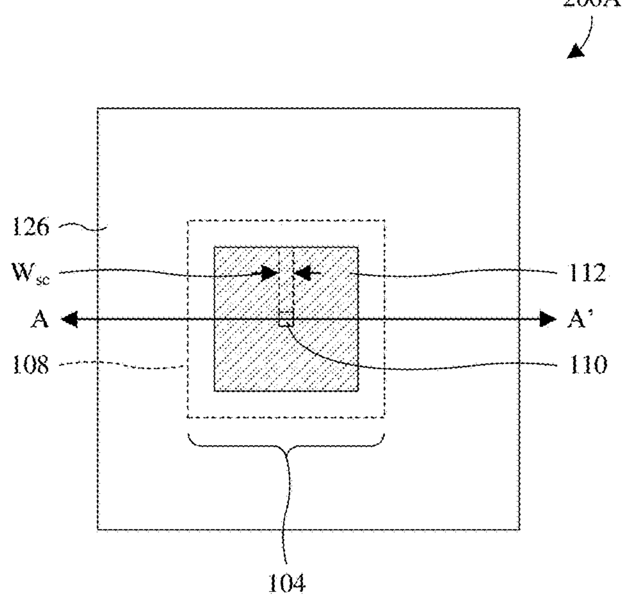
FIGS. 2A and 2B illustrate top layout views of some embodiments of the vertical GAA memory cell of FIG. 1.
Figure 2B:
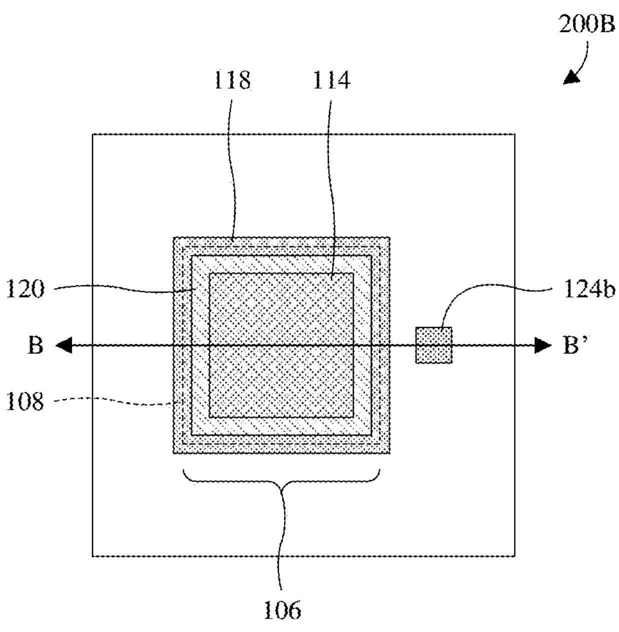

With reference to FIGS. 2A and 2B, top layout views 200A, 200B of some embodiments of the vertical GAA memory cell 102 of FIG. 1 are provided. FIG. 2A is taken along line A-A' in FIG. 1, which is at the resistor 104. FIG. 2B is taken along line B-B' in FIG. 1, which is at the GAA transistor 106. Additionally, the first conductor 108 is shown in phantom in both FIG. 2A and FIG. 2B to provide a common point of reference.

Focusing on FIG. 2A, the first conductor 108, the second conductor 110, and the insulator structure 112 have squares-shaped top geometries. In alternative embodiments, the first conductor 108, the second conductor 110, and the insulator structure 112 have circular top geometries, triangular top geometries, or some other suitable top geometries. The second conductor 110 is smaller (e.g., in terms of length and width) than the insulator structure 112, which is smaller (e.g., in terms of length and width) than the first conductor 108.

Focusing on FIG. 2B, the gate electrode 118 and the gate dielectric layer 120 extend continuously in individual closed paths around the semiconductor channel 114, and the gate dielectric layer 120 separates the gate electrode 118 from the semiconductor channel 114. In other words, the gate electrode is "all" around the semiconductor channel 114. In alternative embodiments, the gate electrode 108 has one, two, or more breaks around the semiconductor channel 114. Further, the semiconductor channel 114 has a square-shaped top geometry. In alternative embodiments, the semiconductor channel 114 has a circular top geometry, a triangular top geometry, or some other suitable top geometry.

Figure 3:
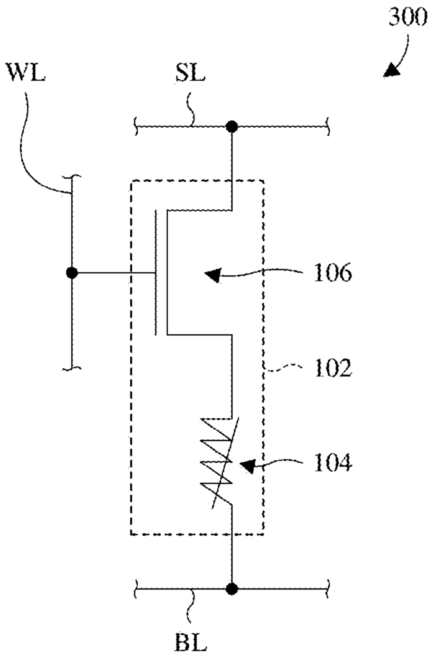
FIG. 3 illustrates a circuit diagram of some embodiments of the vertical GAA memory cell of FIG. 1.

With reference to FIG. 3, a circuit diagram 300 of some embodiments of the vertical GAA memory cell 102 of FIG. 1 is provided. The resistor 104 and the GAA transistor 106 are electrically coupled in series, such that a first (e.g., a lower) source/drain of the GAA transistor 106 is electrically coupled to a first (e.g., an upper) terminal of the resistor 104. In some embodiments, a second (e.g., a lower) terminal of the resistor 104 is electrically coupled to a bit line BL. Further, in some embodiments, a second (e.g., an upper) source/drain of the GAA transistor 106 is electrically coupled to a source line SL, and the gate electrode of the GAA transistor 106 is electrically coupled to a word line WL.

Figure 4:
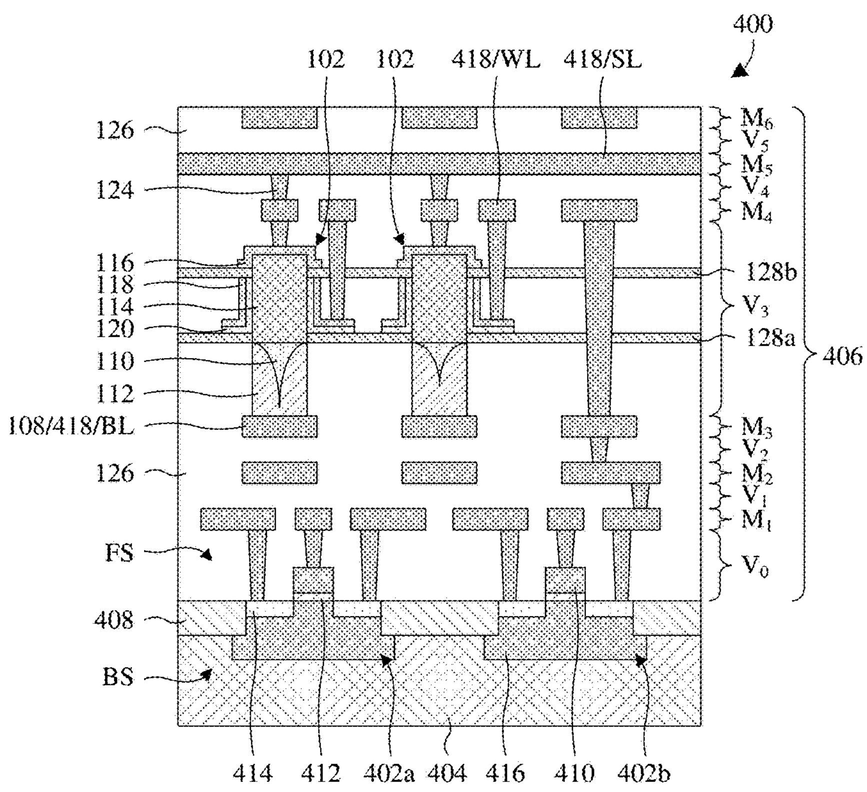
FIG. 4 illustrates a cross-sectional view of some embodiments of an integrated chip in which the vertical GAA memory cell of FIG. 1 is on a frontside of a logic device.

With reference to FIG. 4, a cross-sectional view 400 of some embodiments of an integrated chip is provided in which a pair of vertical GAA memory cells 102 are on a frontside FS of a first logic device 402*a*. Each of the vertical GAA memory cells 102 is as in FIG. 1. Further, each of the vertical GAA memory cells 102 may, for example, additionally or alternatively be as in any of FIGS. 2A, 2B, and 3 or as in any of the subsequent figures.

The first logic device 402*a* overlies a semiconductor substrate 404 and neighbors a second logic device 402*b*. The frontside FS of the first logic device 402*a* corresponds to an upper side of the first logic device 402*a*, which faces an interconnect structure 406. The frontside FS is opposite a backside BS of the first logic device 402*a*. The backside BS of the first logic device 402*a* corresponds to an underside of the first logic device 402*a*. In some embodiments, the semiconductor substrate 404 is or comprises silicon, germanium, gallium, zinc, indium, oxygen, some other suitable materials, or any combination of the foregoing.

The first and second logic devices 402*a*, 402*b* are separated from each other by an isolation structure 408. The isolation structure 408 may, for example, be or comprise a shallow trench isolation (STI) structure, a deep trench isolation (DTI) structure, a local oxidation of silicon (LOCOS) isolation structure, some other suitable isolation structure, or any combination of the foregoing. Further, the first and second logic devices 402*a*, 402*b* may, for example, be planar field-effect transistors (planar FETs), fin field-effect transistors (FinFETs), gate-all-around (GAA) field-effect transistors (GAA FETs), some other suitable type of logic device and/or transistor, or any combination of the foregoing.

The first and second logic devices 402*a*, 402*b* comprise individual gate electrodes 410, individual gate dielectric layers 412, and individual pairs of source/drain regions 414. The pairs of source/drain regions 414 are inset into a top of the semiconductor substrate 404. The gate electrodes 410 respectively overlie the gate dielectric layers 412 and are respectively between the pairs of source/drain regions 414. In some embodiments, the first and second logic devices 402*a*, 402*b* further comprise individual wells 416. The wells 416 corresponds to doped regions of the semiconductor substrate 404 and respectively underlie the pairs of source/drain regions 414 and the gate electrodes 410.

In some embodiments, the gate electrodes 410 are or comprise polysilicon, silicon, titanium, tantalum, aluminum tungsten, nitrogen, zinc, indium, gallium, germanium, carbon, some other suitable materials, or any combination of the foregoing. In some embodiments, the gate dielectric layers 412 are or comprise silicon oxide (e.g., $SiO_2$), hafnium oxide (e.g., HfO), lanthanum, silicon oxynitride (e.g., SiON), silicon carbon oxynitride (e.g., SiCON), zinc, zirconium, some other suitable material, or any combination of the foregoing. In some embodiments, the pairs of source/drain regions 414 are or comprise silicon, germanium, carbon, phosphorus, boron, some other suitable material, or any combination of the foregoing.

The interconnect structure 406 overlies and is electrically coupled to the first and second logic devices 402*a*, 402*b* on the frontside FS of the first logic device 402*a*. The interconnect structure 406 comprises a plurality of wires 418 and a plurality of vias 124. The plurality of wires 418 are grouped into a plurality of wire levels, and the plurality of vias 124 are grouped into a plurality of via levels alternatingly stacked with the plurality of wire levels. The wire levels are labeled $M_1$, $M_2$, and so on to $M_6$ from a bottom of the interconnect structure 406 to a top of the interconnect structure 406. The via levels are labeled $V_0$, $V_1$, and so on to $V_5$ from the bottom of the interconnect structure 406 to the top of the interconnect structure 406.

A dielectric structure surrounds the interconnect structure 406 and comprises a plurality of interconnect dielectric layers 126, a first etch stop layer 128*a*, and a second etch stop layer 128*b*. The plurality of interconnect dielectric layers 126 are alternatingly and vertically stacked with the first and second etch stop layers 128*a*, 128*b*. In some embodiments, the first and second etch stop layers 128*a*, 128*b* are or comprise silicon nitride, silicon carbide, some other suitable dielectric, or any combination of the foregoing. In some embodiments, the plurality of interconnect dielectric layers 126 are or comprise undoped silicate glass (USG), borosilicate glass (BSG), silicon oxide, some other suitable dielectric, or any combination of the foregoing.

The pair of vertical GAA memory cells 102 are in the interconnect structure 406, vertically between wire level $M_3$ and wire level $M_4$. In alternative embodiments, the pair of vertical GAA memory cells 102 are between different wire levels. Further, in alternative embodiments, the interconnect structure 406 comprises more or less wire levels and/or more of less via levels. Hence, the pair of vertical GAA memory cells 102 may more generally be said to be vertically between wire level $M_x$ and wire level $M_{x+1}$, where x is an integer representing a wire-level number, such as 3 or some other suitable number.

As noted above, each of the vertical GAA memory cells 102 is as in FIG. 1 and may, for example, additionally or alternatively be as in any of FIGS. 2A, 2B, and 3 or as in any of the subsequent figures. Hence, the vertical GAA memory cells 102 comprise, among other things, individual first conductors 108, individual second conductors 110, individual third conductors 116, individual semiconductor channels 114, individual gate electrodes 118, and individual gate dielectric layers 120.

The first conductors 108 are shared with the interconnect structure 406 and correspond to wires at wire level $M_3$. In some embodiments, the first conductors 108 are electrically coupled to or otherwise correspond to a common bit line BL, which extends continuously between the vertical GAA memory cells 102 outside the cross-sectional view 400 of FIG. 4. In other embodiments, the first conductors 108 are electrically coupled to or correspond to individual bit lines BL.

The second conductors 110 respectively overlie the first conductors 108 and have individual pointed tips extending respectively towards the first conductors 108. Further, the pointed tips are separated from the first conductors 108 by different distances due to randomness that intrinsically results from manufacturing variation. As such, the vertical GAA memory cells 102 have different resistances as described above. In some embodiments, the second conductors 110 have individual heights and/or cross-sectional areas that are different due to the randomness that intrinsically results from manufacturing variation.

The third conductors 116 respectively overlie the semiconductor channels 114, and the gate electrodes 118 respectively and laterally surround the semiconductor channels 114. Further, vias at via level $V_3$ extend respectively from the third conductors 116 and the gate electrodes 118 respectively to wires at wire level $M_4$. In some embodiments, wires at wire level $M_4$, and to which the gate electrodes 118 are electrically coupled, correspond to word lines WL. Further, in some embodiments, the third conductors 116 are electrically coupled to a common wire at wire level $M_5$ and this common wire corresponds to a source line SL.

Figure 5:
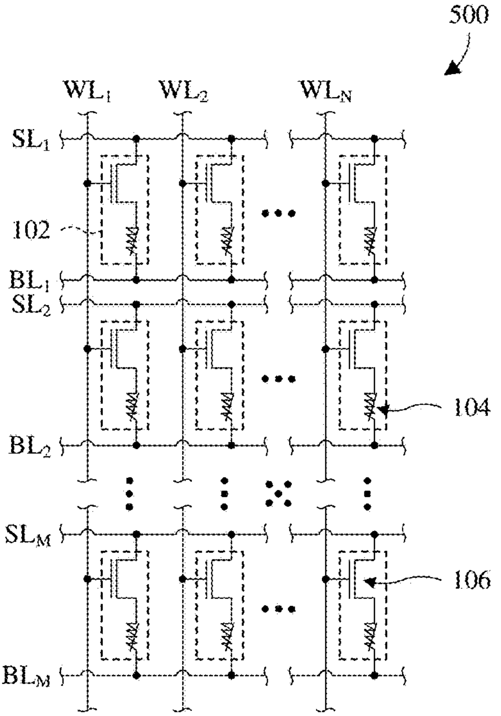
FIG. 5 illustrates a circuit diagram of some embodiments of a memory array comprising a plurality of vertical GAA memory cells as in FIG. 4.

With reference to FIG. 5, a circuit diagram 500 of some embodiments of a memory array comprising a plurality of vertical GAA memory cells 102 as in FIG. 4 is provided. More particularly, the plurality of vertical GAA memory cells 102 are grouped into non-overlapping pairs along the rows, and each pair of vertical GAA memory cells is as in FIG. 4. Further, each of the plurality of vertical GAA memory cells 102 may additionally or alternatively be as in any of FIGS. 1, 2A, 2B, and 3 or as in any of the subsequent figures.

The memory array has M rows and N columns, wherein M and N are integers. Further, the memory array has M bit lines corresponding one-to-one to the M rows, M source lines corresponding one-to-one to the M rows, and N word lines corresponding one-to-one to the N columns. Other correspondences (e.g., one to two) are, however, amenable in alternative embodiments as seen hereafter. The bit lines are labeled $BL_1$, $BL_2$, and so on to $BL_M$, where the subscript corresponds to row number. The source lines are labeled $SL_1$, $SL_2$, and so on to $SL_M$, where the subscript corresponds to row number. The word lines are labeled $WL_1$, $WL_2$, and so on to $WL_N$, where the subscript corresponds to the column number.

The source line for any given row is electrically coupled to a source/drain of each GAA transistor 106 in the given row, and the bit line for any given row is electrically coupled to a terminal of each resistor 104 in the given row. The word line for any given column is electrically coupled to the gate electrode of each GAA transistor 106 in the given column.

As noted above, a GAA transistor selectively conducts depending on how a corresponding gate electrode is biased. When a GAA transistor of a vertical GAA memory cell is in a conducting state, that vertical GAA memory cell may be regarded as selected. When a GAA transistor of a vertical GAA memory cell is in a non-conducting state, that vertical GAA memory cell may be regarded as non-selected. Therefore, because the word lines allow bias conditions at gate electrodes of the GAA transistors to be controlled, the word line for a given column allows vertical GAA memory cells in that column to be selected for read and/or write operations. In this way, the GAA transistors 106 of the vertical GAA memory cells 102 may also be referred to as select transistors, access transistors, or the like.

The vertical GAA memory cells 102 may be used as PUF devices and/or as OTP memory cells. For example, vertical GAA memory cells in a first row of the memory array may be used as PUF devices, whereas vertical GAA memory cells in remaining rows of the memory array may be used as OTP memory cells. As another example, all of the vertical GAA memory cells 102 may be used as PUF devices or as OTP memory cells. Because of the low number of functional elements (e.g., a resistor and a transistor) per memory cell and because of the vertical stacking of these functional elements, memory density may be high.

Vertical GAA memory cells used as PUF devices may have individual PUF values that are concatenated to generate a unique digital fingerprint. The PUF devices are in HRSs that have intrinsic randomness. A PUF value for a PUF device may be determined by selecting the PUF device using a corresponding word line and then applying a low voltage across a resistor of the PUF device using corresponding source and bit lines. A resulting current is then compared to a reference current to determine the PUF value. The low voltage may, for example, be low in that it does not result in dielectric breakdown of the resistor.

Vertical GAA memory cells used as OTP memory cells may have individual logic values used to store data. The OTP memory cells are in HRSs at formation and may be irreversibly changed to LRSs. An OTP memory cell may be irreversibly changed to a LRS by selecting the OTP memory cell using a corresponding word line. A high voltage is then applied across a resistor of the OTP memory cell using corresponding bit and source lines to irreversibly breakdown a dielectric of the resistor. A state of an OTP memory cell (e.g., the LRS or the HRS) may be determined by selecting the OTP memory cell using a corresponding word line and then applying a low voltage across a resistor of the OTP memory cell using corresponding source and bit lines. A resulting current is then compared to a reference current to determine whether the OTP memory cell is in the HRS or the LRS. The low voltage is low compared to the high voltage and does not result in dielectric breakdown of the resistor.

Figure 6A:
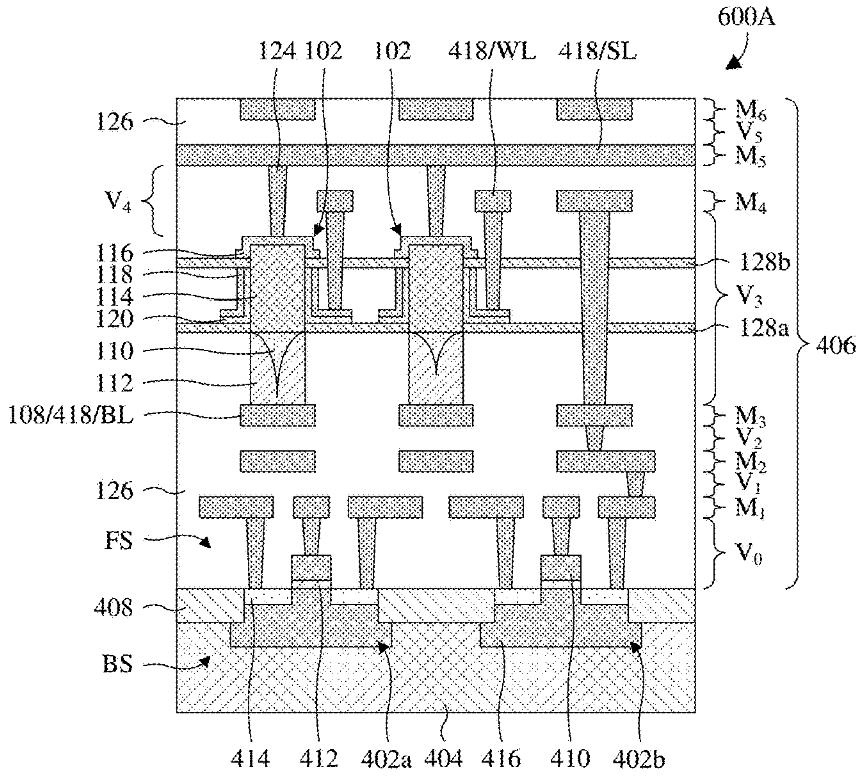
FIGS. 6A-6C illustrate cross-sectional views of some alternative embodiments of the integrated chip of FIG. 4 in which the vertical GAA memory cell and an interconnect structure are varied.
Figure 6B:
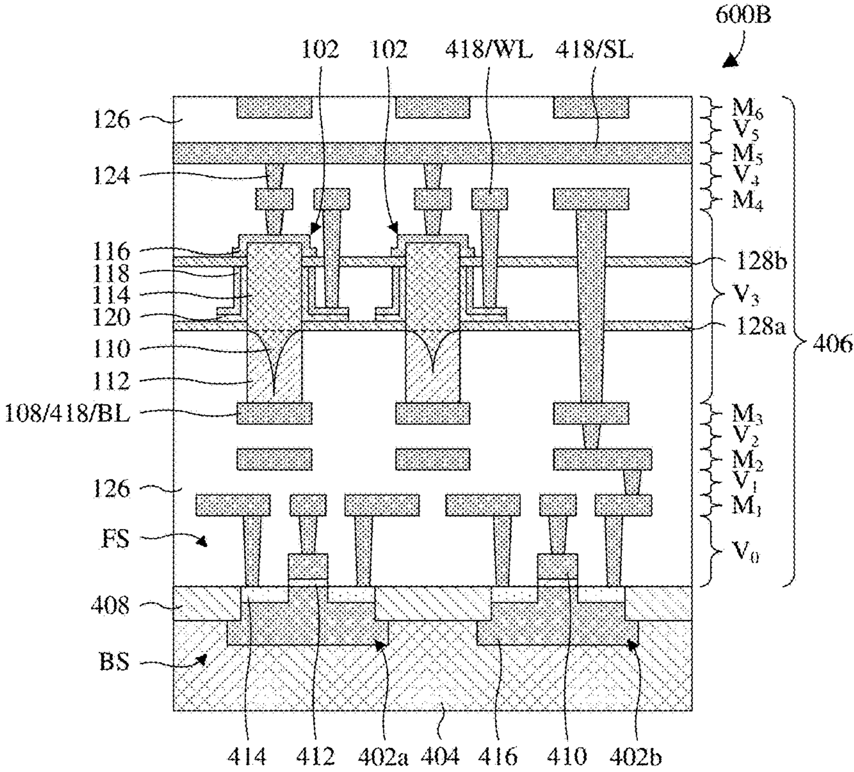
Figure 6C:
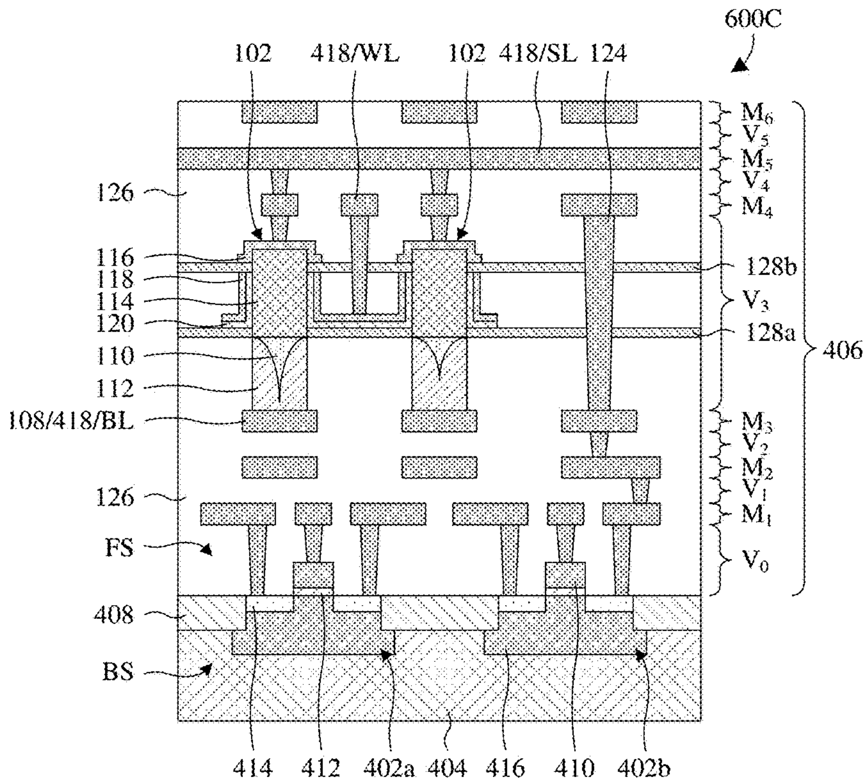

With reference to FIGS. 6A-6C, cross-sectional views 600A-600C of some alternative embodiments of the integrated chip of FIG. 4 are provided in which the pair of vertical GAA memory cells 102 and the interconnect structure 406 are varied.

In FIG. 6A, vias at via level $V_3$ extend respectively from the gate electrodes 118 respectively to wires at wire level $M_4$. Further, vias at via level $V_4$ extend respectively from the third conductors 116 respectively to wires at wire level $M_5$. Hence, vias at the gate electrodes 118 are at different via levels than vias at the third conductors 116.

In FIG. 6B, the second conductors 110 are integrated respectively with the semiconductor channels 114. In other words, each second conductor and its corresponding semiconductor channel are formed from a common semiconductor structure. In some embodiments, the second conductors 110 have an elevated doping concentration of p-type or n-type dopants relative to the semiconductor channels 114.

In FIG. 6C, the pair of vertical GAA memory cells 102 share a common word line WL, a common gate electrode 118, and a common gate dielectric layer 120.

Figure 7:
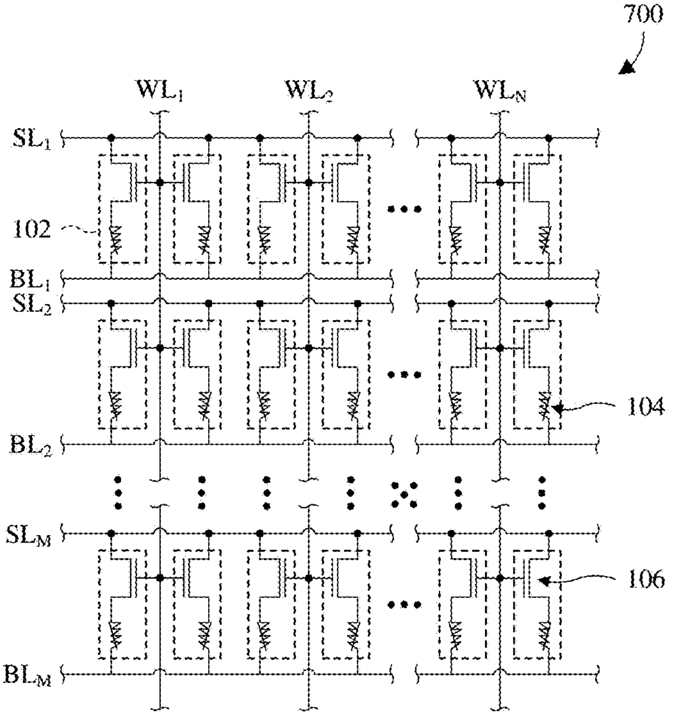
FIG. 7 illustrates a circuit diagram of some embodiments of a memory array comprising a plurality of vertical GAA memory cells as in FIG. 6C.

With reference to FIG. 7, a circuit diagram 700 of some embodiments of a memory array comprising a plurality of vertical GAA memory cells 102 as in FIG. 6C is provided. More particularly, the plurality of vertical GAA memory cells 102 are grouped into non-overlapping pairs along the rows, and each pair of vertical GAA memory cells is as in FIG. 6C.

Figure 8A:
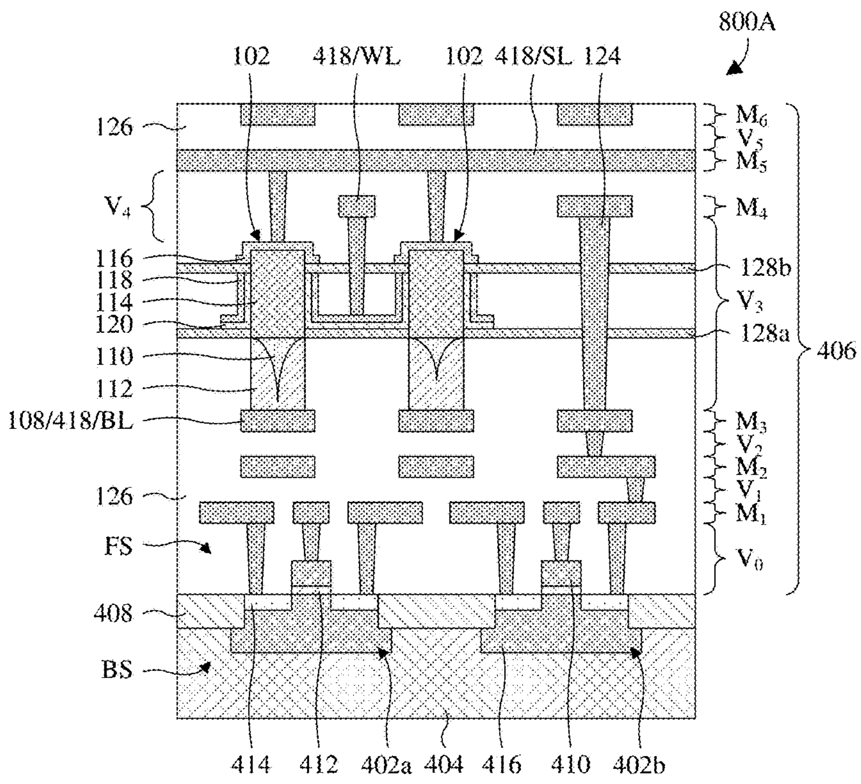
FIGS. 8A and 8B illustrate cross-sectional views of some alternative embodiments of the integrated chip of FIG. 6C in which the vertical GAA memory cell and an interconnect structure are varied.
Figure 8B:
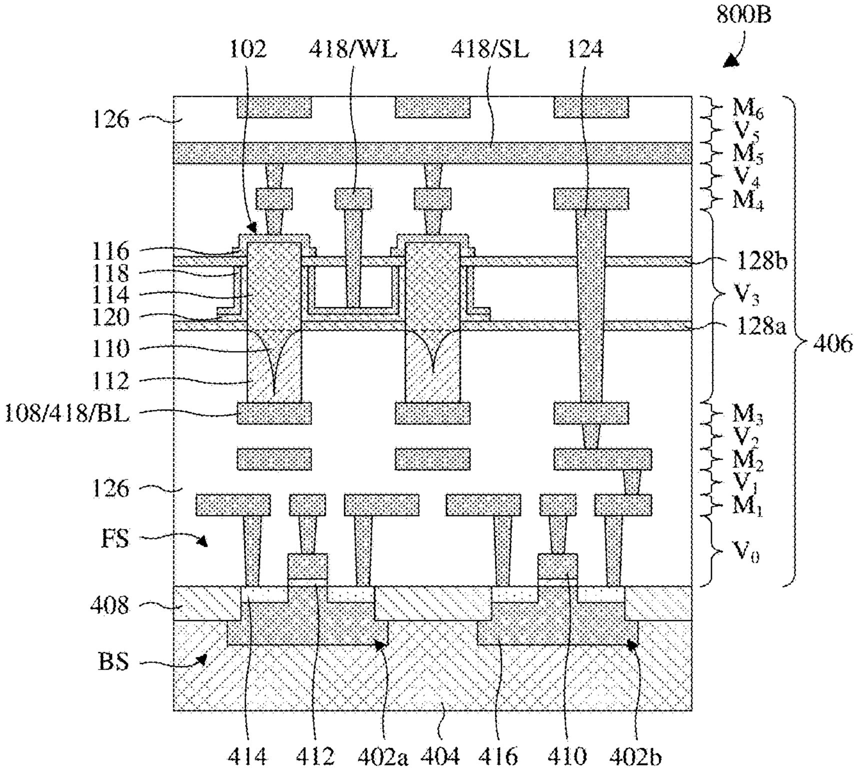

With reference to FIGS. 8A and 8B, cross-sectional views 800A, 800B of some alternative embodiments of the integrated chip of FIG. 6C are provided in which the pair of vertical GAA memory cells 102 and the interconnect structure 406 are varied.

In FIG. 8A, vias at via level $V_3$ extend respectively from the gate electrodes 118 respectively to wires at wire level $M_4$. Further, vias at via level $V_4$ extend respectively from the third conductors 116 respectively to wires at wire level $M_5$. Hence, vias at the gate electrodes 118 are at different via levels than vias at the third conductors 116.

In FIG. 8B, the second conductors 110 are integrated respectively with the semiconductor channels 114. In other words, each second conductor and its corresponding semiconductor channel are formed from a common semiconductor structure. In some embodiments, the second conductors 110 have an elevated doping concentration of p-type or n-type dopants relative to the semiconductor channels 114.

Figure 9:
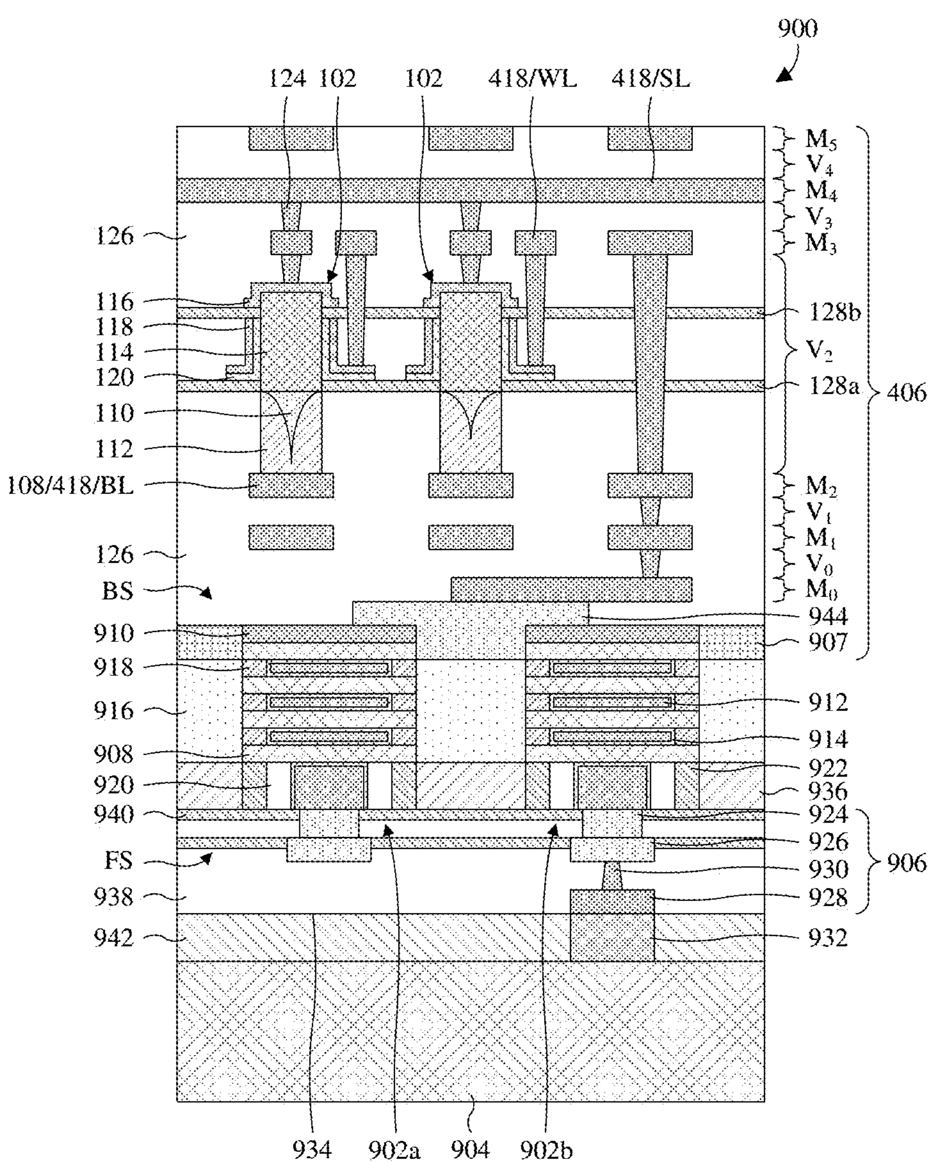
FIG. 9 illustrates a cross-sectional view of some embodiments of an integrated chip in which the vertical GAA memory cell of FIG. 1 is on a backside of a logic device.

With reference to FIG. 9, a cross-sectional view 900 of some embodiments of an integrated chip is provided in which a pair of vertical GAA memory cells 102 are on a backside BS of a first logic device 902*a*. Each of the vertical GAA memory cells 102 is as in FIG. 1. Further, each of the vertical GAA memory cells 102 may, for example, additionally or alternatively be as in any of FIGS. 2A, 2B, and 3 or as in any of the subsequent figures.

The first logic device 902*a* overlies a carrier substrate 904 and neighbors a second logic device 902*b*. A frontside FS of the first logic device 902*a* corresponds to a lower side of the first logic device 902*a* and faces a first interconnect structure 906. Further, the frontside FS is opposite the backside BS of the first logic device 902*a*. The backside BS corresponds to an upper side of the first logic device 902*a* and faces a second interconnect structure 406. Further, the backside BS is surrounded by an isolation structure 907.

In some embodiments, the carrier substrate 904 is a semiconductor substrate and/or some other suitable type of carrier substrate. Further, in some embodiments, the carrier substrate 904 is or comprises silicon, germanium, gallium, zinc, indium, oxygen, some other suitable materials, or any combination of the foregoing. In some embodiment, the isolation structure 907 is or comprises an STI structure and/or some other suitable isolation structure.

The first and second logic devices 902*a*, 902*b* are GAA FETs. However, the first and second logic devices 902*a*, 902*b* may alternatively be, for example, planar FETs, FinFETs, some other suitable type of logic device and/or transistor, or any combination of the foregoing. The first and second logic devices 902*a*, 902*b* comprise individual pluralities of semiconductor channels 908, individual protection layers 910, individual gate electrodes 912, individual gate dielectric layers 914, and corresponding source/drain regions 916.

The semiconductor channels 908 for a given one of the first and second logic devices 902*a*, 902*b* are vertically stacked and are covered by a corresponding one of the protection layers 910. Further, the semiconductor channels 908 for given one of the first and second logic devices 902*a*, 902*b* are laterally sandwiched between two of the source/drain regions 916 and are vertically separated from each other by a corresponding one of the gate electrodes 912. As shown, the first and second logic devices 902*a*, 902*b* share one of the source/drain regions 916, but this may not be the case in alternative embodiments. The gate electrodes 912 are separated from the semiconductor channels 908 respectively by the gate dielectric layers 914.

In some embodiments, the first and second logic devices 902*a*, 902*b* further comprise corresponding individual first spacer structures 918, individual second spacer structures 920, and individual third spacer structures 922. The first spacer structures 918 separate corresponding ones of the semiconductor channels 908 from each other on sidewalls of the gate electrodes 912. The second and third spacer structures 920, 922 are below the semiconductor channels 908. Further, the second spacer structures 920 are on sidewalls of the gate electrodes 912, and the third spacer structures 922 are on sidewalls of the second spacer structures 920.

In some embodiments, the gate electrodes 912 are or comprise polysilicon, silicon, titanium, tantalum, aluminum tungsten, nitrogen, zinc, indium, gallium, germanium, carbon, some other suitable materials, or any combination of the foregoing. In some embodiments, the gate dielectric layers 914 are or comprise silicon oxide (e.g., $SiO_2$), hafnium oxide (e.g., HfO), lanthanum, silicon oxynitride (e.g., SiON), silicon carbon oxynitride (e.g., SiCON), zinc, zirconium, some other suitable material, or any combination of the foregoing. In some embodiments, the pairs of source/drain regions 916 are or comprise silicon, germanium, carbon, phosphorus, boron, some other suitable materials, or any combination of the foregoing.

The first interconnect structure 906 underlies and is electrically coupled to the first and second logic devices 902*a*, 902*b* on the frontside FS of the first logic device 902*a*. The first interconnect structure 906 comprises a plurality of conductive features, including a plurality of first-level contacts 924, a plurality of second-level contacts 926, a wire 928, and a via 930. The second-level contacts 926 underlie and are spaced from the gate electrodes 912, and the first-level contacts 924 extend from the second-level contacts 926 to the gate electrodes 912. The wire 928 is spaced below the second-level contacts 926, and the via 930 extends from the wire 928 to a respective one of the second-level contacts 926.

In some embodiments, the wire 928 may also be regarded as a redistribution layer (RDL). While only one wire and only one via are illustrated, more wires and/or more vias are amenable. Further, while only one via level and only one wire level are shown, more via levels and/or more wire levels are amenable. In such embodiments, the wire and via levels are alternatingly stacked away from the second-level contacts 926.

A heat-sink conductor 932 overlies the carrier substrate 904 and is bonded to the wire 928 at a bond interface 934 to facilitate heat dissipation. In alternative embodiments, the heat-sink conductor 932 is omitted. The bond interface 934 includes a conductor-to-conductor component (e.g., at the heat-sink conductor 932) and a dielectric-to-dielectric component (e.g., at dielectric layers hereafter discussed).

A dielectric structure surrounds the first interconnect structure 906, frontsides of the first and second logic devices 902*a*, 902*b*, and the heat-sink conductor 932. The dielectric structure comprises an interlayer dielectric (ILD) layer 936, a plurality of interconnect dielectric layers 938, a plurality of etch stop layers 940, and a bond dielectric layer 942 that are vertically stacked over the carrier substrate 904. In some embodiments, the etch stop layers 940 are or comprise silicon nitride, silicon carbide, some other suitable dielectric, or any combination of the foregoing. In some embodiments, the ILD layer 936, the plurality of interconnect dielectric layers 938, and the bond dielectric layer 942 each are or comprise a dielectric from a group, which consists essentially of or comprises USG, BSG, silicon oxide, some other suitable dielectric, or any combination of the foregoing.

The second interconnect structure 406 overlies and electrically couples to the first and second logic devices 902*a*, 902*b* on the backside BS of the first logic device 902*a*. In some embodiments, the second interconnect structure 406 electrically couples to the first and second logic devices 902*a*, 902*b* through one of the source/drain regions 916, which is shared by the first and second logic devices 902*a*, 902*b*. The second interconnect structure 406 is as its counterpart described with regard to FIG. 4, except as hereafter described.

The second interconnect structure 406 comprises a plurality of wires 418 and a plurality of vias 124 respectively grouped into a plurality of wire levels and plurality of via levels. The wire levels are labeled $M_0$, $M_1$, and so on to $M_5$ from a bottom of the second interconnect structure 406 to a top of the second interconnect structure 406. The via levels are labeled $V_0$, $V_1$, and so on to $V_4$ from the bottom of the second interconnect structure 406 to the top of the second interconnect structure 406. Further, the second interconnect structure 406 comprises a contact plug 944 extending from wire level $M_0$ to the first and second logic devices 902*a*, 902*b*. For example, the contact plug 944 may extend to one of the source/drain regions 916, which is shared by the first and second logic devices 902*a*, 902*b*. In some embodiments, the contact plug 944 may be regarded as a backside power rail or the like. In some embodiments, the contact plug 944 is or comprises tungsten, tungsten nitride, ruthenium, iridium, molybdenum, molybdenum nitride, copper, aluminum, silicon, or any combination of the foregoing.

A dielectric structure surrounds the second interconnect structure 406 and comprises a plurality of interconnect dielectric layers 126, a first etch stop layer 128*a*, and a second etch stop layer 128*b*. Further, the plurality of interconnect dielectric layers 126 are alternatingly and vertically stacked with the first and second etch stop layers 128*a*, 128*b*.

The pair of vertical GAA memory cells 102 are in the second interconnect structure 406, vertically between wire level $M_2$ and wire level $M_3$. In alternative embodiments, the pair of vertical GAA memory cells 102 are between different wire levels, and/or the second interconnect structure 406 comprises more or less wire levels and/or more of less via levels. As noted above, each of the vertical GAA memory cells 102 is as in FIG. 1 and may, for example, additionally or alternatively be as in any of FIGS. 2A, 2B, and 3 or as in any of the subsequent figures. Hence, the vertical GAA memory cells 102 comprise, among other things, individual first conductors 108, individual second conductors 110, individual third conductors 116, individual semiconductor channels 114, individual gate electrodes 118, and individual gate dielectric layers 120.

Figure 10A:
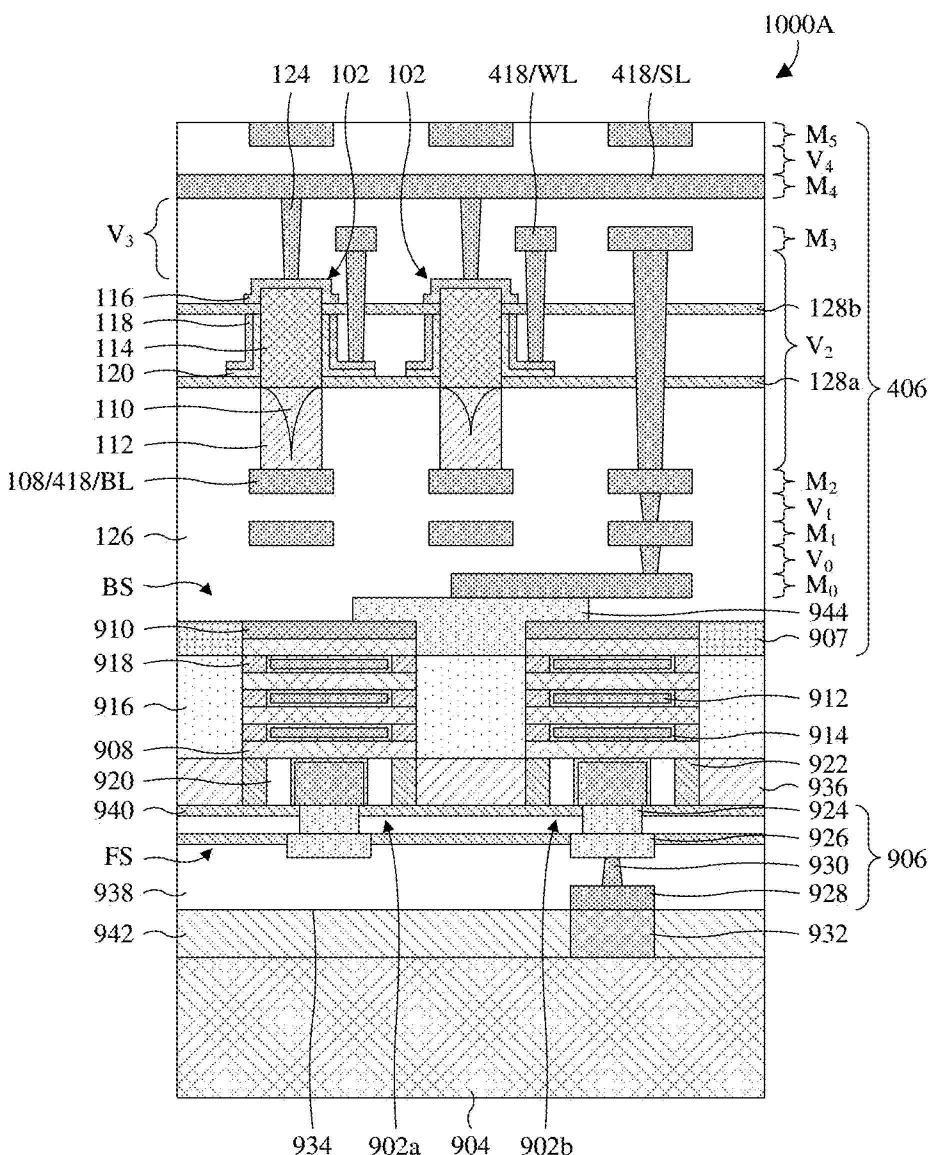
FIGS. 10A-10C illustrate cross-sectional views of some alternative embodiments of the integrated chip of FIG. 9 in which the vertical GAA memory cell and an interconnect structure are varied.
Figure 10B:
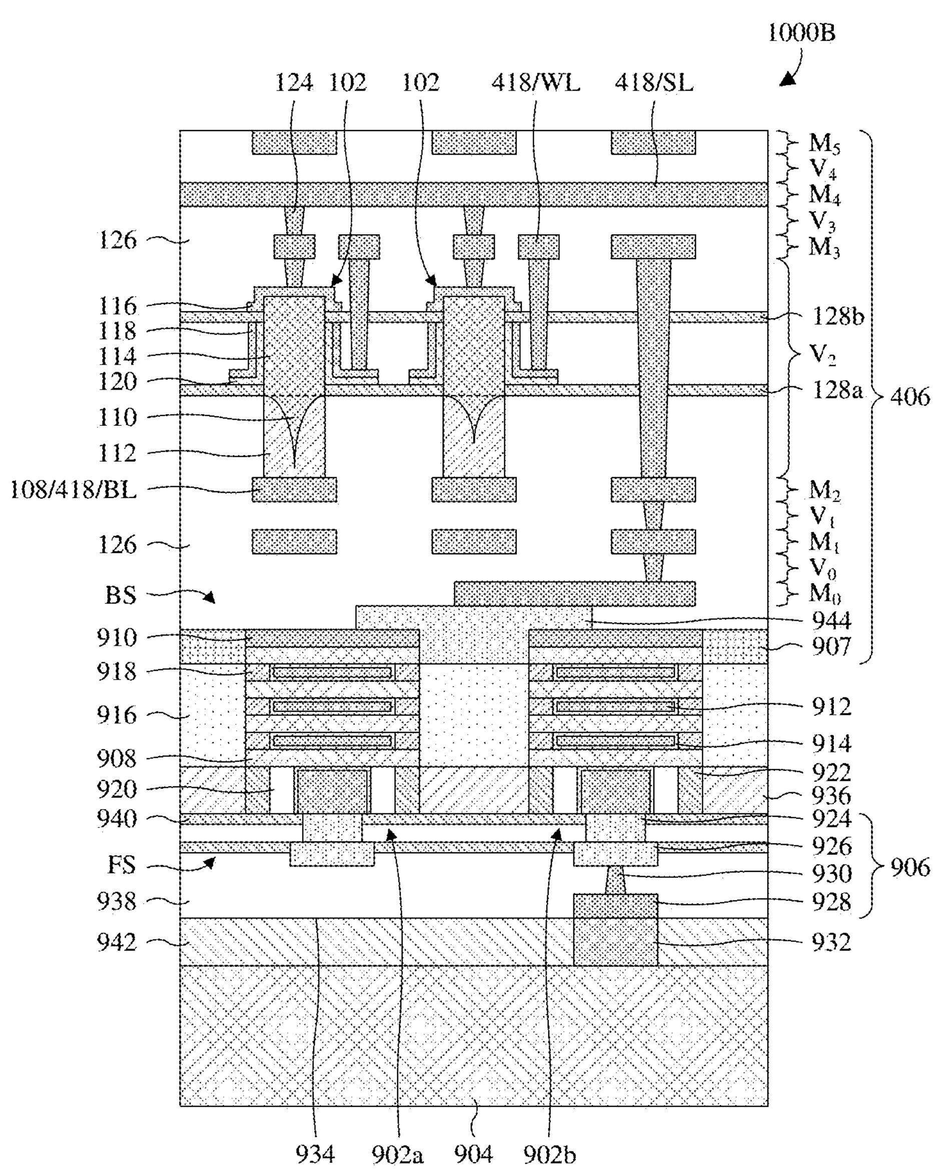
Figure 10C:
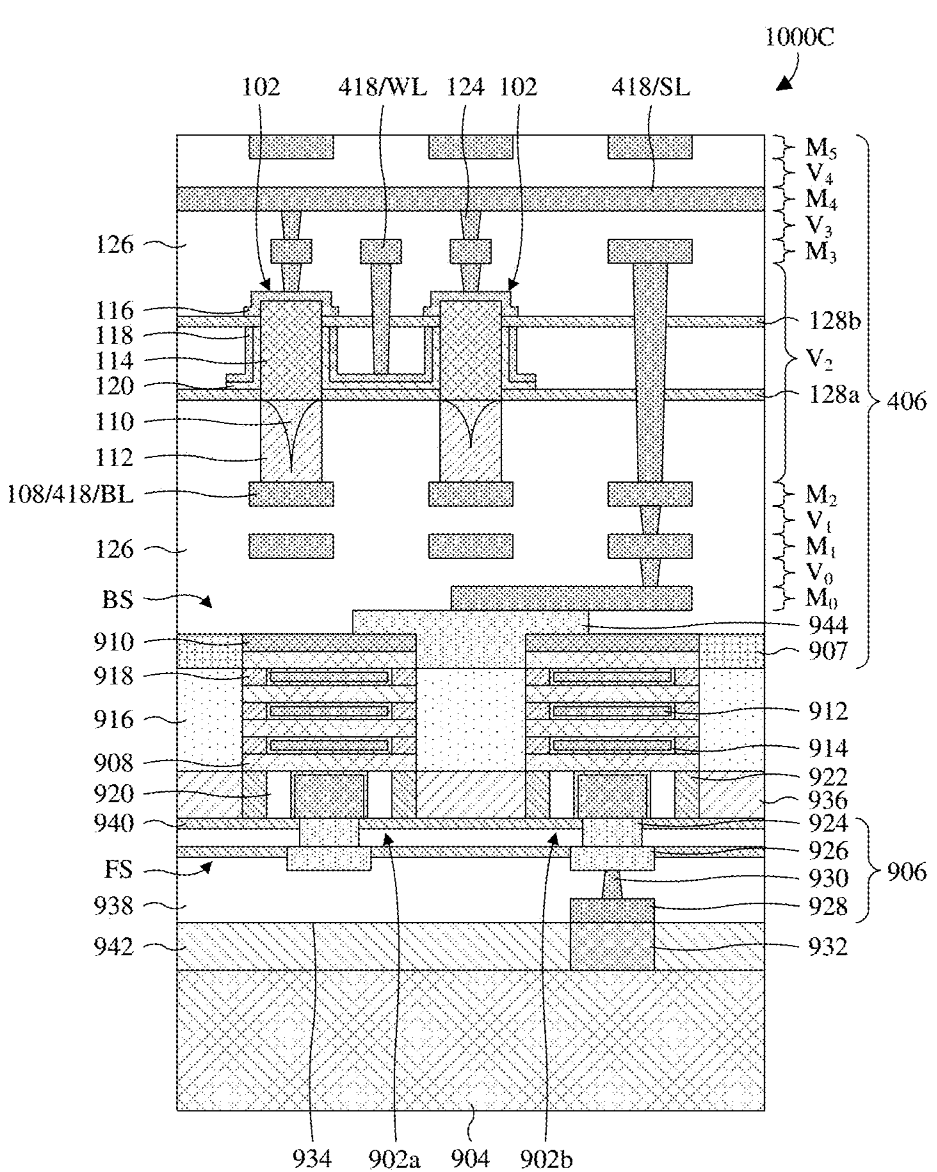

With reference to FIGS. 10A-10C, cross-sectional views 1000A-1000C of some alternative embodiments of the integrated chip of FIG. 9 are provided in which the pair of vertical GAA memory cells 102 and the interconnect structure 406 are varied.

In FIG. 10A, vias at via level $V_2$ extend respectively from the gate electrodes 118 respectively to wires at wire level $M_3$. Further, vias at via level $V_3$ extend respectively from the third conductors 116 respectively to wires at wire level $M_4$. Hence, vias at the gate electrodes 118 are at different via levels than vias at the third conductors 116.

In FIG. 10B, the second conductors 110 are integrated respectively with the semiconductor channels 114. In other words, each second conductor and its corresponding semiconductor channel are formed from a common semiconductor structure. In some embodiments, the second conductors 110 have an elevated doping concentration of p-type or n-type dopants relative to the semiconductor channels 114.

In FIG. 10C, the pair of vertical GAA memory cells 102 share a common word line WL, a common gate electrode 118, and a common gate dielectric layer 120. The vertical GAA memory cells 102 may, for example, be part of a memory array as in FIG. 7.

Figure 11A:
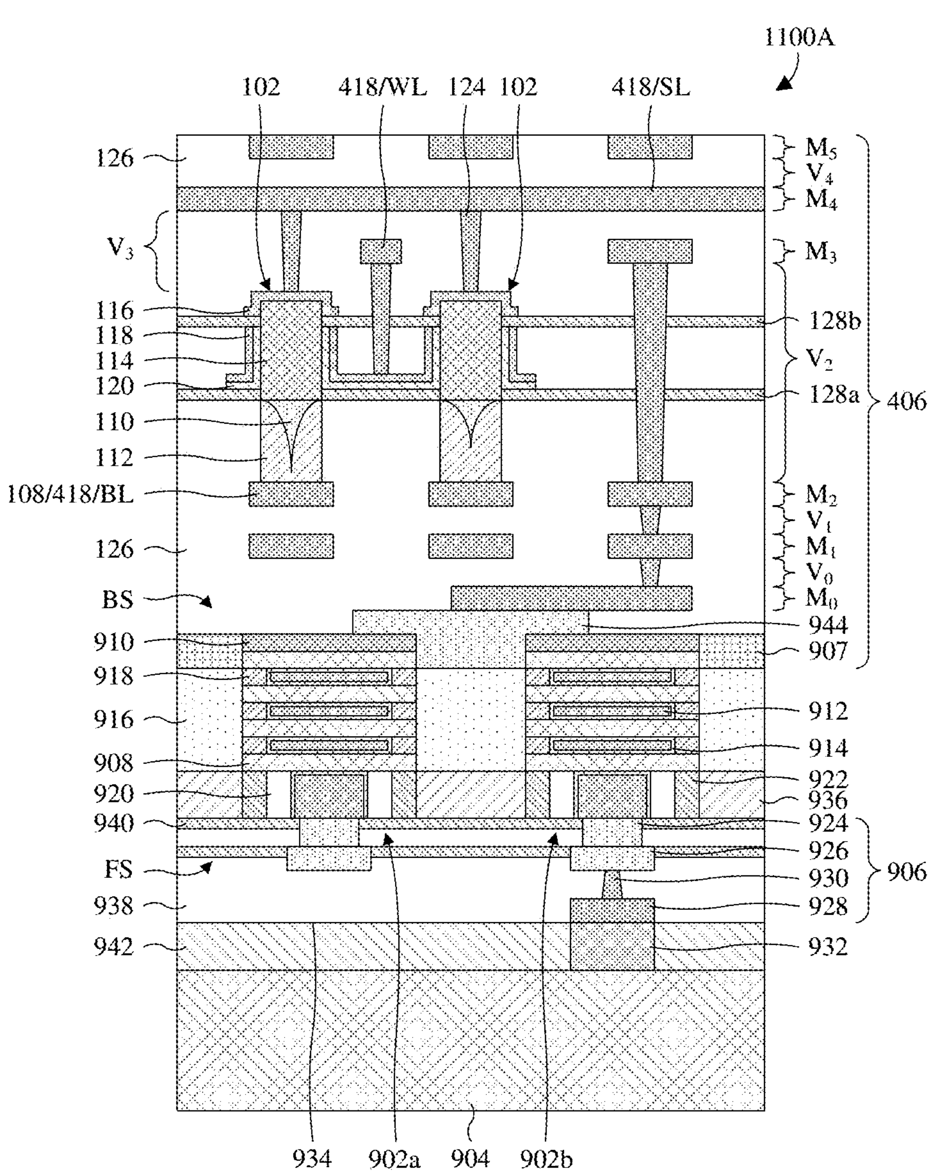
FIGS. 11A and 11B illustrate cross-sectional views of some alternative embodiments of the integrated chip of FIG. 10C in which the vertical GAA memory cell and the interconnect structure are varied.
Figure 11B:
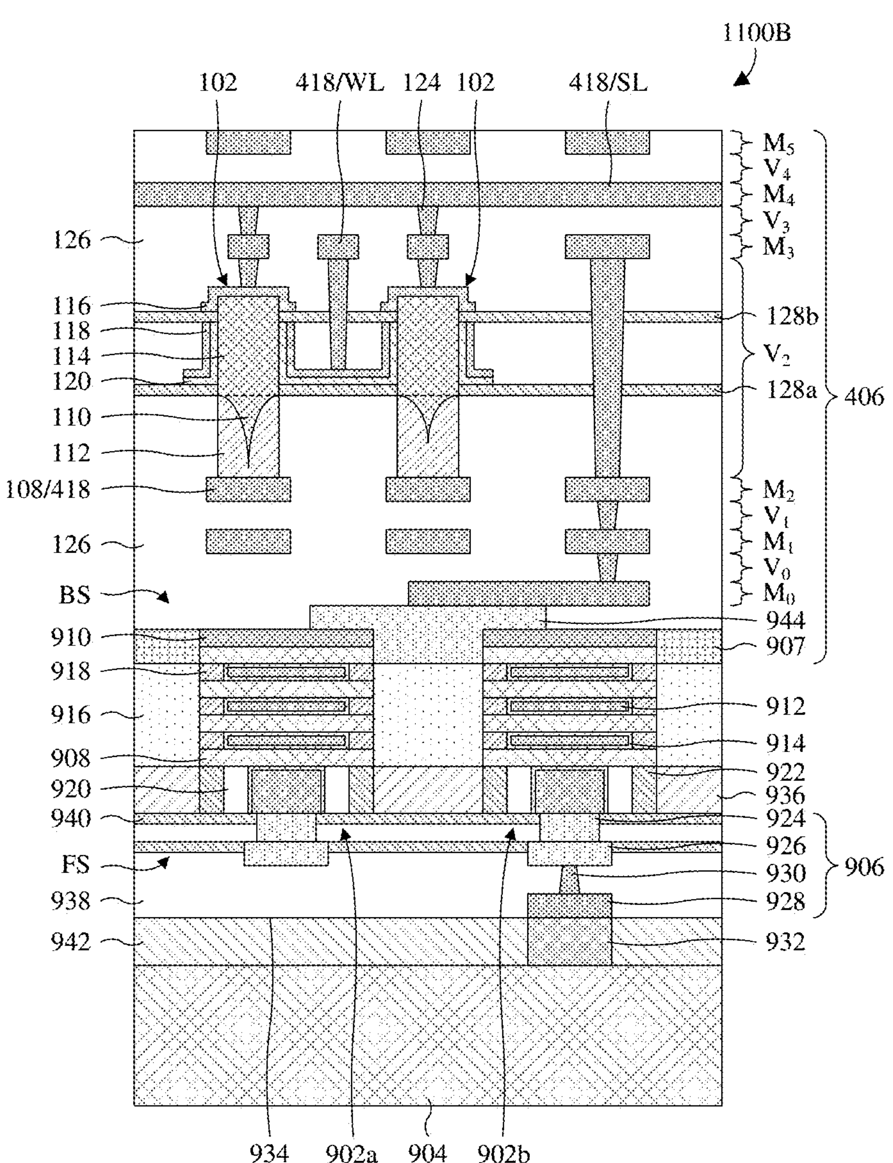

With reference to FIGS. 11A and 11B, cross-sectional views 1100A, 1100B of some alternative embodiments of the integrated chip of FIG. 10C are provided in which the pair of vertical GAA memory cells 102 and the interconnect structure 406 are varied.

In FIG. 11A, vias at via level $V_2$ extend respectively from the gate electrodes 118 respectively to wires at wire level $M_3$. Further, vias at via level $V_3$ extend respectively from the third conductors 116 respectively to wires at wire level $M_4$. Hence, vias at the gate electrodes 118 are at different via levels than vias at the third conductors 116.

In FIG. 11B, the second conductors 110 are integrated respectively with the semiconductor channels 114. In other words, each second conductor and its corresponding semiconductor channel are formed from a common semiconductor structure. In some embodiments, the second conductors 110 have an elevated doping concentration of p-type or n-type dopants relative to the semiconductor channels 114.

With reference to FIGS. 12-37, a series of cross-sectional views 1200-3700 of some embodiments of a method for forming a pair of vertical GAA memory cells for use as PUF devices is provided. The pair of vertical GAA memory cells may, for example, be as in any of FIG. 1, FIG. 4, and FIG. 9. Further, the pair of vertical GAA memory cells may, for example, have top layouts as in FIG. 2A and/or FIG. 2B.

Figure 12:
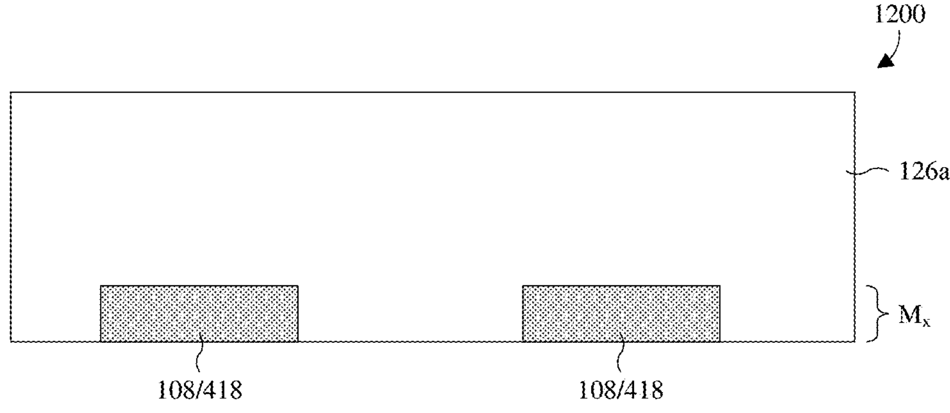
FIGS. 12-37 illustrate a series of cross-sectional views of some embodiments of a method for forming a pair of vertical GAA memory cells for use as PUF devices.

As illustrated by the cross-sectional view 1200 of FIG. 12, a pair of first conductors 108 covered by a first interconnect dielectric layer 126*a* are provided or otherwise formed. The pair of first conductors 108 correspond to wires 418 of an interconnect structure and are in a wire level $M_x$, where x is an integer representing a wire-level number.

Figure 13:
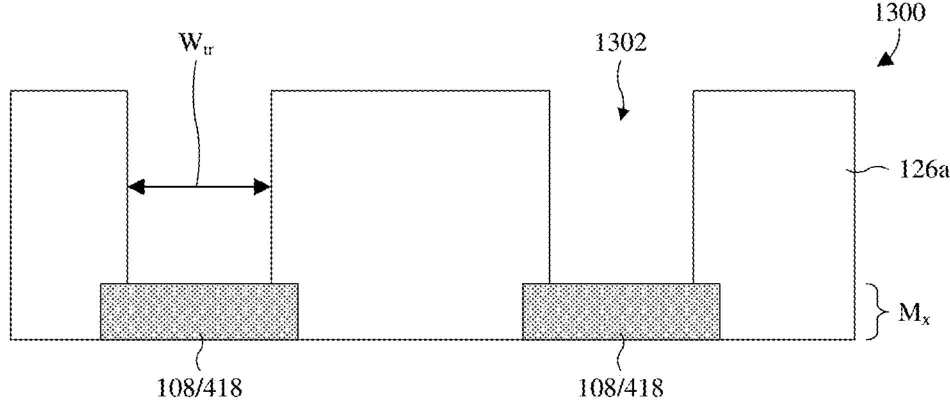

As illustrated by the cross-sectional view 1300 of FIG. 13, the first interconnect dielectric layer 126*a* is patterned to form a pair of trenches 1302 respectively overlying and exposing the first conductors 108. In some embodiments, individual widths $W_{tr}$ of the trenches 1302 are about 130-150 nanometers or some other suitable values. The patterning may, for example, be performed by a photolithography/etching process or some other suitable process.

Figure 14:
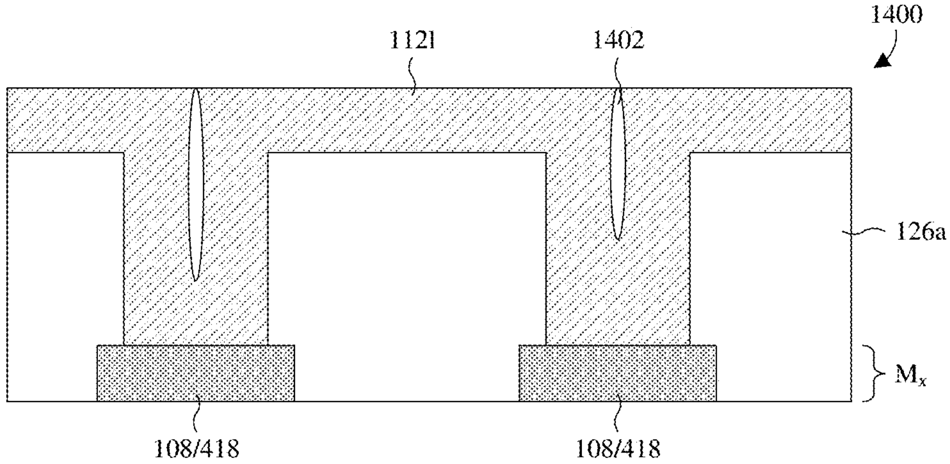

As illustrated by the cross-sectional view 1400 of FIG. 14, an insulator layer 1121 is deposited covering the first interconnect dielectric layer 126*a* and lining the trenches 1302. The deposition may, for example, be performed by physical vapor deposition (PVD), a high growth rate chemical vapor deposition (CVD), or some other suitable deposition process.

During deposition of the insulator layer 1121, material of the insulator layer 1121 deposits faster at top corners of the first interconnect dielectric layer 126*a* in the trenches 1302. As a result, the trenches 1302 are closed off before being fully formed and a pair of scams 1402 form respectively in the trenches 1302. Due to intrinsic randomness while depositing the insulator layer 1121, the seams 1402 may have different depths, cross-sectional areas, heights, etc. As seen hereafter, this randomness allows generation of PUF values.

In some embodiments, the insulator layer 1121 is a high k dielectric material and/or is or comprises hafnium oxide, tantalum oxide, titanium oxide, zirconium oxide, aluminum oxide, or any combination of the foregoing. In some embodiments, the insulator layer 1121 is or comprises silicon oxide, silicon nitride, silicon oxynitride, silicon carbon nitride, silicon carbon oxynitride, or any combination of the foregoing.

Figure 15:
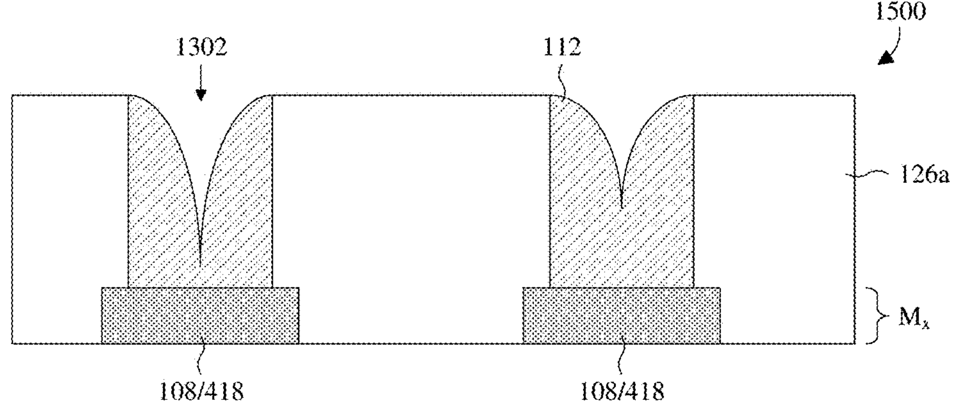

As illustrated by the cross-sectional view 1500 of FIG. 15, the insulator layer 1121 is etched back. This clears the insulator layer 1121 from atop the first interconnect dielectric layer 126*a* and forms a pair of insulator structures 112 respectively in the trenches 1302. The insulator structures 112 only partially fill the trenches 1302 because of the seams 1402. Further, unfilled portions of the trenches 1302 have individual profiles that decrease in width towards the first conductors 108 and culminate in points pointed towards the first conductors 108.

Figure 16:
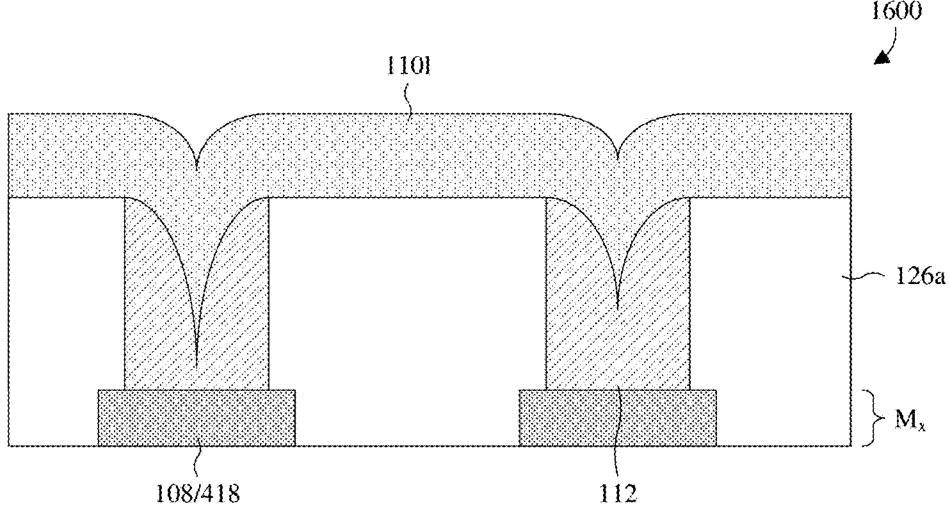

As illustrated by the cross-sectional view 1600 of FIG. 16, a conductive layer 1101 is deposited covering the first interconnect dielectric layer 126*a* and filling a remainder of the trenches 1302 over the insulator structures 112. The conductive layer 1101 may, for example, be deposited by atomic layer deposition (ALD) or some other suitable deposition process. In some embodiments, the conductive layer 1101 is or comprises titanium nitride, tantalum nitride, molybdenum nitride, tungsten nitride, aluminum, tungsten, copper, molybdenum, some other suitable metal or metal nitride, or any combination of the foregoing.

Figure 17:
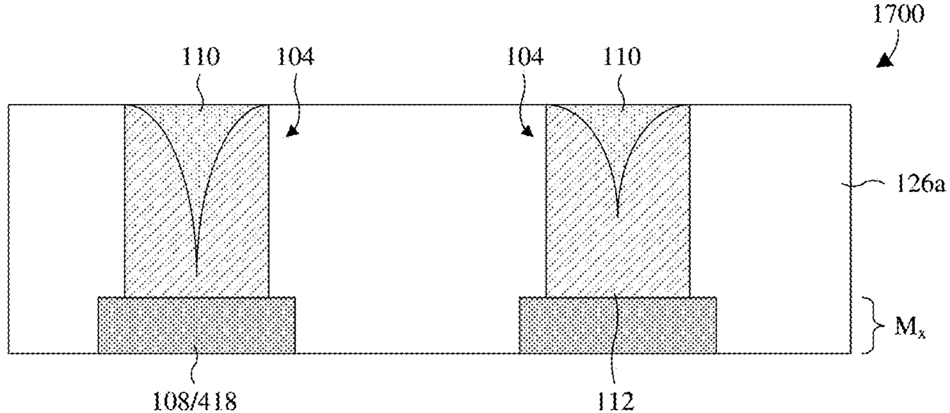

As illustrated by the cross-sectional view 1700 of FIG. 17, a planarization is performed into the conductive layer 1101. The planarization may, for example, be performed by a chemical mechanical polish (CMP) or some other suitable planarization process.

The planarization clears the conductive layer 1101 from atop the first interconnect dielectric layer 126*a* and forms a pair of second conductors 110. The second conductors 110 respectively overlie the first conductors 108 and are spaced from the first conductors 108 by the insulator structures 112. Further, the second conductors 110 decrease in width from a top of the first interconnect dielectric layer 126*a* towards the first conductors 108 to culminate in points.

Collectively, the first conductors 108, the insulator structures 112, and the second conductors 110 form a pair of resistors 104. Because of the intrinsic randomness in sizes of the seams 1402 (see FIG. 14), the second conductors 110 have intrinsic randomness in terms of height, cross-sectional area, separation from the first conductors 108, and so on. This intrinsic randomness results in intrinsic randomness in resistances of the resistors 104, which can be used to generate PUF values and hence a unique digital fingerprint.

Figure 18:
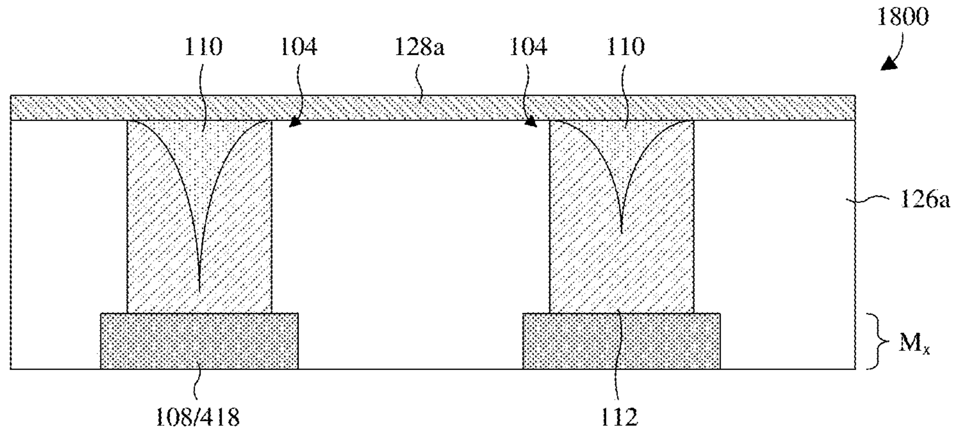

As illustrated by the cross-sectional view 1800 of FIG. 18, a first etch stop layer 128*a* is deposited atop the first interconnect dielectric layer 126*a* and the resistors 104. The first etch stop layer 128*a* is a dielectric material different than the first interconnect dielectric layer 126*a*. In some embodiments, the first etch stop layer 128*a* is or comprise silicon nitride, silicon carbide, silicon oxynitride, some other suitable material, or any combination of the foregoing.

Figure 19:
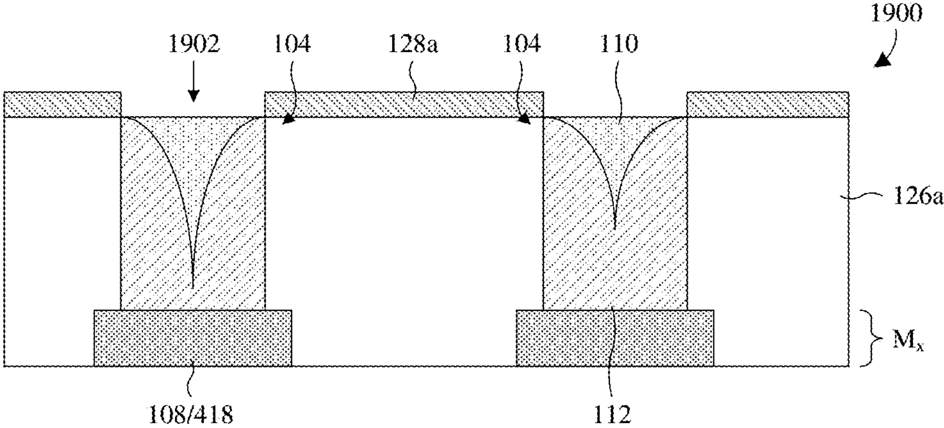

As illustrated by the cross-sectional view 1900 of FIG. 19, the first etch stop layer 128*a* is patterned to form a pair of openings 1902 overlying and respectively exposing the second conductors 110. The patterning may, for example, be performed by a photolithography/etching process or some other suitable patterning processes.

Figure 20:
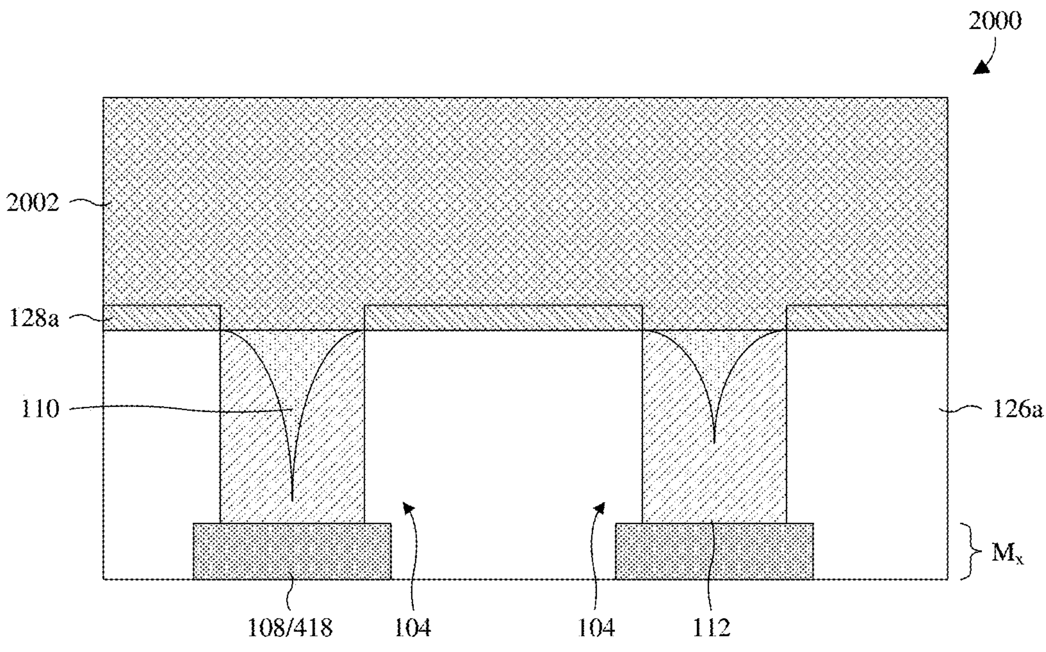

As illustrated by the cross-sectional view 2000 of FIG. 20, a semiconductor layer 2002 is deposited atop the first etch stop layer 128*a* and filling the openings 1902 atop the resistors 104. In some embodiments, a top surface of the semiconductor layer 2002 is further flattened by a planarization or the like. The planarization may, for example, be performed by a CMP and/or some other suitable planarization process.

In some embodiments, the semiconductor layer 2002 is or comprises amorphous silicon, indium gallium zinc oxide, copper oxide, nickel oxide, tin oxide, some other suitable semiconductor material, or any combination of the foregoing. Further, in some embodiments, the semiconductor layer 2002 is doped with an n-type doping or an p-type doping. For example, the semiconductor layer 2002 may be or comprise n-type amorphous silicon, p-type amorphous silicon, n-type indium gallium zinc oxide, p-type copper oxide, p-type nickel oxide, or p-type tin oxide. Other suitable materials are, however, amenable.

Figure 21:
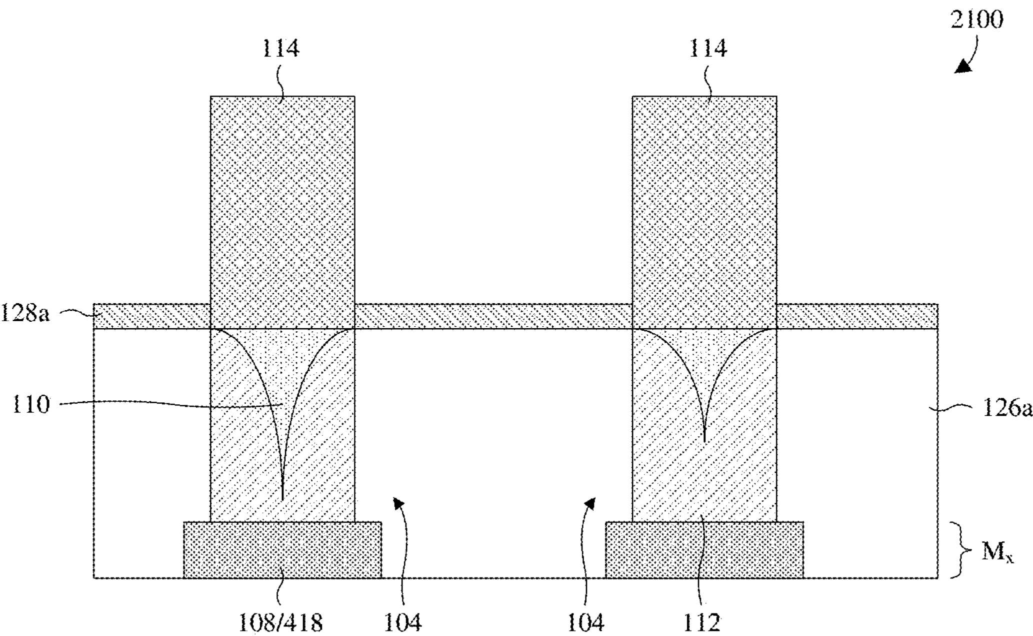

As illustrated by the cross-sectional view 2100 of FIG. 21, the semiconductor layer 2002 is patterned to form a pair of semiconductor channels 114 respectively on the resistors 104. In some embodiments, the patterning is such that the semiconductor channels 114 have individual widths that are the same as or similar to individual widths of the openings 1902 (see FIG. 19). The patterning may, for example, be performed by a photolithography/etching process or some other suitable patterning processes. To the extent that the patterning is performed by the photolithography/etching process, the first etch stop layer 128*a* may, for example, serve as an etch stop during the etching of the semiconductor layer 2002.

Figure 22:
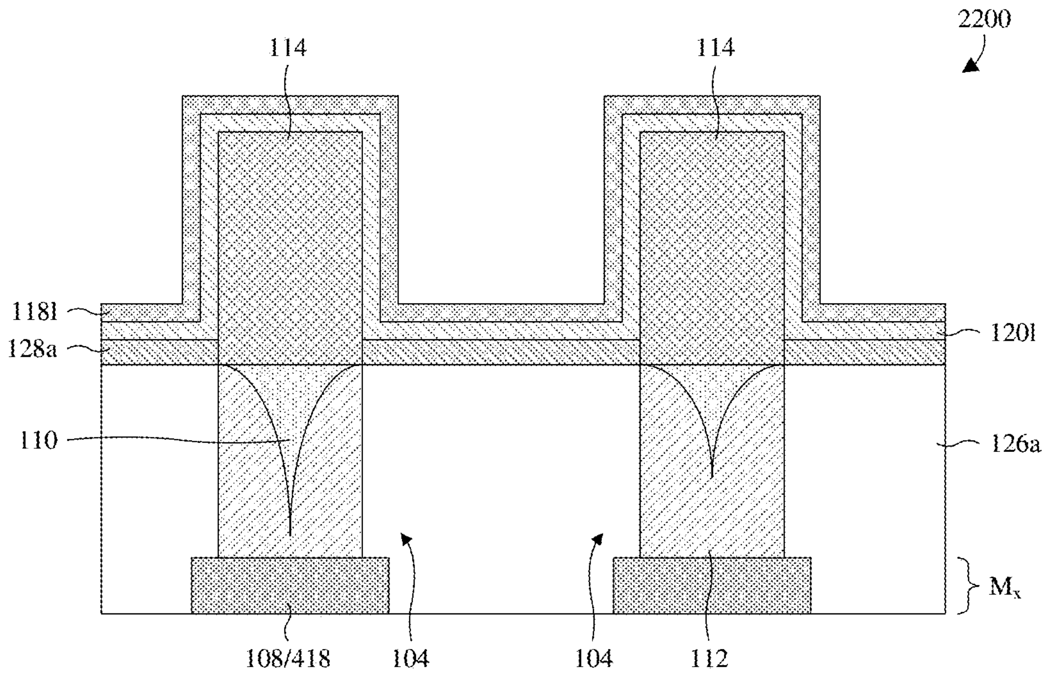

As illustrated by the cross-sectional view 2200 of FIG. 22, a dielectric layer 1201 and a conductive layer 1181 are deposited overlying the first etch stop layer 128*a* and the semiconductor channels 114 and further lining sidewalls of the semiconductor channels 114. The dielectric layer 1201 may, for example, be deposited by ALD and/or some other suitable deposition process. The conductive layer 1181 is deposited over the dielectric layer 1201 and may, for example, be deposited by ALD and/or some other suitable deposition process.

In some embodiments, the conductive layer 1181 is or comprises titanium nitride, tantalum nitride, molybdenum nitride, tungsten nitride, aluminum, tungsten, copper, molybdenum, some other suitable metal or metal nitride, or any combination of the foregoing. In some embodiments, the dielectric layer 1201 is or comprises silicon oxide, silicon nitride, silicon oxynitride, silicon carbon nitride, silicon carbon oxynitride, or any combination of the foregoing.

Figure 23:
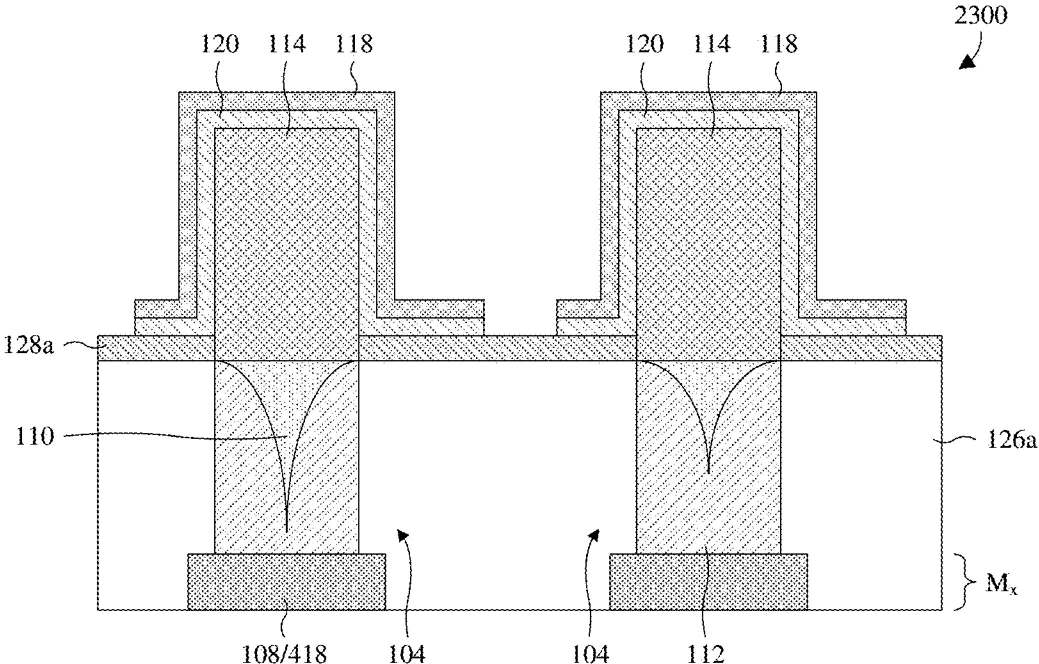

As illustrated by the cross-sectional view 2300 of FIG. 23, the conductive layer 1181 and the dielectric layer 1201 are patterned to form a pair of gate stacks individual to the semiconductor channels 114. In alternative, the patterning forms a single, continuous gate stack common to the semiconductor channels 114 as in, for example, FIG. 6C, 8A, 8B, 10C, 11A, or 11B. Each of the gate stacks comprises a gate electrode 118 formed from the conductive layer 1181, and each of the gate stacks further comprises a gate dielectric layer 120 formed from the dielectric layer 1201. The gate stacks are on sidewalls of the semiconductor channels 114 and, in some embodiments, completely surround corresponding semiconductor channels when viewed top down. Sec, for example, FIG. 2B. The patterning may, for example, be performed by a photolithography/etching process or some other suitable patterning processes.

Figures 24, 25:
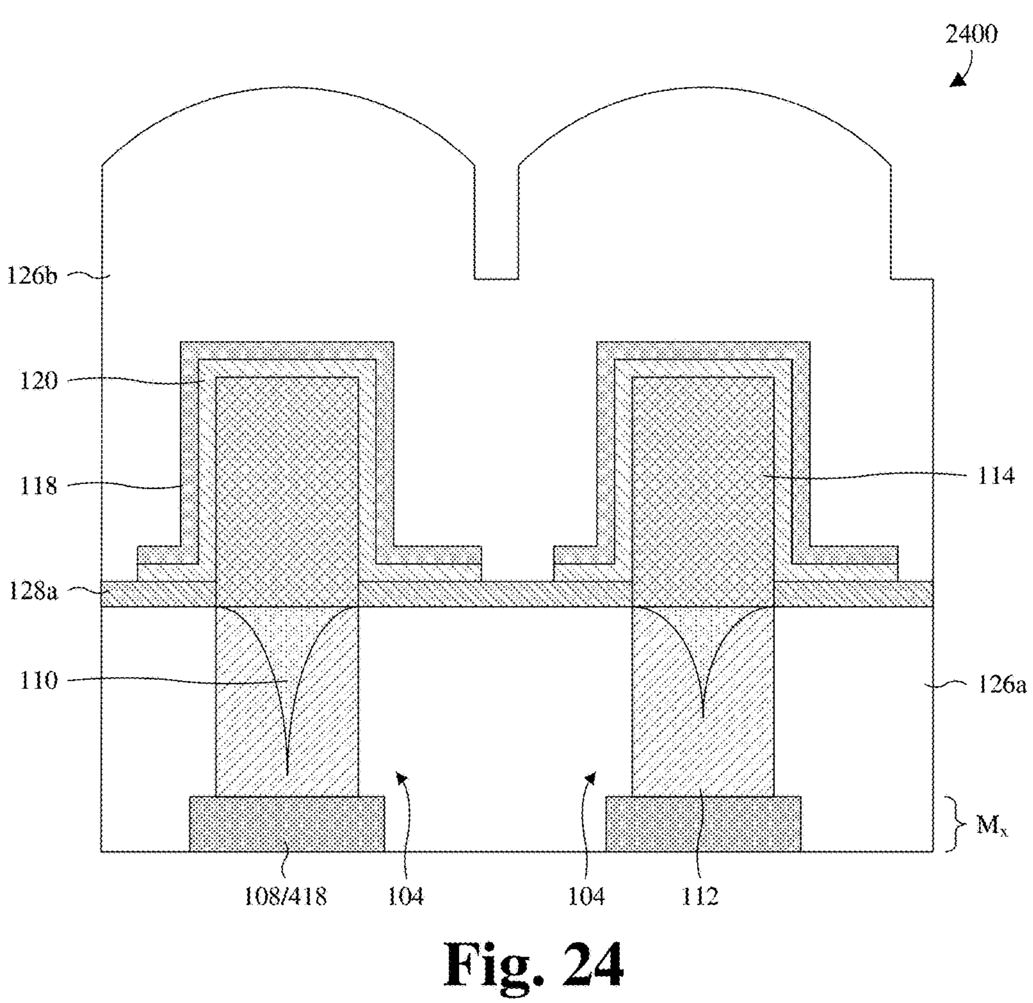

As illustrated by the cross-sectional view 2400 of FIG. 24, a second interconnect dielectric layer 126*b* is deposited covering the gate electrodes 118 and the first etch stop layer 128*b*, and further along sidewalls of the gate electrodes 118.

As illustrated by the cross-sectional view 2500 of FIG. 25, a planarization is performed into the second interconnect dielectric layer 126*b*. The planarization flattens a top surface of the second interconnect dielectric layer 126*b* and recesses the top surface until level with a top surface of the gate electrodes 118. The planarization may, for example, be performed by a CMP and/or some other suitable planarization process.

Figure 26:
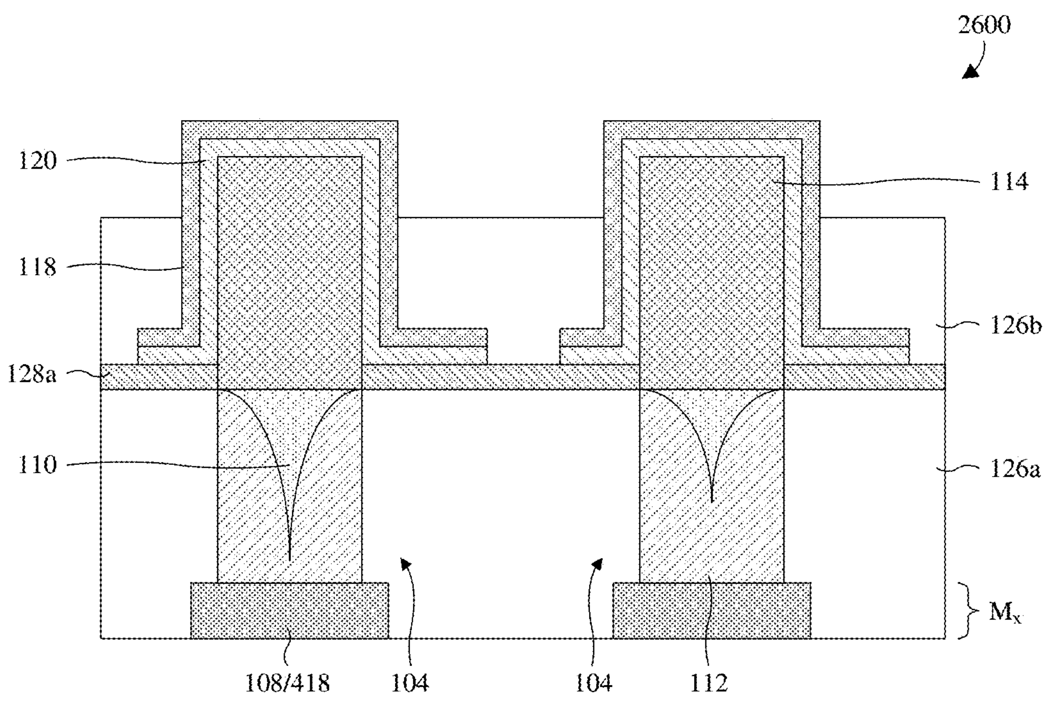

As illustrated by the cross-sectional view 2600 of FIG. 26, an etch back is performed to recess a top surface of the second interconnect dielectric layer 126*b* relative to individual top surfaces of the gate electrodes 118. The etch back exposes upper sidewall portions of the gate electrodes 118 while leaving lower sidewall portions covered by the second interconnect dielectric layer 126*b*. The etch back may, for example, be performed using an etchant having a high etch rate for the second interconnect dielectric layer 126*b* relative to the gate electrodes 118, such that the gate electrodes 118 are minimally etched.

Figure 27:
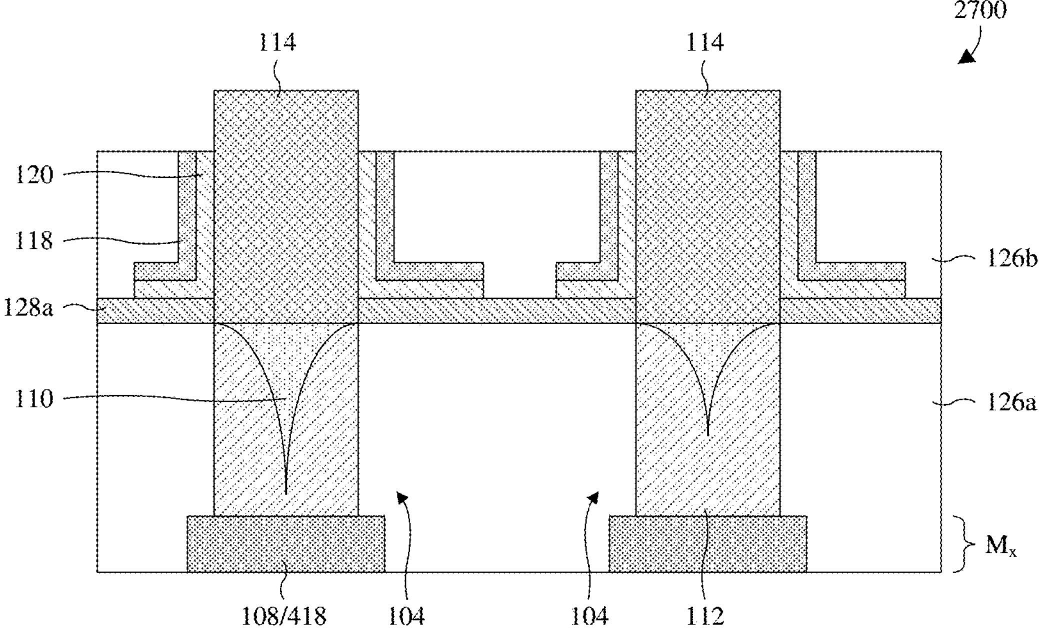

As illustrated by the cross-sectional view 2700 of FIG. 27, another etch back is performed to recess individual top surfaces of the gate electrodes 118 and individual top surfaces of the gate dielectric layers 120 relative to individual top surfaces of the semiconductor channels 114. In some embodiments, the individual top surfaces of the gate electrodes 118 and the individual top surfaces of the gate dielectric layers 120 are etched back until level with or substantially level with a top surface of the second interconnect dielectric layer 126*b*. The etch back may, for example, be performed using an etchant having a high etch rate for the gate electrodes 118 and gate dielectric layers 120 relative to the semiconductor channels 114 and the second interconnect dielectric layer 126*b*, such that the semiconductor channels 114 and the second interconnect dielectric layer 126*b* are minimally etched.

Figure 28:
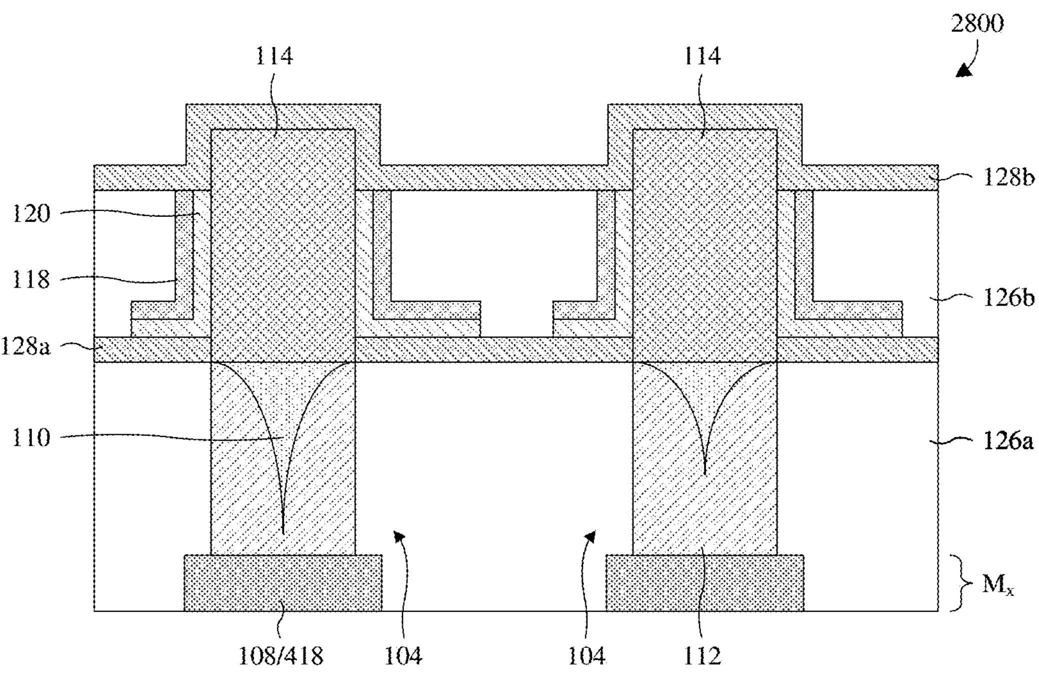

As illustrated by the cross-sectional view 2800 of FIG. 28, a second etch stop layer 128*b* is deposited overlying the second interconnect dielectric layer 126*b* and the semiconductor channels 114, and further lining sidewalls of the semiconductor channels 114. The second etch stop layer 128*b* is a dielectric material and is a different dielectric material type than the second interconnect dielectric layer 126*b*. In some embodiments, the second interconnect dielectric layer 126*b* is or comprise silicon nitride, silicon carbide, silicon oxynitride, some other suitable material, or any combination of the foregoing.

Figure 29:
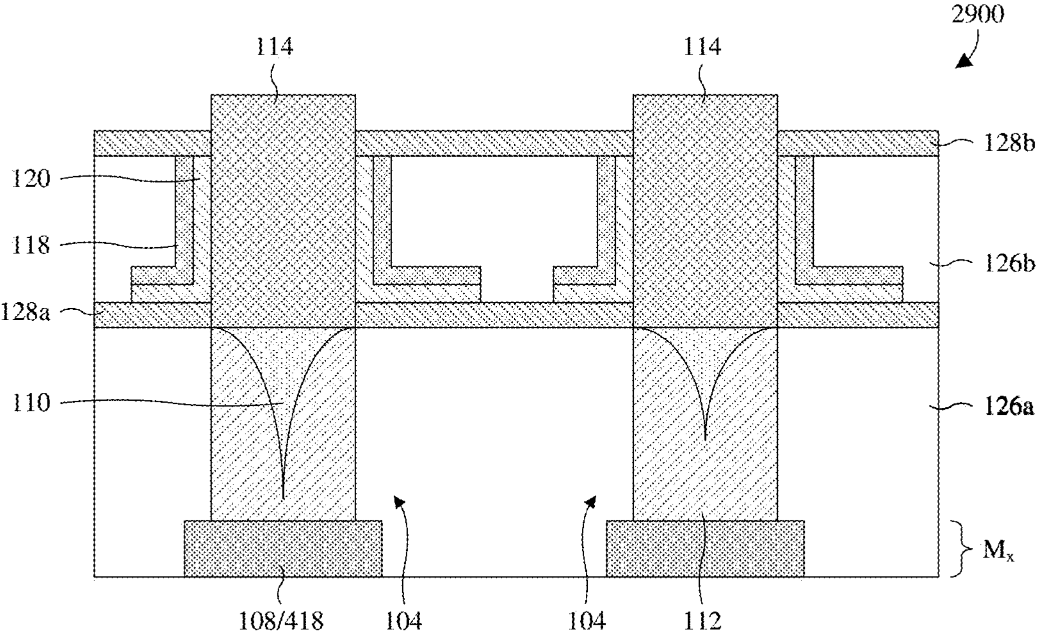

As illustrated by the cross-sectional view 2900 of FIG. 29, the second etch stop layer 128*b* is patterned to clear the second etch stop layer 128*b* from atop the semiconductor channels 114. Further, the patterning clears the second etch stop layer 128*b* partially from sidewalls of the semiconductor channels 114. In some embodiments, after the patterning, the second etch stop layer 128*b* has substantially uniform height throughout. The patterning may, for example, be performed by a photolithography/etching process or some other suitable patterning processes.

Figure 30:
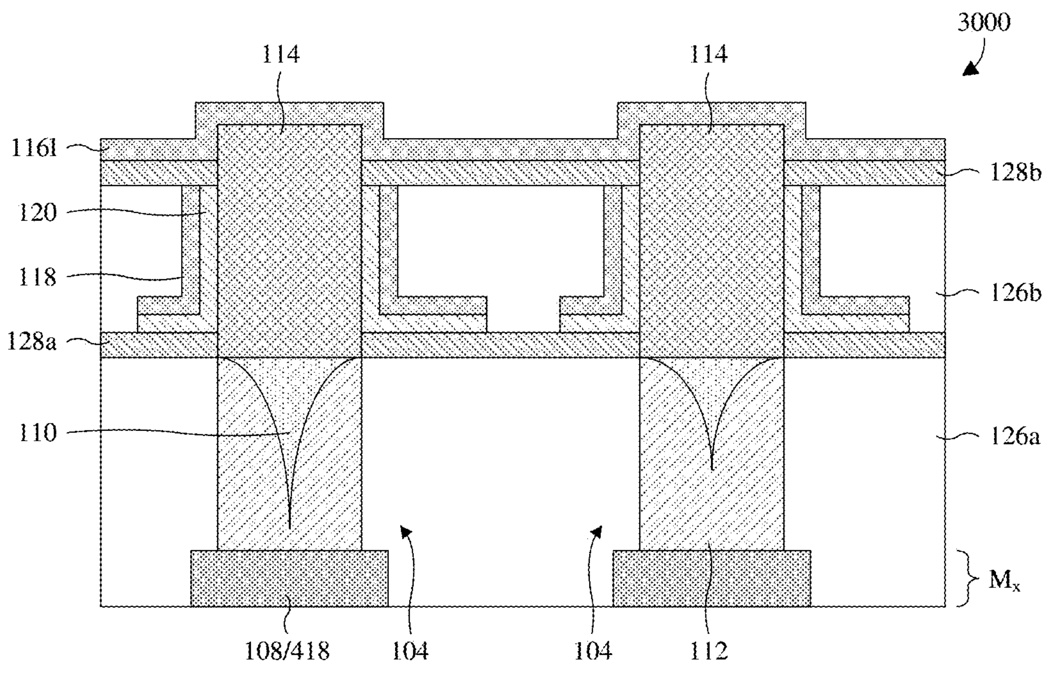

As illustrated by the cross-sectional view 3000 of FIG. 30, a conductive layer 1161 is deposited overlying the second etch stop layer 128*b* and the semiconductor channels 114 and further lining sidewalls of the semiconductor channels 114. The conductive layer 1161 may, for example, be deposited by ALD and/or some other suitable deposition process. In some embodiments, the conductive layer 1161 is or comprises titanium nitride, tantalum nitride, molybdenum nitride, tungsten nitride, aluminum, tungsten, copper, molybdenum, some other suitable metal or metal nitride, or any combination of the foregoing.

Figure 31:
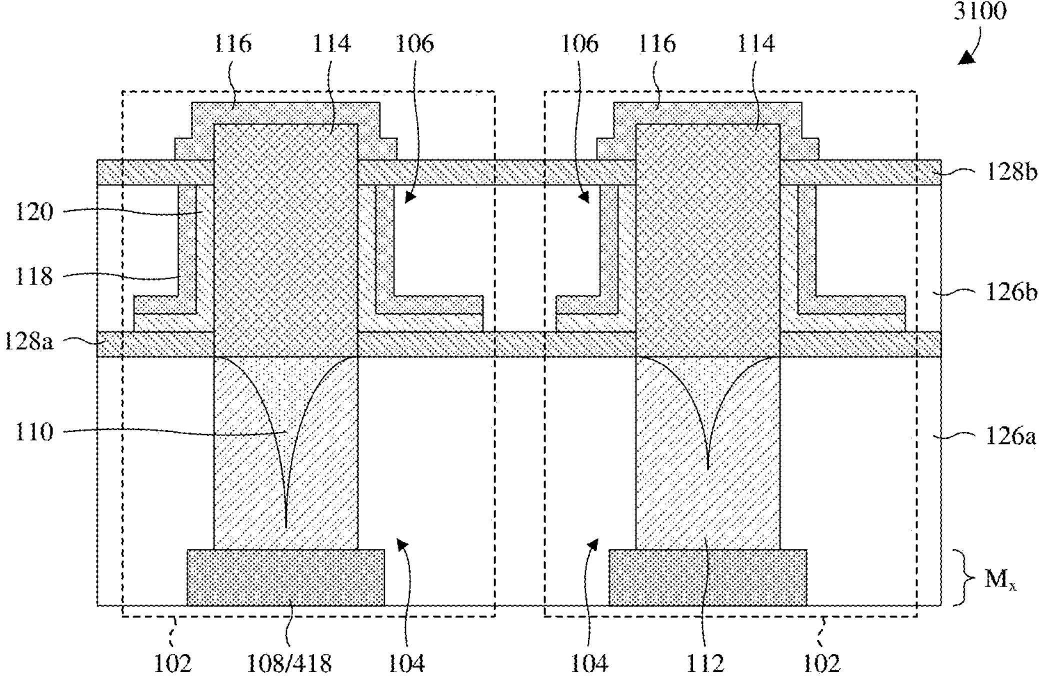

As illustrated by the cross-sectional view 3100 of FIG. 31, the conductive layer 1161 is patterned to form a pair of third conductors 116 respectively on the semiconductor channels 114. The patterning may, for example, be performed by a photolithography/etching process or some other suitable patterning process. To the extent that the patterning is performed by the photolithography/etching process, the second etch stop layer 128*b* may, for example, serve as an etch stop during the etching of the conductive layer 1161.

Collectively, the second conductors 110, the semiconductor channels 114, the third conductors 116, the gate electrodes 118, and the gate dielectric layers 120 form a pair of GAA transistors 106 respectively on the resistors 104. Further, the resistors 104 and the GAA transistors 106 form a pair of vertical GAA memory cells 102. The vertical GAA memory cells 102 may, for example, be employed as PUF devices and/or OTP memory cells.

The resistances of the vertical GAA memory cells 102 may have intrinsic randomness due to manufacturing variation. This is shown by the different distances from the points of the second conductors 110 respectively to the underlying ones of the first conductors 108. The larger the distance, the more dielectric material separating first and second conductors and hence the larger the resistance. The smaller the distance, the less dielectric material separating first and second conductors and hence the smaller the resistance. Therefore, when a vertical GAA memory cell is used as a PUF device, resistance may be used to generate a PUF value.

In some embodiments, a PUF value for a vertical GAA memory cell is generated by applying a low voltage across the resistor of the vertical GAA memory cell and comparing the resulting current to a reference current. The resulting current being less than the reference current may result in a PUF value of "0", and the resulting current being more than the reference current may result in a PUF value of "1", or vice versa. The low voltage may, for example, be low in that it does not result in dielectric breakdown of the insulator structure.

It has been appreciated that the resistances of the vertical GAA memory cell 102 have high stability. For example, resistance is unaffected or substantially unaffected by environmental conditions. Hence, the PUF values may have high stability. The high stability with the PUF values may, for example, result from the PUF values being generated from a low number of functional elements. For example, the PUF values may be generated from only two functional elements: a resistor; and a GAA transistor. In contrast, an SRAM cell that generates PUF values from six transistors or more may generate PUF values with low stability.

When the vertical GAA memory cells 102 are formed as above, the vertical GAA memory cells 102 are in HRSs. However, a vertical GAA memory cell may be irreversibly changed to a LRS by applying a high voltage across the resistor of the vertical GAA memory cell. The high voltage burns out a portion of the insulator structure separating the tip of the second conductor from the first conductor, thereby resulting in low conductivity from the tip to the first conductor. The HRS and the LRS may be used to represent data when a vertical GAA memory cell is used as an OTP memory cell. The HRS may, for example, represent a logic "0", and the LRS may, for example, represent a logic "1", or a vice versa.

Figure 32:
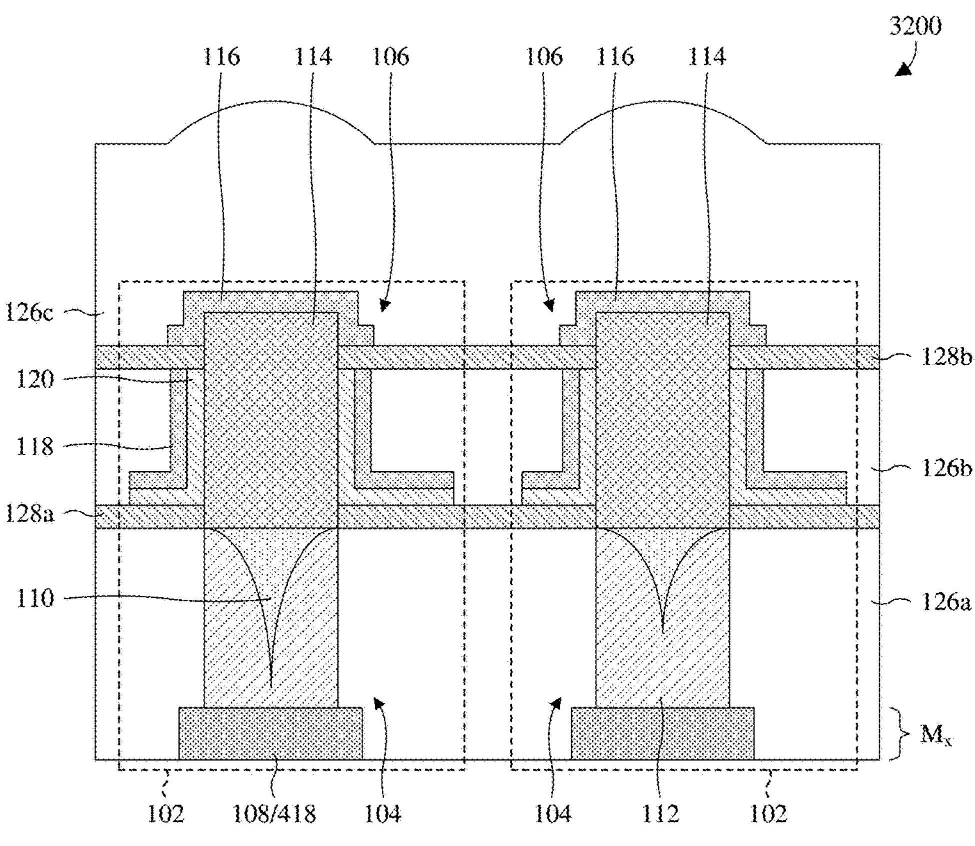

As illustrated by the cross-sectional view 3200 of FIG. 32, a third interconnect dielectric layer 126*c* is deposited covering the third conductors 116 and the second etch stop layer 128*b*.

Figure 33:
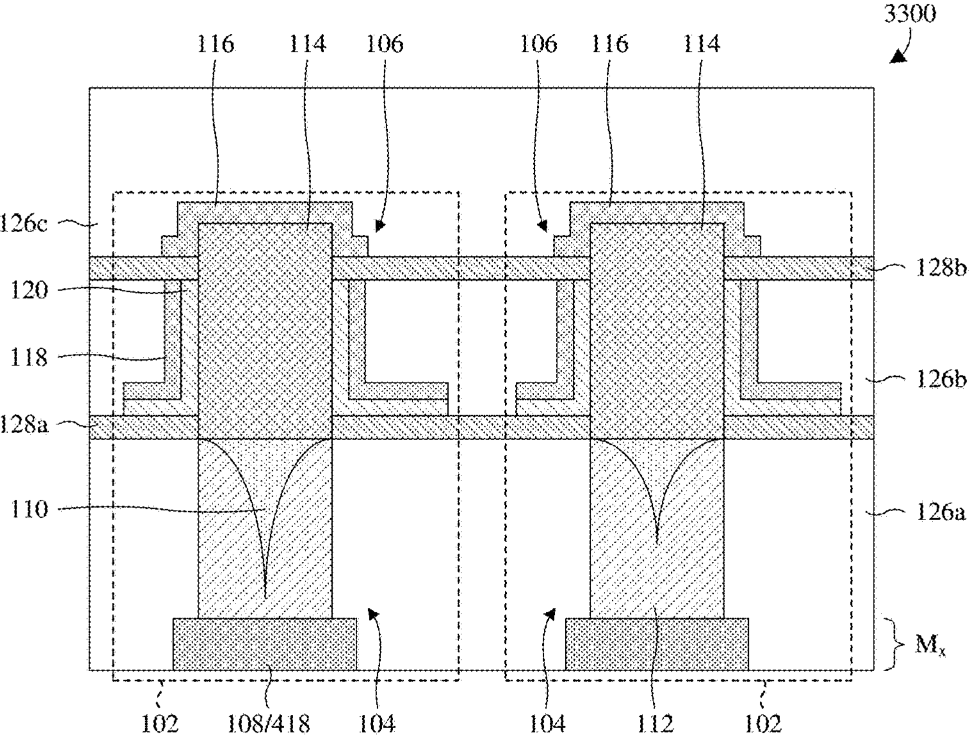

As illustrated by the cross-sectional view 3300 of FIG. 33, a planarization is performed into the third interconnect dielectric layer 126*c* to flatten a top surface of the third interconnect dielectric layer 126*c*. The planarization may, for example, be performed by a CMP and/or some other suitable planarization process.

Figure 34:
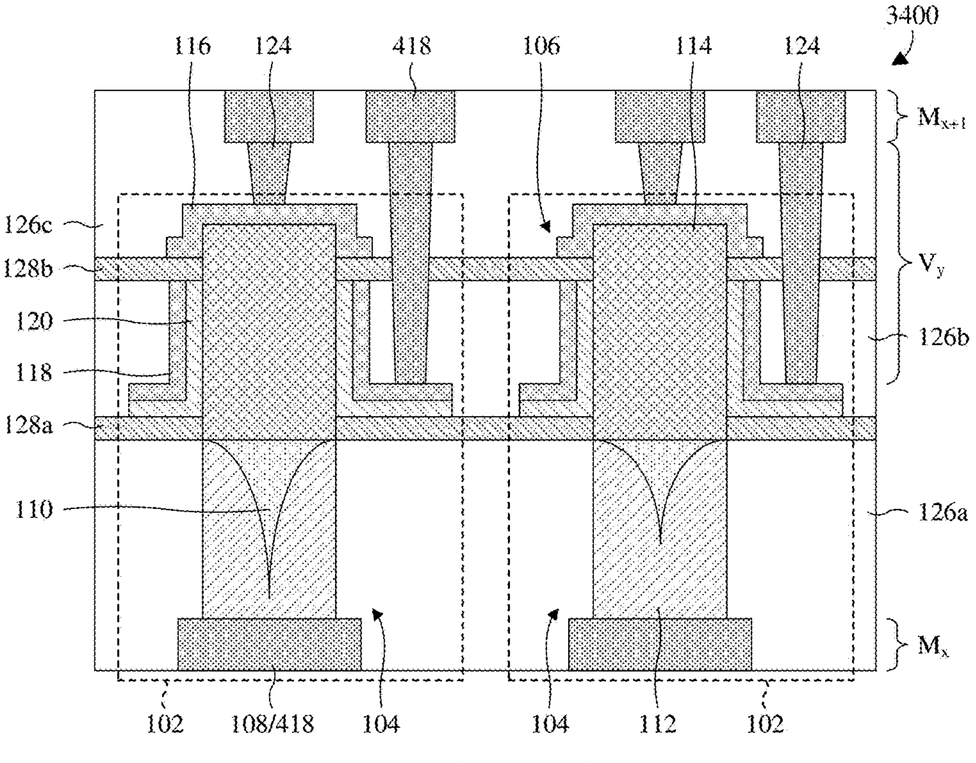

As illustrated by the cross-sectional view 3400 of FIG. 34, vias 124 of an interconnect structure and additional wires 418 of the interconnect structure are formed in the second and third interconnect dielectric layers 126*b*, 126*c* and the second etch stop layer 128*b*. The additional wires 418 form a wire level $M_{x+1}$ at a top of the third interconnect dielectric layer 126*c*. The vias 124 form a via level $V_y$ between the wire level $M_x$ and the wire level $M_{x+1}$ and extend respectively from the additional wires 418 respectively to the gate electrodes 118 and the third conductors 116. x is an integer representing a wire-level number, and y is an integer representing a via-level number.

A process for forming the via level $V_y$ and the wire level $M_{x+1}$ may, for example, comprise patterning the second and third interconnect dielectric layers 126*b*, 126*c* and the second etch stop layer 128*b* to form openings having profiles matching the via level $V_y$ and the wire level $M_{x+1}$. Thereafter, a conductive layer may be deposited filling the openings and a planarization may be performed to level a top surface of the conductive layer with a top surface of the third interconnect dielectric layer 126*c*. Other suitable processes are, however, amenable.

Figure 35:
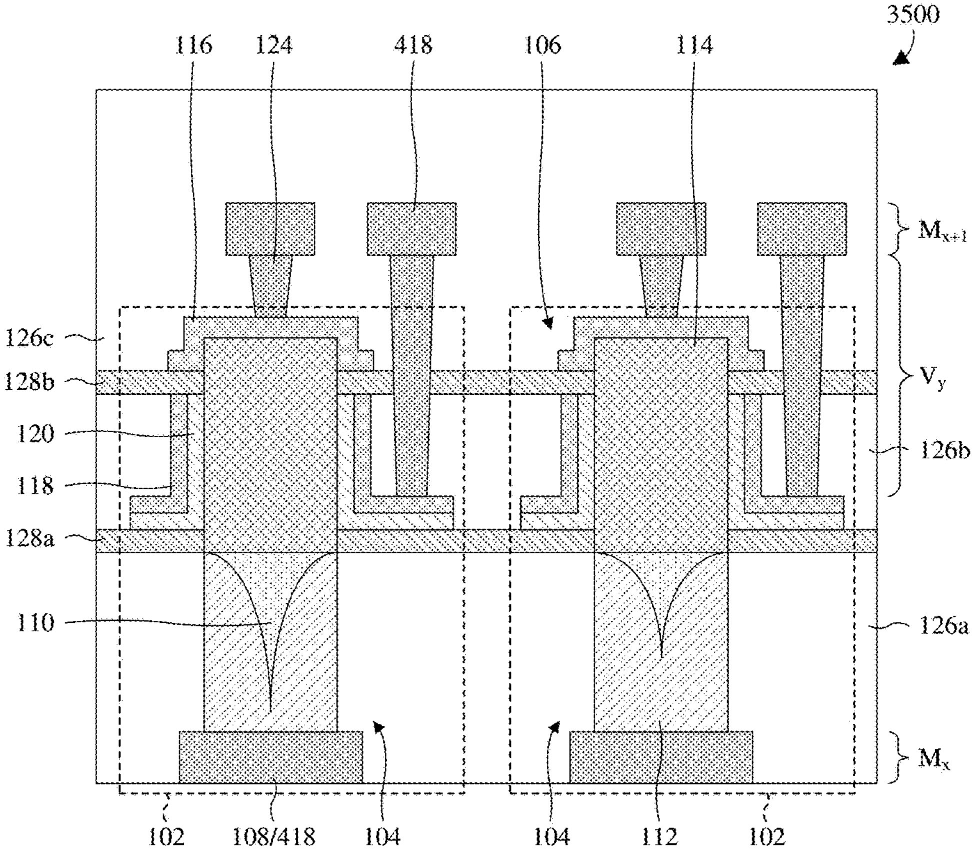

As illustrated by the cross-sectional view 3500 of FIG. 35, additional dielectric material is deposited to extend the third interconnect dielectric layer 126*c* over the wire level $M_{x+1}$. Further, in some embodiments, a planarization is performed to flatten a top surface of the third interconnect dielectric layer 126*c*. The planarization may, for example, be performed by a CMP and/or some other suitable planarization process.

Figure 36:
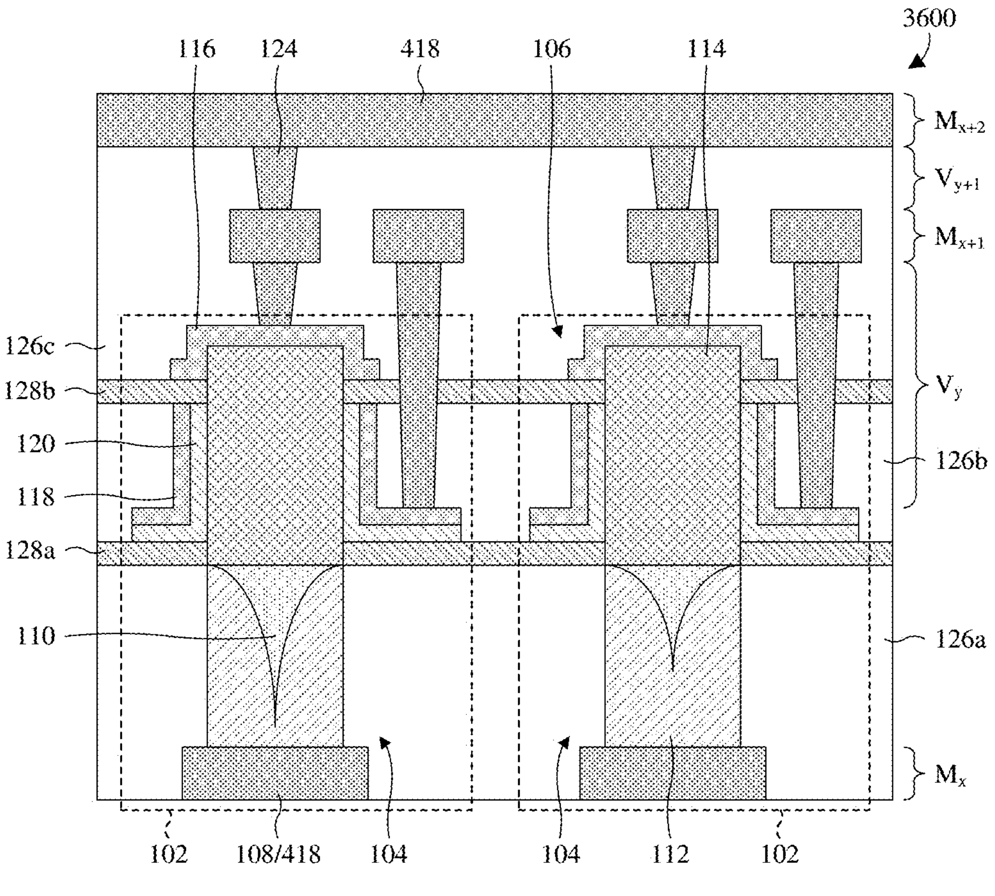

As illustrated by the cross-sectional view 3600 of FIG. 36, additional vias 124 of an interconnect structure and additional wires 418 of the interconnect structure are formed in the third interconnect dielectric layer 126*c*. The additional wires 418 form a wire level $M_{x+2}$ at a top of the third interconnect dielectric layer 126*c*. The additional vias 124 form a via level $V_{y+1}$ between the wire level $M_{x+1}$ and the wire level $M_{x+2}$ to interconnect these wire levels. x is an integer representing a wire-level number, and y is an integer representing a via-level number. A process for forming the via level $V_{y+1}$ and the wire level $M_{x+2}$ may, for example, be the same as the process for forming the via level $V_y$ and the wire level $M_{x+1}$. Other suitable processes are, however, amenable.

Figure 37:
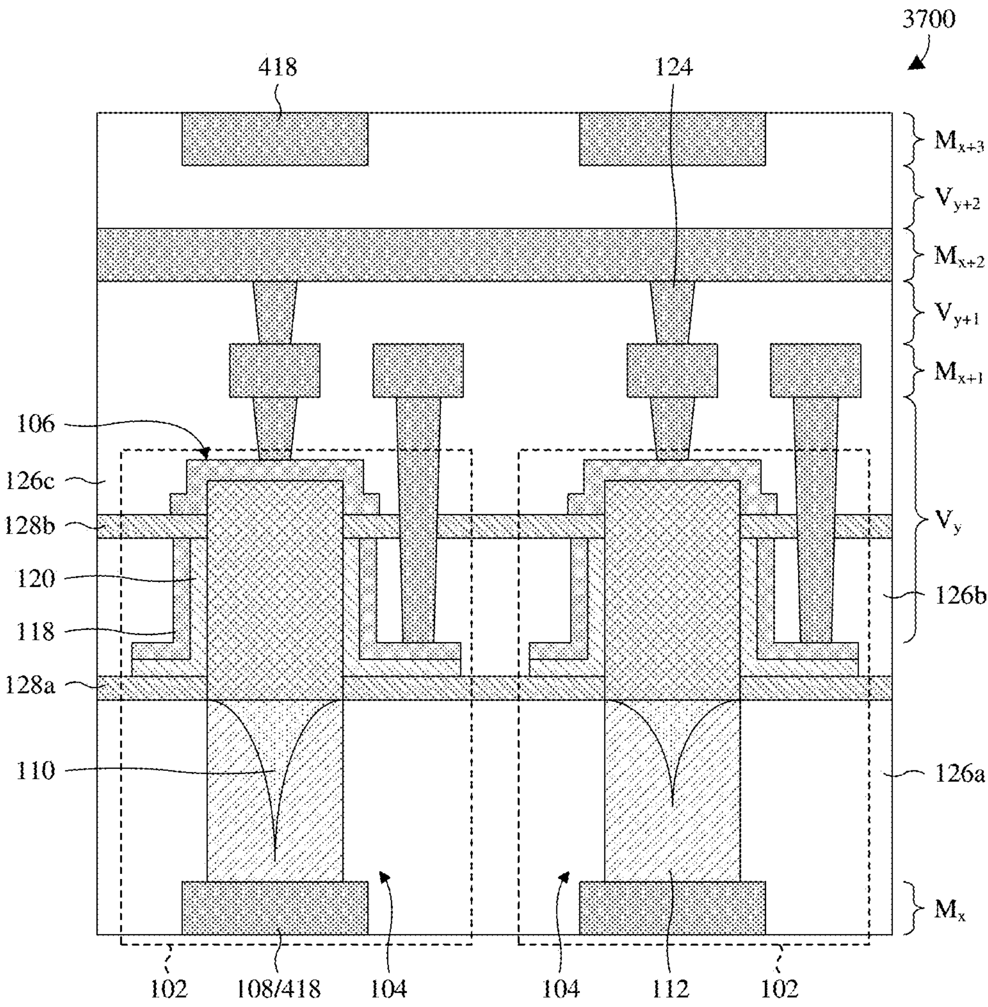

As illustrated by the cross-sectional view 3700 of FIG. 37, the acts described with regard to FIGS. 35 and 36 are repeated. Repeating these acts further extends the third interconnect dielectric layer 126*c*, as well as forms additional vias 124 and additional wires 418 respectively grouped into a via level $V_{y+2}$ and a wire level $M_{x+3}$. Notably, vias at the via level $V_{y+2}$ are outside the cross-sectional view 3700 of FIG. 37. In alternative embodiments, the acts described with regard to FIGS. 35 and 36 are not repeated or are instead repeated two or more times.

While FIGS. 12-37 are described with reference to a method, it will be appreciated that the structures shown in these figures are not limited to the method but rather may stand alone separate of the method. While FIGS. 12-37 are described as a series of acts, it will be appreciated that the order of the acts may be altered in other embodiments. While FIGS. 12-37 illustrate and describe as a specific set of acts, some acts that are illustrated and/or described may be omitted in other embodiments. Further, acts that are not illustrated and/or described may be included in other embodiments.

Figure 38:
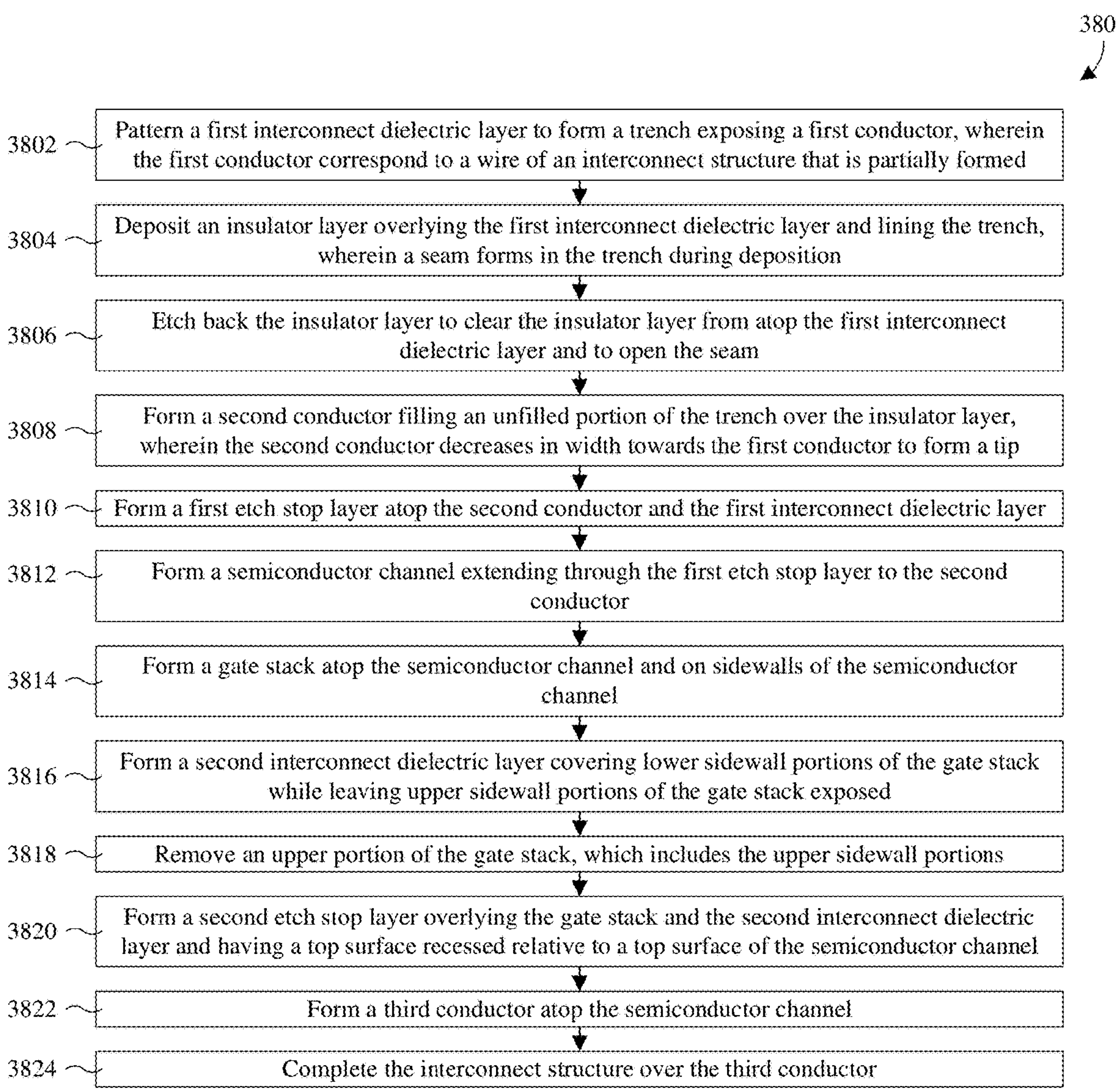
FIG. 38 illustrates a block diagram of some embodiments of the method of FIGS. 12-37.

With reference to FIG. 38, a block diagram 3800 of some embodiments of the method of FIGS. 12-37 is provided.

At 3802, a first interconnect dielectric layer is patterned to form a trench exposing a first conductor, wherein the first conductor correspond to a wire of an interconnect structure that is partially formed. See, for example, FIGS. 12 and 13.

At 3804, an insulator layer is deposited overlying the first interconnect dielectric layer and lining the trench, wherein a seam forms in the trench during deposition. See, for example, FIG. 14.

At 3806, the insulator layer is etched back to clear the insulator layer from atop the first interconnect dielectric layer and to open the seam. See, for example, FIG. 15.

At 3808, a second conductor is formed filling an unfilled portion of the trench over the insulator layer, wherein the second conductor decreases in width towards the first conductor to form a tip. See, for example, FIGS. 16 and 17.

At 3810, a first stop layer is formed atop the second conductor and the first interconnect dielectric layer. See, for example, FIG. 18.

At 3812, a semiconductor channel is formed extending through the first etch stop layer to the second conductor. See, for example, FIGS. 19-21.

At 3814, a gate stack is formed atop the semiconductor channel and on sidewalls of the semiconductor channel. See, for example, FIGS. 22 and 23.

At 3816, a second interconnect dielectric layer is formed covering lower sidewall portions of the gate stack while leaving upper sidewall portions of the gate stack exposed. See, for example, FIGS. 24-26.

At 3818, an upper portion of the gate stack, which includes the upper sidewall portions, is removed. See, for example, FIG. 27.

At 3820, a second etch stop layer is formed overlying the gate stack and the second interconnect dielectric layer and having a top surface recessed relative to a top surface of the semiconductor channel. See, for example, FIGS. 28 and 29.

At 3822, a third conductor is formed atop the semiconductor channel. See, for example, FIGS. 30 and 31.

At 3824, the interconnect structure is completed over the third conductor. See, for example, FIGS. 32-37.

While the block diagram 3800 of FIG. 38 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 39-42, a series of cross-sectional views 3900-4200 of some first alternative embodiments of the method of FIGS. 12-37 is provided. Such embodiments may, for example, be employed to form an interconnect structure as in FIG. 6A, 8A, 10A, or 11A or some other suitable interconnect structure.

Figure 39:
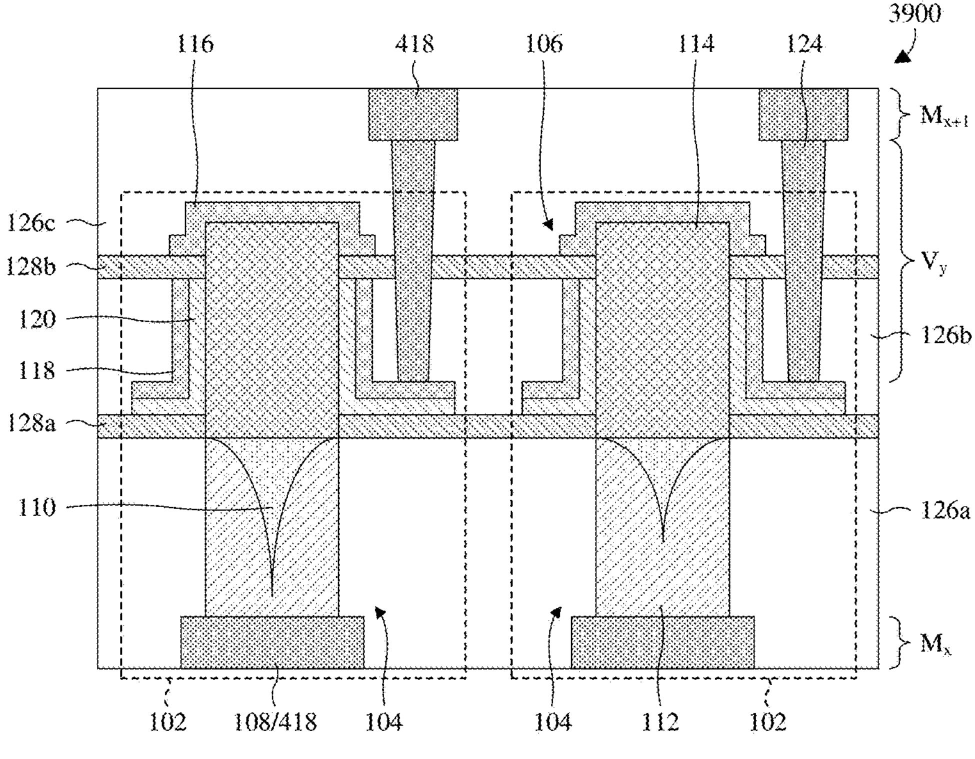
FIGS. 39-42 illustrate a series of cross-sectional views of some first alternative embodiments of the method of FIGS. 12-37.

As illustrated by the cross-sectional view 3900 of FIG. 39, the acts described with regard to FIGS. 12-34 are performed. The acts are performed as described with regard to FIGS. 12-34, except that the via level $V_y$ is devoid of vias extending to the third conductors 116 and the wire level $M_{x+1}$ is devoid of wires electrically coupled to the third conductors 116 by the vias.

Figure 40:
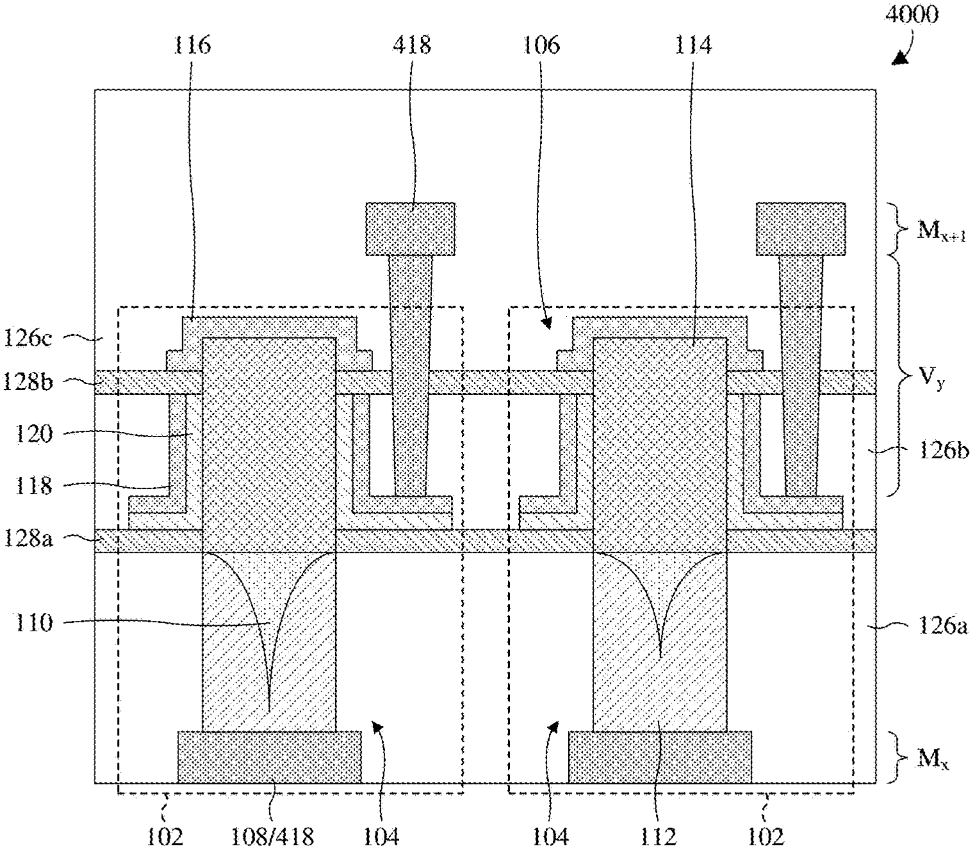

As illustrated by the cross-sectional view 4000 of FIG. 40, the acts described with regard to FIG. 35 are performed to extend the third interconnect dielectric layer 126*c* over the via level $V_y$ and the wire level $M_{x+1}$.

Figure 41:
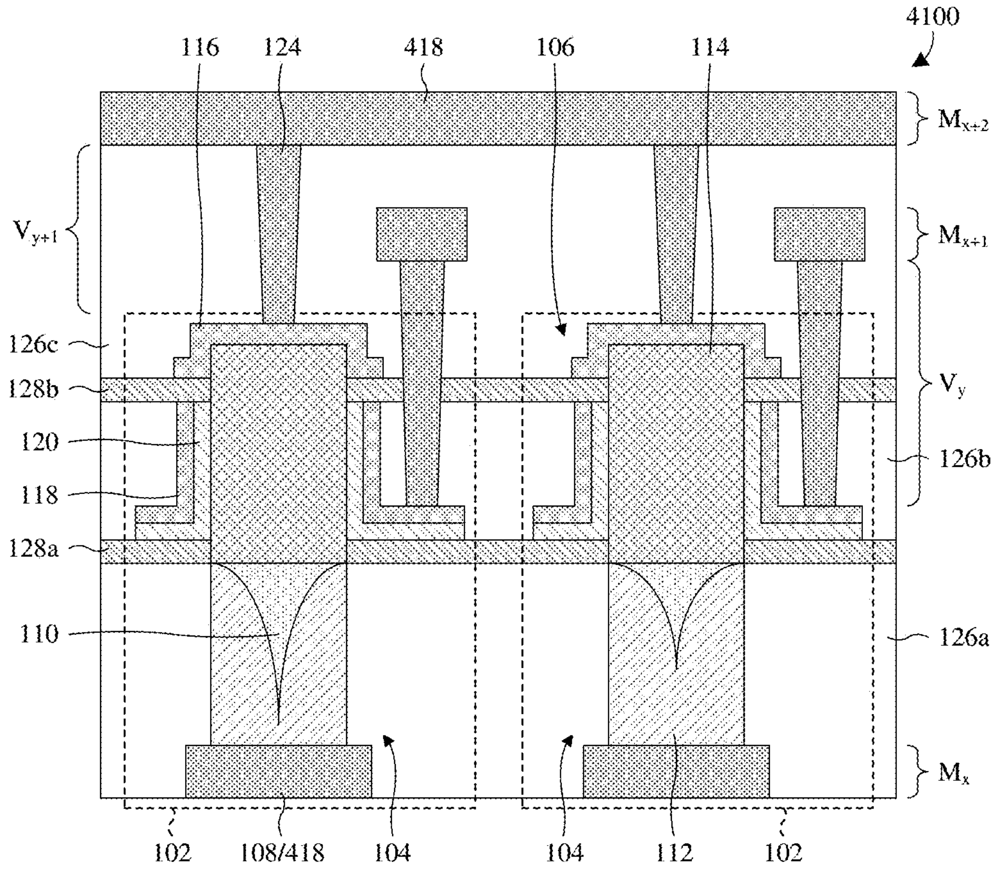

As illustrated by the cross-sectional view 4100 of FIG. 41, the acts described with regard to FIG. 36 are performed to form the via level $V_{y+1}$ and the wire level $M_{x+2}$. The acts are performed as described with regard to FIG. 36, except that the via level $V_{y+1}$ is formed including vias extending from the wire level $M_{x+2}$ respectively to the third conductors 116.

Figure 42:
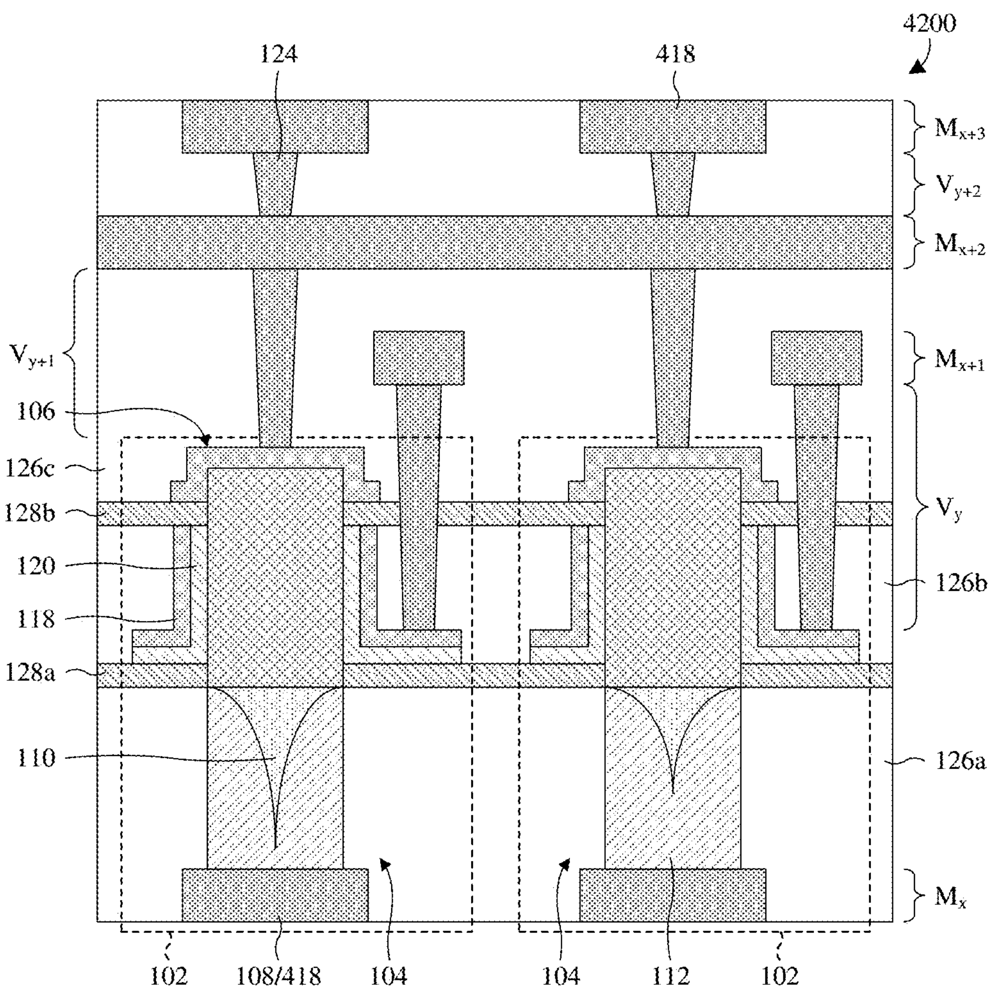

As illustrated by the cross-sectional view 4200 of FIG. 42, the acts described with regard to FIG. 37 are performed to form the via level $V_{y+2}$ and the wire level $M_{x+3}$.

While FIGS. 39-42 are described with reference to a method, it will be appreciated that the structures shown in these figures are not limited to the method but rather may stand alone separate of the method. While FIGS. 39-42 are described as a series of acts, it will be appreciated that the order of the acts may be altered in other embodiments. While FIGS. 39-42 illustrate and describe as a specific set of acts, some acts that are illustrated and/or described may be omitted in other embodiments. Further, acts that are not illustrated and/or described may be included in other embodiments.

With reference to FIGS. 43-48, a series of cross-sectional views 4300-4800 of some second alternative embodiments of the method of FIGS. 12-37 is provided. Such embodiments may, for example, be employed to form a vertical GAA memory cell as in FIG. 8B or 10B.

Figure 43:
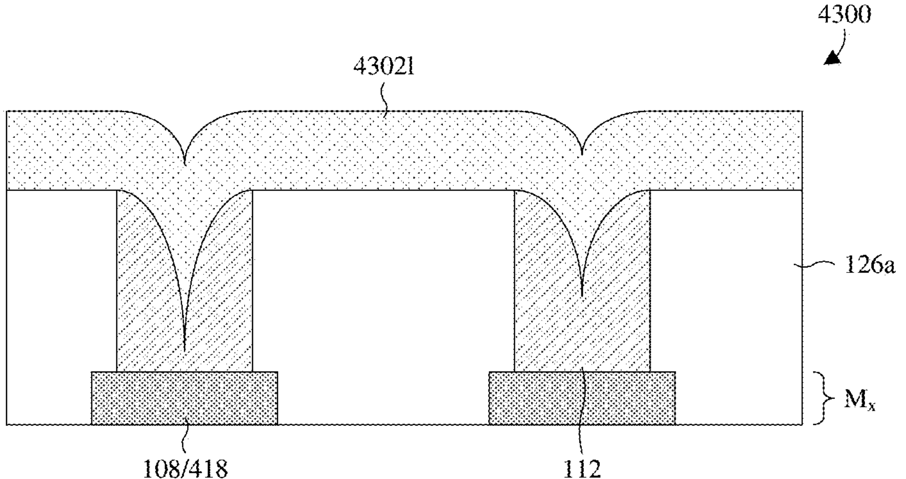
FIGS. 43-48 illustrate a series of cross-sectional views of some second alternative embodiments of the method of FIGS. 12-37.

As illustrated by the cross-sectional view 4300 of FIG. 43, the acts described with regard to FIGS. 12-16 are performed. The acts are performed as described with regard to FIGS. 12-16, except that a sacrificial layer 43021 is used in place of the conductive layer 1101. The sacrificial layer 43021 may, for example, be polysilicon and/or some other suitable sacrificial material.

Figure 44:
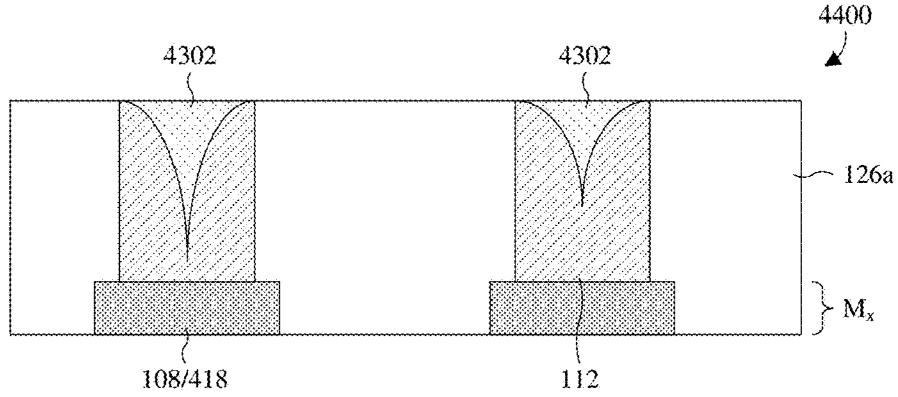

As illustrated by the cross-sectional view 4400 of FIG. 44, a planarization is performed into the sacrificial layer 43021. The planarization may, for example, be performed by a CMP or some other suitable planarization process. The planarization clears the sacrificial layer 43021 from atop the first interconnect dielectric layer 126*a* and forms a pair of sacrificial structures 4302. The sacrificial structures 4302 respectively overlie the first conductors 108 and are spaced from the first conductors 108 by the insulator structures 112. Further, the sacrificial structures 4302 decrease in width from a top of the first interconnect dielectric layer 126*a* towards the first conductors 108 to culminate in points.

Figure 45:
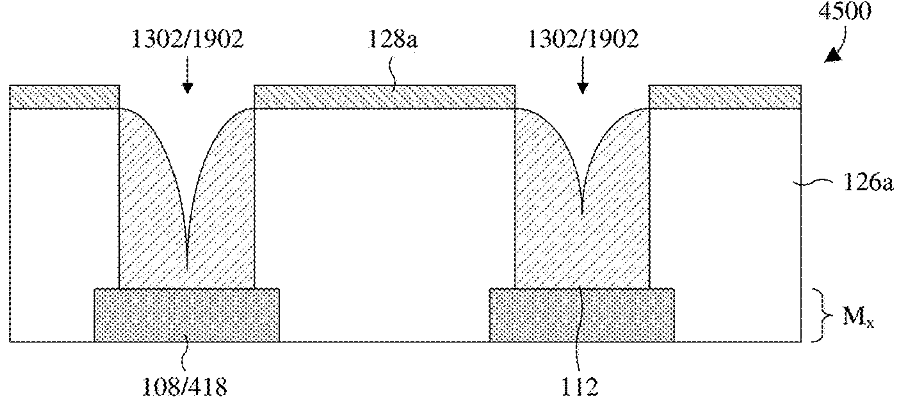

As illustrated by the cross-sectional view 4500 of FIG. 45, the acts described with regard to FIGS. 18 and 19 are performed to form the first etch stop layer 128*a* with the openings 1902. Further, thereafter, the sacrificial structures 4302 are removed to partially clear the trenches 1302 at the openings 1902. The removal may, for example, be performed by an etching process and/or by some other suitable removal process.

Figure 46:
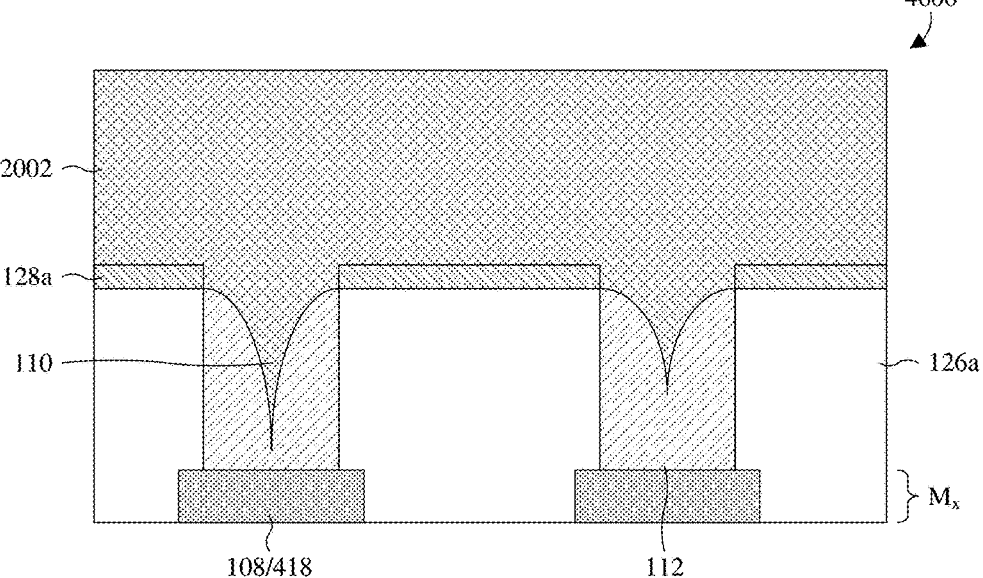

As illustrated by the cross-sectional view 4600 of FIG. 46, the semiconductor layer 2002 is deposited atop the first etch stop layer 128*a*, and further filling the openings 1902 and a remainder of trenches 1302 atop the insulator structures 112. In some embodiments, a top surface of the semiconductor layer 2002 is further flattened by a planarization. The planarization may, for example, be performed by a CMP and/or some other suitable planarization process.

Figure 47:
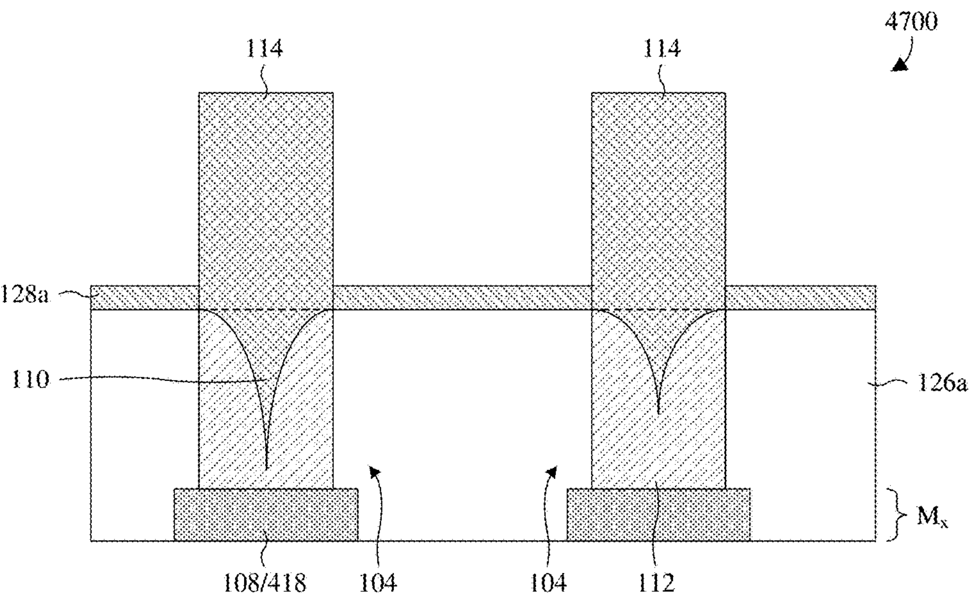

As illustrated by the cross-sectional view 4700 of FIG. 47, the semiconductor layer 2002 is patterned to form a pair of semiconductor channels 114 and a pair of second conductors 110. The patterning may, for example, be performed by a photolithography/etching process or some other suitable patterning processes. To the extent that the patterning is performed by the photolithography/etching process, the first etch stop layer 128*a* may, for example, serve as an etch stop during the etching of the semiconductor layer 2002.

The pair of second conductors 110 correspond to portions of the semiconductor layer 2002 partially filling the trenches 1302 in FIG. 44 and form a pair of resistors 104 with the insulator structures 112 and the first conductors 108. The semiconductor channels 114 respectively overlie the second conductors 110 and correspond to portions of the semiconductor layer 2002 outside the trenches 1302 in FIG. 44. In some embodiments, the patterning is such that the semiconductor channels 114 have individual widths that are the same as or similar to individual widths of the openings 1902 (see FIG. 43).

Figure 48:
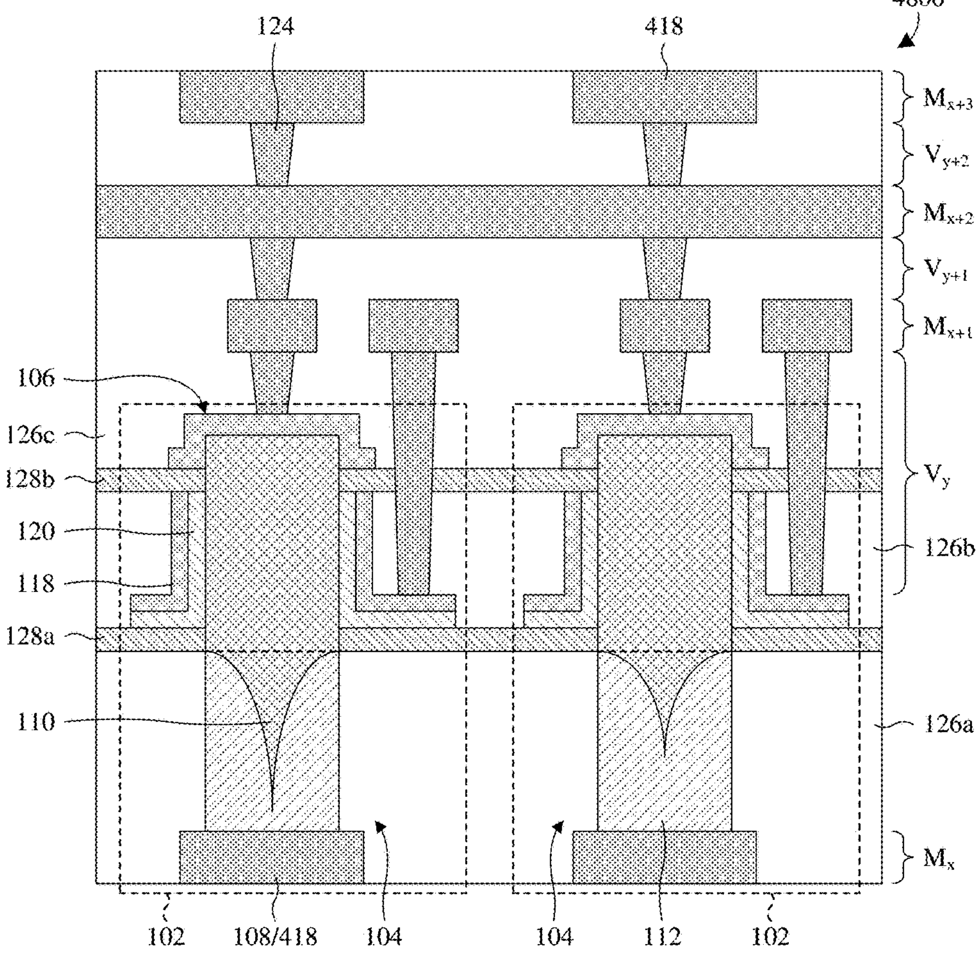

As illustrated by the cross-sectional view 4800 of FIG. 48, the acts described with regard to FIGS. 22-37 are performed to complete the vertical GAA memory cells 102 and to further complete the interconnect structure (e.g., formed from the wires 418 and the vias 124).

While FIGS. 43-48 are described with reference to a method, it will be appreciated that the structures shown in these figures are not limited to the method but rather may stand alone separate of the method. While FIGS. 43-48 are described as a series of acts, it will be appreciated that the order of the acts may be altered in other embodiments. While FIGS. 43-48 illustrate and describe as a specific set of acts, some acts that are illustrated and/or described may be omitted in other embodiments. Further, acts that are not illustrated and/or described may be included in other embodiments.

Figure 49:
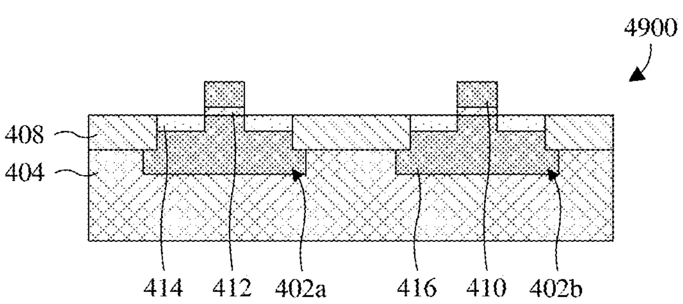
FIGS. 49-51 illustrate a series of cross-sectional views of some embodiments of a method for forming an integrated chip in which a pair of vertical GAA memory cells are on a frontside of a logic device.
Figure 50:
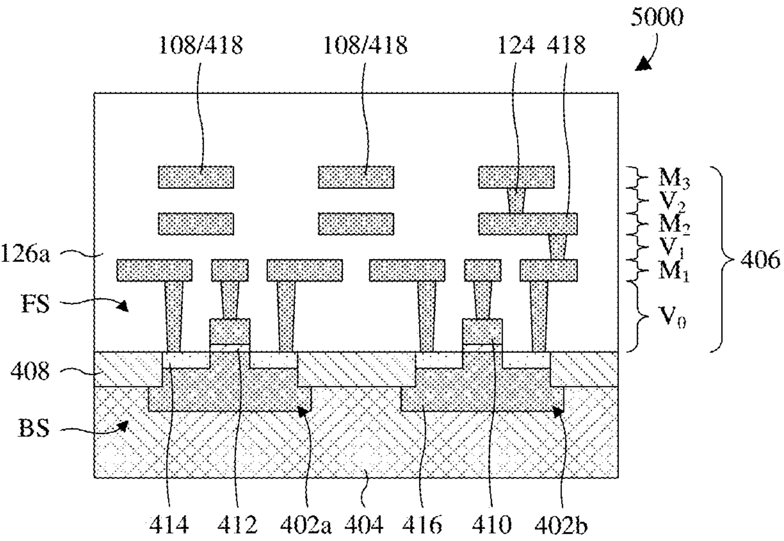
Figure 51:
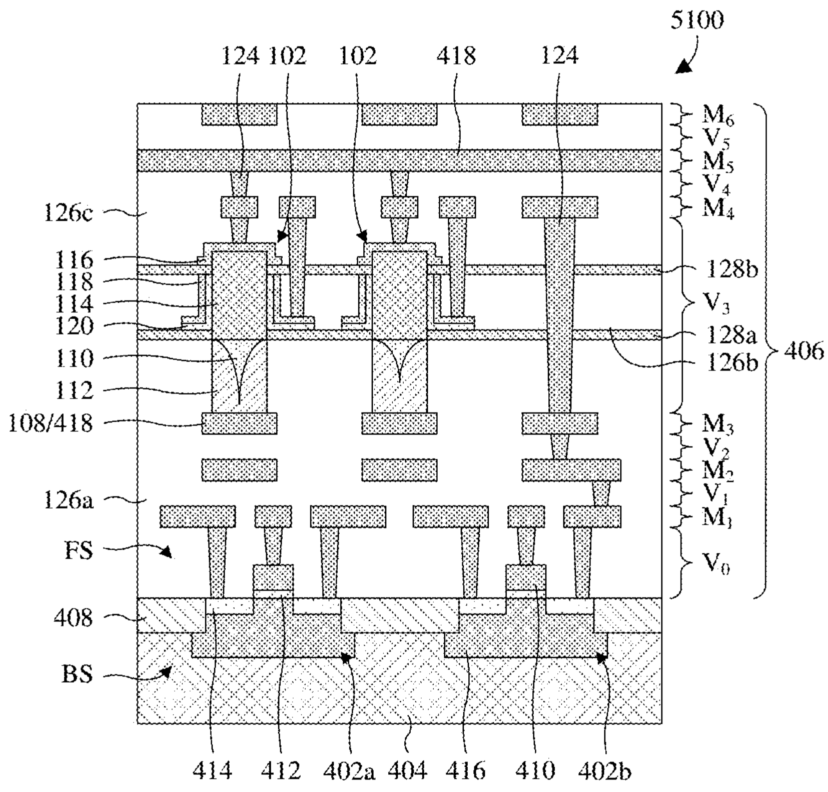

With reference to FIGS. 49-51, a series of cross-sectional views 4900-5100 of some embodiments of a method for forming an integrated chip is provided in which a pair of vertical GAA memory cells are on a frontside of a logic device. The integrated chip corresponds to FIG. 4, but may alternatively correspond to, for example, any of FIGS. 6A-6C, 8A, and 8B.

As illustrated by the cross-sectional view 4900 of FIG. 49, a first logic device 402*a* and a second logic device 402*b* are formed on a semiconductor substrate 404. The first and second logic devices 402*a*, 402*b* are separated from each other by an isolation structure 408. The first and second logic devices 402*a*, 402*b* may, for example, be planar FETs, FinFETs, GAA FETs, some other suitable type of logic device and/or transistor, or any combination of the foregoing.

In some embodiments, the first and second logic devices 402*a*, 402*b* comprise individual gate electrodes 410, individual gate dielectric layers 412, and individual pairs of source/drain regions 414. The pairs of source/drain regions 414 are inset into a top of the semiconductor substrate 404. The gate electrodes 410 respectively overlie the gate dielectric layers 412 and are respectively between the pairs of source/drain regions 414. In some embodiments, the first and second logic devices 402*a*, 402*b* further comprise individual wells 416 respectively underlying the gate electrodes 410 in the semiconductor substrate 404.

As illustrated by the cross-sectional view 5000 of FIG. 50, an interconnect structure 406 is partially formed overlying the first and second logic devices 402*a*, 402*b* on a frontside FS of the first logic devices 402*a*, opposite a backside BS of the first logic devices 402*a*.

The interconnect structure 406 comprises a plurality of wires 418 and a plurality of vias 124 in a first interconnect dielectric layer 126*a*. The plurality of wires 418 are grouped into a plurality of wire levels, and the plurality of vias 124 are grouped into a plurality of via levels alternatingly stacked with the plurality of wire levels. The wire levels are labeled $M_1$, $M_2$, and $M_3$ from a bottom of the interconnect structure 406 to a top of the interconnect structure 406. Further, two wires in the wire level $M_3$ correspond to a pair of first conductors 108 for vertical GAA memory cells hereafter formed. The via levels are labeled $V_0$, $V_1$, and $V_2$ from the bottom of the interconnect structure 406 to the top of the interconnect structure 406.

As illustrated by the cross-sectional view 5100 of FIG. 51, the acts described with regard to FIGS. 12-37 are performed. This forms a pair of vertical GAA memory cells 102 and completes the interconnect structure 406. The interconnect structure 406, as completed, further includes additional via levels $V_3$, $V_4$, and $V_5$ and additional wire levels $M_4$, $M_5$, and $M_6$. In alternative embodiments, the acts described with regard to FIGS. 39-42 are instead performed, or the acts described with regard to FIGS. 43-48 are instead performed.

While FIGS. 49-51 are described with reference to a method, it will be appreciated that the structures shown in these figures are not limited to the method but rather may stand alone separate of the method. While FIGS. 49-51 are described as a series of acts, it will be appreciated that the order of the acts may be altered in other embodiments. While FIGS. 49-51 illustrate and describe as a specific set of acts, some acts that are illustrated and/or described may be omitted in other embodiments. Further, acts that are not illustrated and/or described may be included in other embodiments.

With reference to FIGS. 52-64, a series of cross-sectional views 5200-6400 of some embodiments of a method for forming an integrated chip is provided in which pair of vertical GAA memory cells are on a backside of a logic device. The integrated chip corresponds to FIG. 9, but may alternatively correspond to, for example, any of FIGS. 10A-10C, 11A, and 11B.

Figure 52:
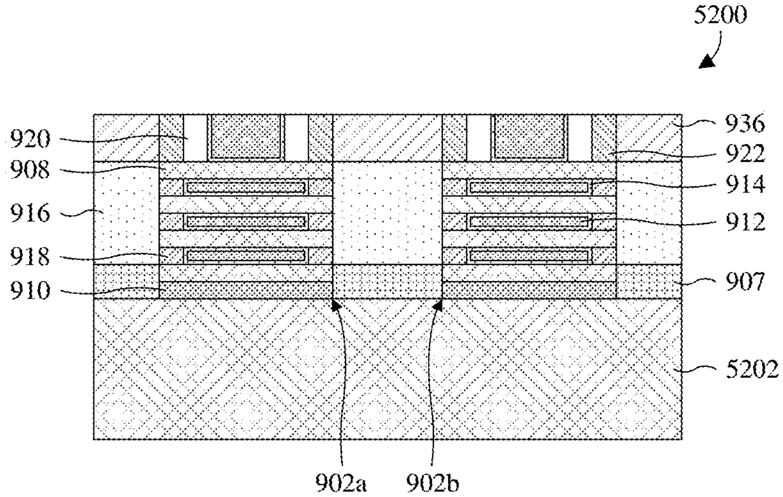
FIGS. 52-64 illustrate a series of cross-sectional views of some embodiments of a method for forming an integrated chip in which a pair of vertical GAA memory cells are on a backside of a logic device.

As illustrated by the cross-sectional view 5200 of FIG. 52, a first logic device 902*a* and a second logic device 902*b* are formed neighboring on a semiconductor substrate 5202. The semiconductor substrate 5202 may, for example, be or comprise silicon and/or some other suitable semiconductor material. The first and second logic devices 902*a*, 902*b* are GAA FETs, but may alternatively be, for example, planar FETs, FinFETs, some other suitable type of logic device and/or transistor, or any combination of the foregoing.

The first and second logic devices 902*a*, 902*b* comprise individual pluralities of semiconductor channels 908, individual protection layers 910, individual gate electrodes 912, individual gate dielectric layers 914, and corresponding source/drain regions 916. The semiconductor channels 908 for a given one of the first and second logic devices 902*a*, 902*b* are vertically stacked over a corresponding one of the protection layers 910. Further, the semiconductor channels 908 for given one of the first and second logic devices 902*a*, 902*b* are laterally sandwiched between two of the source/drain regions 916 and are vertically separated from each other by a corresponding one of the gate electrodes 912. The gate electrodes 912 are separated from the semiconductor channels 908 respectively by the gate dielectric layers 914.

The first and second logic devices 902*a*, 902*b* further comprise corresponding individual first spacer structures 918, individual second spacer structures 920, and individual third spacer structures 922. The first spacer structures 918 separate corresponding ones of the semiconductor channels 908 from each other on sidewalls of the gate electrodes 912. The second spacer structures 920 overlie the semiconductor channels 908 on sidewalls of the gate electrodes 912, and the third spacer structures 922 overlie the semiconductor channels 908 on sidewalls of the second spacer structures 920.

An isolation structure 907 surrounds a bottom of the first and second logic devices 902*a*, 902*b*, under the source/drain regions 916. Further, an ILD layer 936 surrounds a top of the first and second logic devices 902*a*, 902*b*, over the source/drain regions 916.

Figure 53:
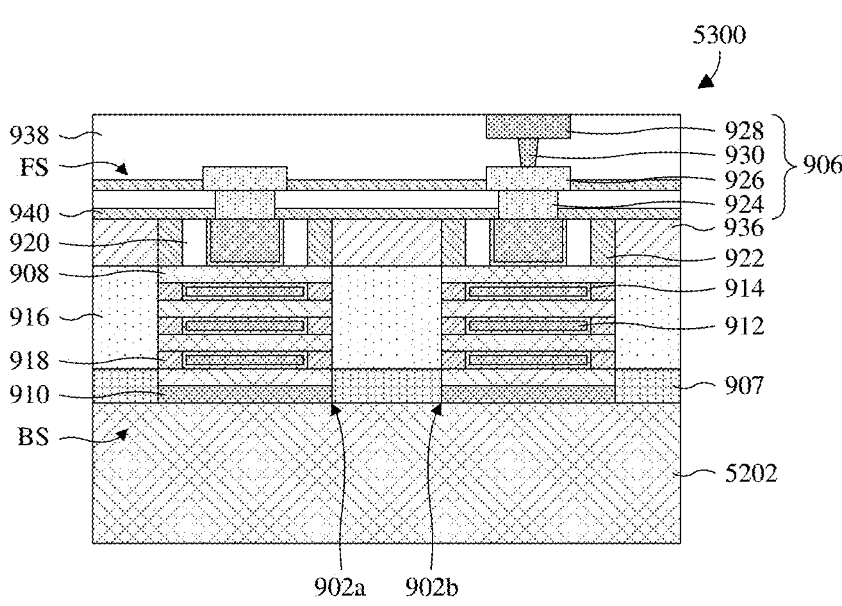

As illustrated by the cross-sectional view 5300 of FIG. 53, a first interconnect structure 906 is formed overlying the first and second logic devices 902*a*, 902*b* on a frontside FS of the first logic device 902*a*, opposite a backside BS of the first logic device 902*a*. Further, the first interconnect structure 906 is formed in a dielectric structure. The dielectric structure comprises a plurality of interconnect dielectric layers 938 and a plurality of etch stop layers 940 that are alternatively and vertically stacked.

The first interconnect structure 906 comprises a plurality of conductive features, including a plurality of first-level contacts 924, a plurality of second-level contacts 926, a wire 928, and a via 930. The second-level contacts 926 overlie and are spaced from the gate electrodes 912, and the first-level contacts 924 extend from the second-level contacts 926 to the gate electrodes 912. The wire 928 is spaced over the second-level contacts 926, and the via 930 extends from the wire 928 to a respective one of the second-level contacts 926. In some embodiments, the wire 928 may also be regarded as an RDL. Further, while only one via level and only one wire level are shown, more via levels and/or more wire levels are amenable.

Figure 54:
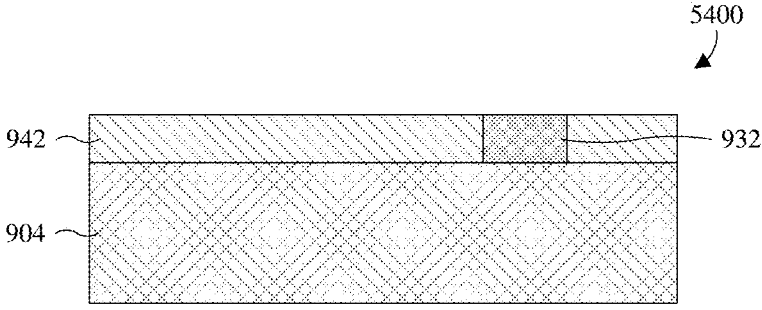

As illustrated by the cross-sectional view 5400 of FIG. 54, a heat-sink conductor 932 and a bond dielectric layer 942 are formed on a carrier substrate 904. The heat-sink conductor 932 is inset into the bond dielectric layer 942, such that a top surface of the heat-sink conductor 902 is flush with a top surface of the bond dielectric layer 942.

Figure 55:
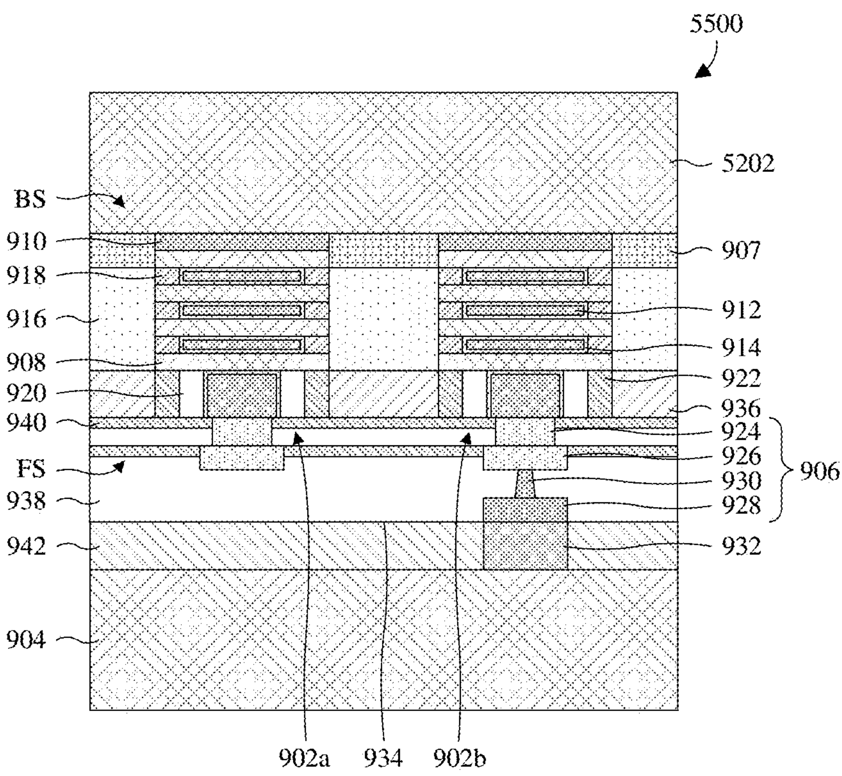

As illustrated by the cross-sectional view 5500 of FIG. 55, the structure of FIG. 53 is vertically flipped and bonded to the structure of FIG. 54 at a bond interface 934. The bond interface 934 includes a dielectric-to-dielectric interface between the bond dielectric layer 942 and one of the interconnect dielectric layers 938. The bond interface 934 further includes a conductor-to-conductor interface between the heat-sink conductor 932 and the wire 928.

Figure 56:
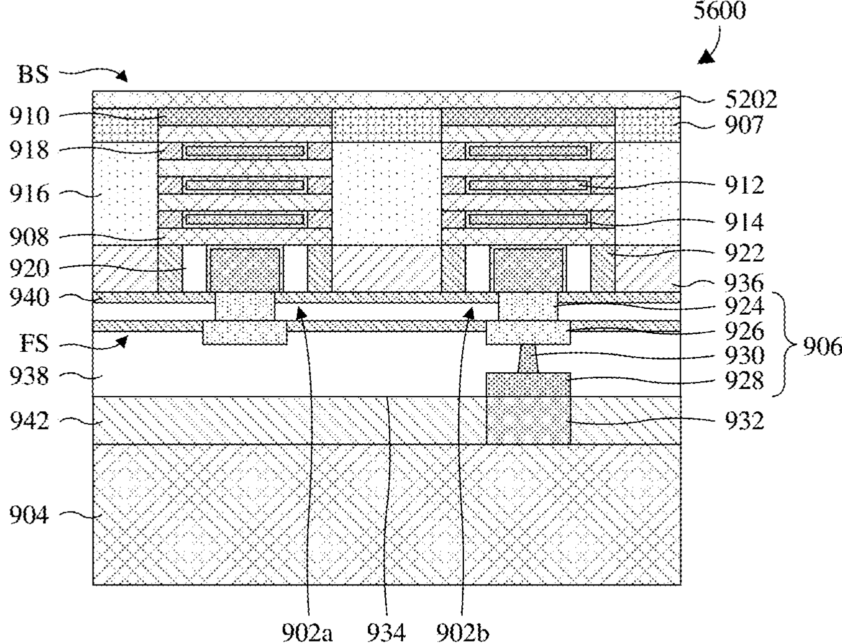

As illustrated by the cross-sectional view 5600 of FIG. 56, the semiconductor substrate 5202 is thinned from the backside BS of the first logic device 902*a*. The thinning may, for example, be performed by a CMP and/or some other suitable planarization.

Figure 57:
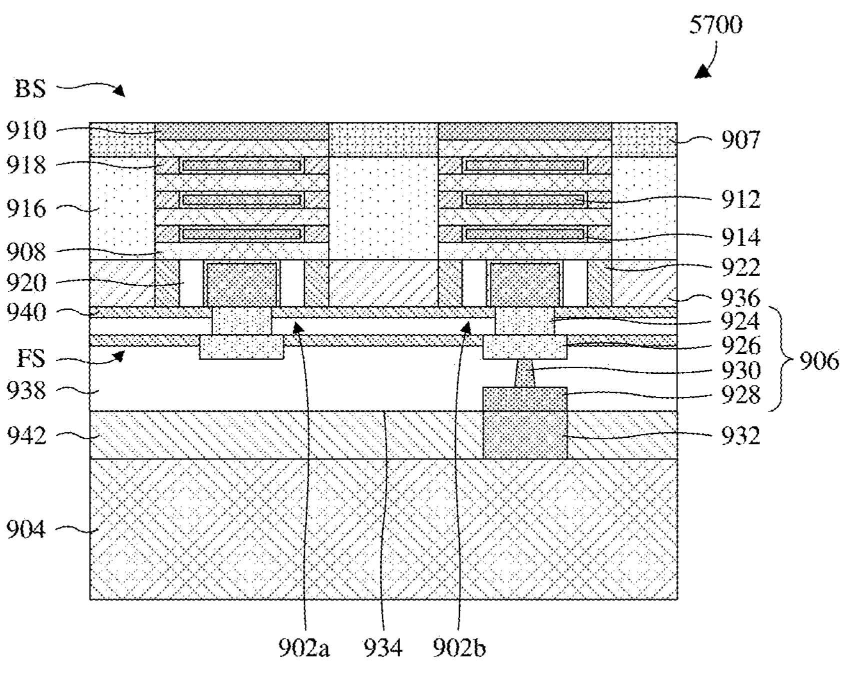

As illustrated by the cross-sectional view 5700 of FIG. 57, the semiconductor substrate 5202 is removed, thereby exposing the isolation structure 907 and the protection layers 910. The removal may, for example, be performed by an etch and/or some other suitable removal process.

Figure 58:
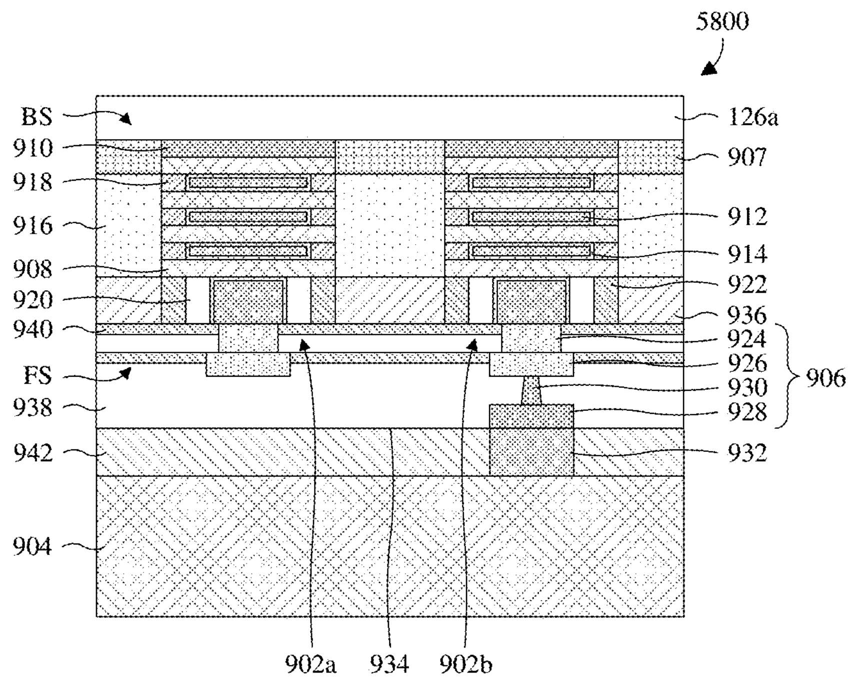

As illustrated by the cross-sectional view 5800 of FIG. 58, a first interconnect dielectric layer 126*a* is deposited atop the isolation structure 907 and the protection layers 910.

Figure 59:
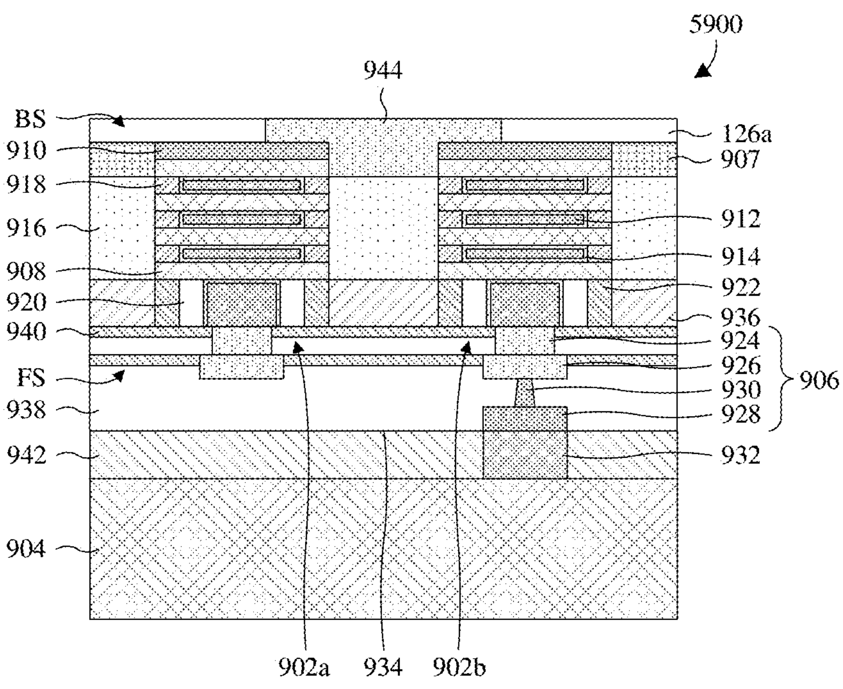

As illustrated by the cross-sectional view 5900 of FIG. 59, a contact plug 944 is formed inset into the first interconnect dielectric layer 126*a*. A process for forming the contact plug

944 may, for example, comprise patterning the first interconnect dielectric layer 126*a* to form an opening exposing a source/drain region common to the first and second logic devices 902*a*, 902*b*. A conductive layer may be deposited filling the opening and covering the first interconnect dielectric layer 126*a*, and a planarization may thereafter be performed into the conductive layer to remove the conductive layer from atop the first interconnect dielectric layer. Other suitable processes are, however, amenable.

Figure 60:
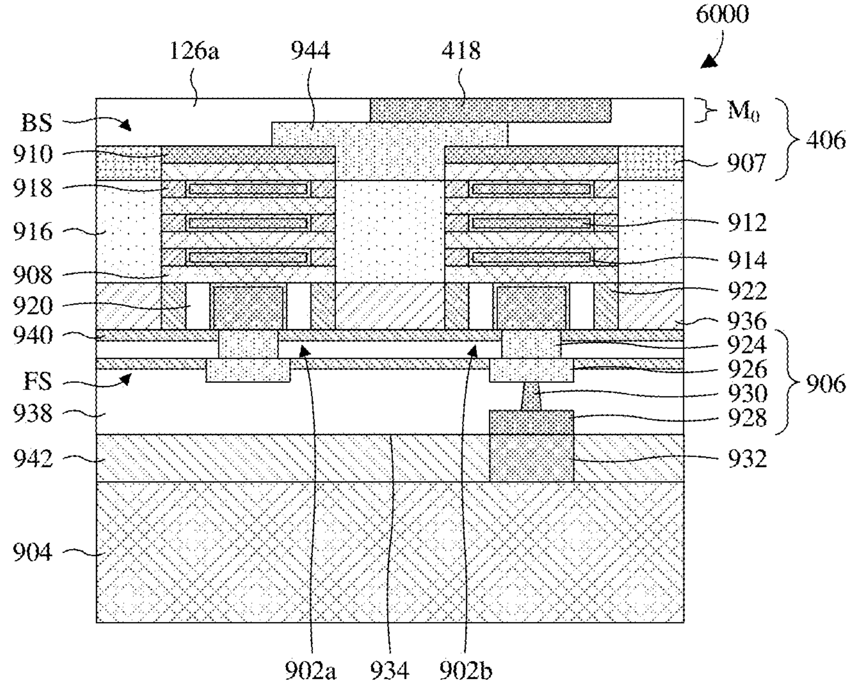

As illustrated by the cross-sectional view 6000 of FIG. 60, additional dielectric material is deposited atop the contact plug 944 to extend the first interconnect dielectric layer 126*a* over the contact plug 944. Further, a wire 418 is formed inset into first interconnect dielectric layer 126*a*, overlying and extending from the contact plug 944. The contact plug 944 and the wire 418 partially form a second interconnect structure 406, and the wire 418 corresponds to a wire level $M_0$ of the second interconnect structure 406. The wire 418 may, for example, be formed by patterning the first interconnect dielectric layer 126*a* to form an opening overlying the contact plug and subsequently filling the opening with conductive material.

Figure 61:
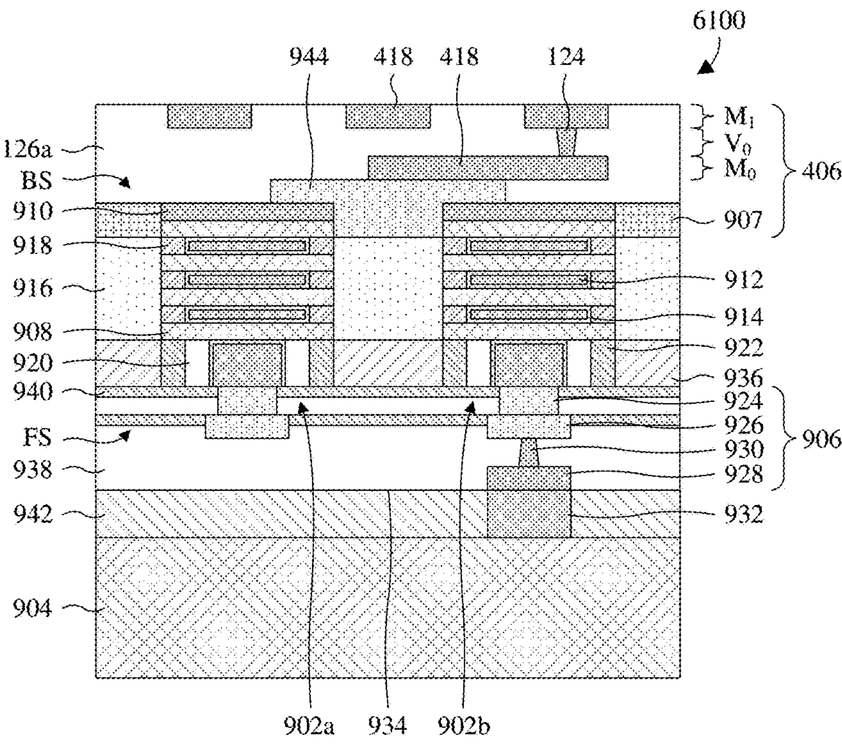

As illustrated by the cross-sectional view 6100 of FIG. 61, additional dielectric material is deposited atop the wire level $M_0$. Further, additional wires 418 and a via 124 are formed inset into the first interconnect dielectric layer 126*a* and overlying the wire level $M_0$ to extend the second interconnect structure 406. The additional wires 418 form a wire level $M_1$ over the wire level $M_0$, and the via 124 forms a via level $V_0$ extending between the wire level $M_0$ and the wire level $M_1$. The additional wires 418 and the via 124 may, for example, be formed by patterning the first interconnect dielectric layer 126*a* to form openings overlying the wire level $M_0$ and subsequently filling the openings with conductive material.

Figure 62:
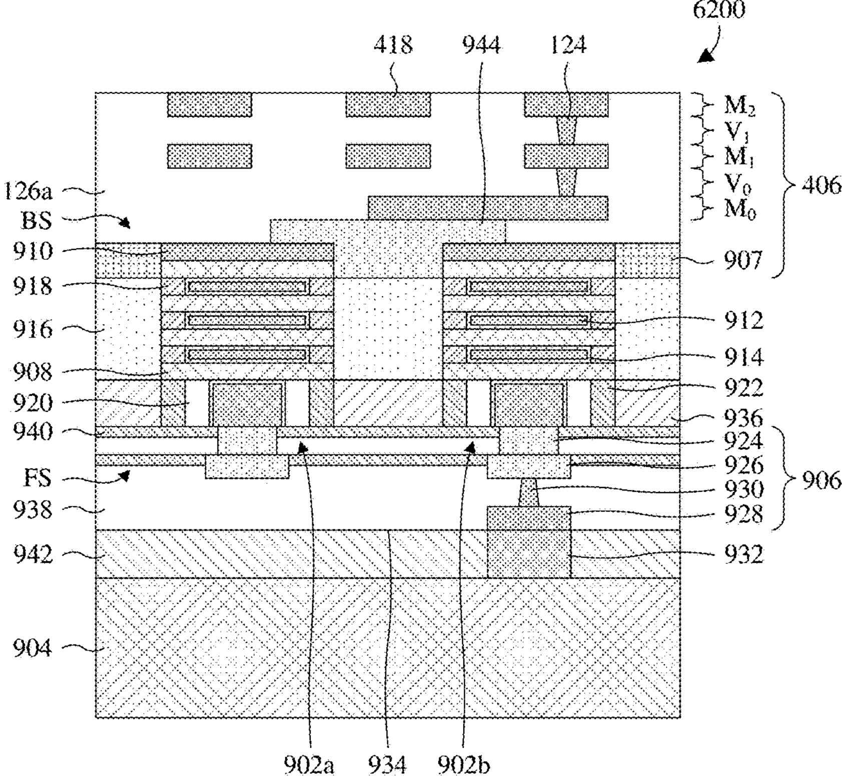

As illustrated by the cross-sectional view 6200 of FIG. 62, the acts described with regard to FIG. 61 are repeated to extend the second interconnect structure 406 with additional wires 418 and an additional via 124. The additional wires 418 form a wire level $M_2$, and the additional via 124 forms a via level $V_1$ between the wire level $M_1$ and the wire level $M_2$.

Figure 63:
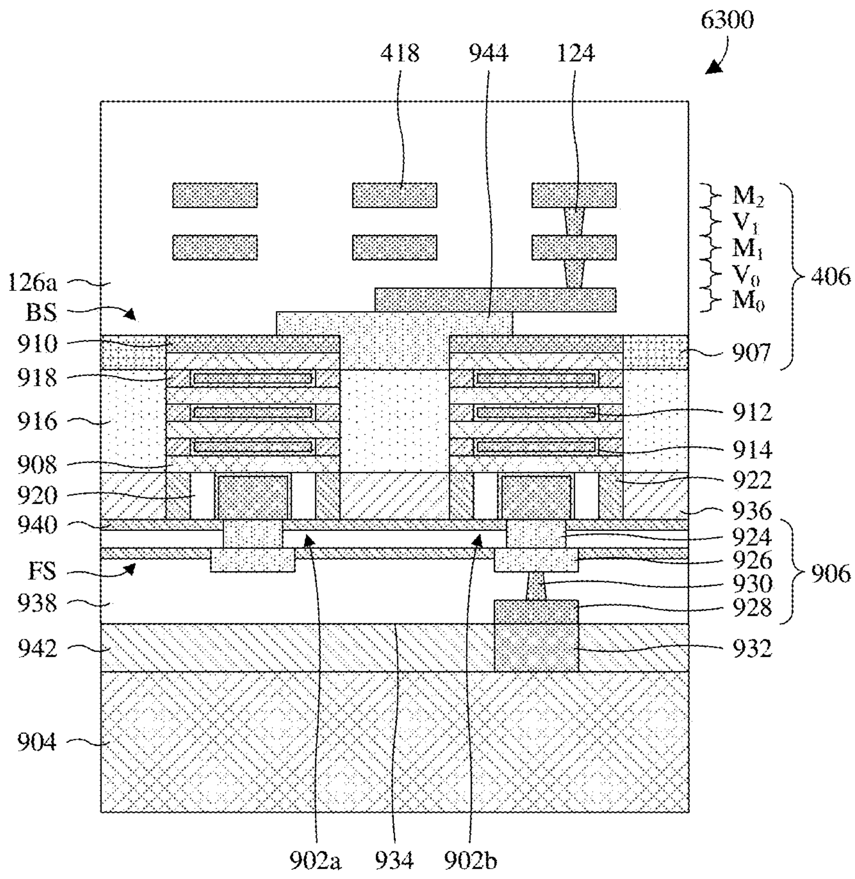

As illustrated by the cross-sectional view 6300 of FIG. 63, additional dielectric material is deposited atop the wire level $M_2$ to extend the first interconnect dielectric layer 126*a*.

Figure 64:
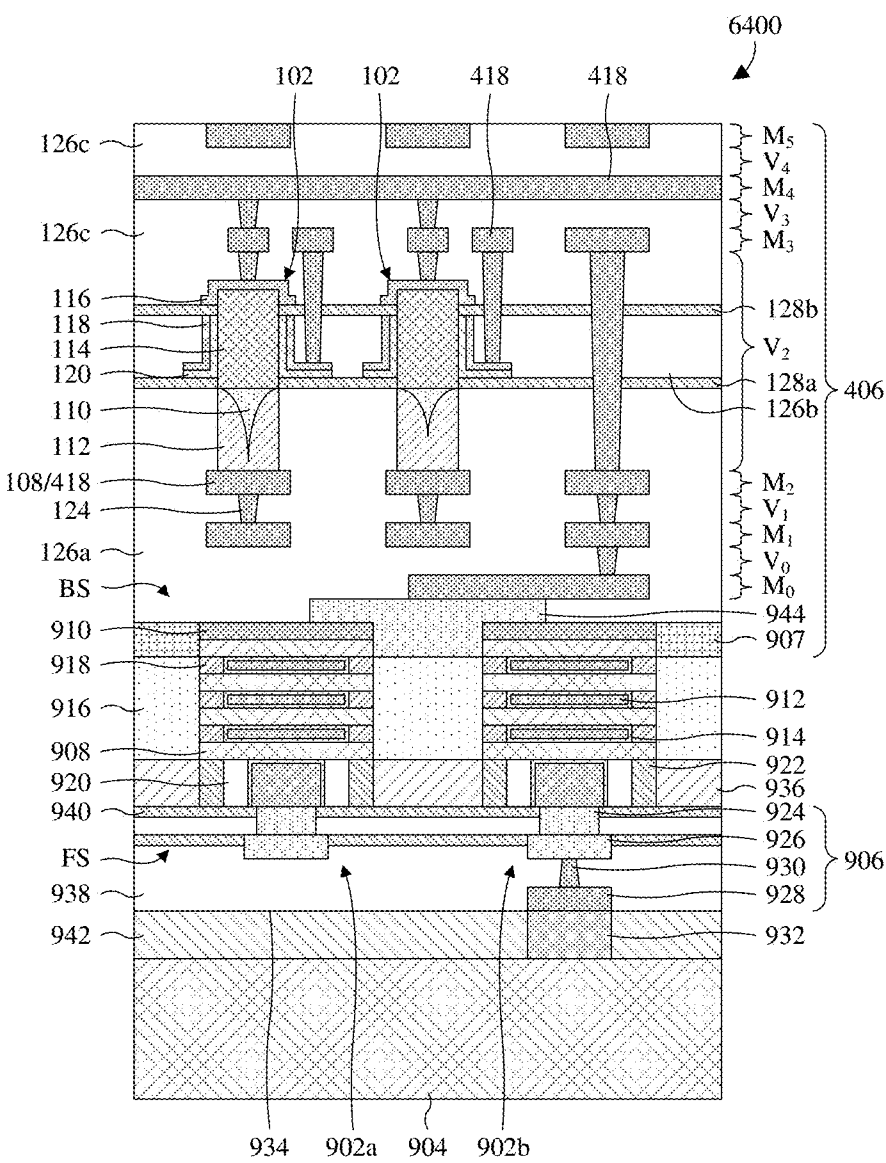

As illustrated by the cross-sectional view 6400 of FIG. 64, the acts described with regard to FIGS. 12-37 are performed. This forms a pair of vertical GAA memory cells 102 and completes the second interconnect structure 406. The second interconnect structure 406, as completed, further includes additional via levels $V_2$, $V_3$, and $V_4$ and additional wire levels $M_3$, $M_4$, and $M_5$. In alternative embodiments, the acts described with regard to FIGS. 39-42 are instead performed, or the acts described with regard to FIGS. 43-48 are instead performed.

While FIGS. 52-64 are described with reference to a method, it will be appreciated that the structures shown in these figures are not limited to the method but rather may stand alone separate of the method. While FIGS. 52-64 are described as a series of acts, it will be appreciated that the order of the acts may be altered in other embodiments. While FIGS. 52-64 illustrate and describe as a specific set of acts, some acts that are illustrated and/or described may be omitted in other embodiments. Further, acts that are not illustrated and/or described may be included in other embodiments.

In some embodiments, the present disclosure is directed to a memory cell, including: a lower conductor; a middle conductor overlying the lower conductor and decreasing in width towards the lower conductor to culminate in a point spaced over the lower conductor; an insulator structure between the lower conductor and the middle conductor; a semiconductor channel overlying the middle conductor; a gate electrode laterally surrounding the semiconductor channel on a sidewall of the semiconductor channel; a gate dielectric layer separating the gate electrode from the semiconductor channel; and an upper conductor atop the semiconductor channel. In some embodiments, the middle conductor and the semiconductor channel correspond to different regions of a common semiconductor layer. In some embodiments, the middle conductor has a different material composition than the semiconductor channel. In some embodiments, the middle conductor has a same material type as the gate electrode and/or as the upper conductor. In some embodiments, the insulator structure extends along sidewalls of the middle conductor and directly contacts both the lower conductor and the middle conductor. In some embodiments, the upper conductor wraps around a top of the semiconductor channel from the sidewall of the semiconductor channel to a top surface of the semiconductor channel. In some embodiments, the memory cell further includes an etch stop layer on the sidewall of the semiconductor channel, wherein the etch stop layer separates the upper conductor from the gate dielectric layer and further separates the upper conductor from the gate electrode.

In some embodiments, the present disclosure is directed to an integrated chip, including: a first memory cell including a first resistor and a first transistor atop the first resistor, wherein the first resistor includes a first conductor and shares a second conductor with the first transistor, and wherein the second conductor overlies the first conductor has a first pointed tip extending towards the first conductor; and a second memory cell including a second resistor and a second transistor atop the second resistor, wherein the second resistor includes a third conductor and shares a fourth conductor with the second transistor, and wherein the fourth conductor overlies the third conductor and has a second pointed tip extending towards the third conductor; wherein the first and second pointed tips have different heights. In some embodiments, the first and second transistors include individual gate electrodes that are continuously connected. In some embodiments, the integrated chip further includes: a first conductive wire and a second conductive wire level with each other and overlying the first transistor; and a first via and a second via extending respectively from the first and second conductive wires respectively to a gate electrode of the first transistor and a source/drain of the first transistor. In some embodiments, the integrated chip further includes: a first conductive wire and a second conductive wire overlying the first transistor, wherein a top surface of the first conductive wire is recessed relative to a bottom surface of the second conductive wire; and a first conductive via and a second conductive via extending respectively from the first and second conductive wires respectively to a gate electrode of the first transistor and a source/drain of the first transistor. In some embodiments, the integrated chip further includes: a gate-all-around (GAA) transistor having a frontside and a backside opposite the frontside; a first interconnect structure on the frontside of the GAA transistor, wherein the first interconnect structure includes a conductive feature extending to a gate electrode of the GAA transistor; and a second interconnect structure on the backside of the GAA transistor, wherein the second interconnect structure surrounds and electrically couples to the first and second memory cells. In some embodiments, the integrated chip further includes: an interconnect structure overlying a semiconductor substrate and including a plurality of conductive wires and a plurality of conductive vias that are alternatingly stacked, wherein the first and third conductors correspond to two of the plurality of conductive wires.

In some embodiments, the present disclosure provides a method for forming a memory cell, including: patterning a first dielectric layer to form a trench exposing a lower conductor; depositing an insulator layer filling the trench, wherein a seam forms and is sealed in the trench during the depositing of the insulator layer; etching back the insulator layer to clear the insulator layer from over a top surface of the first dielectric layer and to open the seam; forming a middle conductor filling and conforming to an unfilled portion of the trench after the etching back; forming a semiconductor channel atop the middle conductor; forming a gate electrode surrounding the semiconductor channel; and forming an upper conductor atop the semiconductor channel. In some embodiments, the unfilled portion of the trench decreases in width towards the lower conductor to culminate in a point spaced over the lower conductor. In some embodiments, the forming of the middle conductor includes: depositing a conductive layer filling the unfilled portion of the trench; and performing a planarization into the conductive layer to clear the conductive layer from atop the first dielectric layer, wherein a portion of the conductive layer in the trench corresponds to the middle conductor. In some embodiments, the forming of the semiconductor channel includes: depositing a semiconductor layer over the middle conductor; and patterning the semiconductor layer into a columnar structure atop the middle conductor, wherein the columnar structure corresponds to the semiconductor channel. In some embodiments, the forming of the middle conductor includes: depositing a sacrificial layer filling the unfilled portion of the trench; performing a planarization into the sacrificial layer to clear the sacrificial layer from atop the first dielectric layer; depositing an etch stop layer overlying the first dielectric layer and the sacrificial layer; patterning the etch stop layer to form an opening exposing the sacrificial layer; and replacing the sacrificial layer with semiconductor material, which corresponds to the middle conductor. In some embodiments, the forming of the gate electrode includes: depositing a conductive layer overlying the semiconductor channel and lining sidewalls of the semiconductor channel; and etching back the conductive layer so a top surface of the conductive layer is recessed relative to a top surface of the semiconductor channel, wherein a portion of the conductive layer persisting on the sidewalls of the semiconductor channel corresponds to the gate electrode. In some embodiments, the method further includes depositing an etch stop layer overlying a top surface of the gate electrode, wherein the forming of the upper conductor includes: depositing a conductive layer overlying the semiconductor channel and the etch stop layer, and further on sidewalls of the semiconductor channel; and patterning the conductive layer into the upper conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory cell, comprising:

patterning a first dielectric layer to form a trench exposing a lower conductor;

depositing an insulator layer filling the trench, wherein a seam forms and is sealed in the trench during the depositing of the insulator layer;

etching back the insulator layer to clear the insulator layer from over a top surface of the first dielectric layer and to open the seam;

forming a middle conductor filling and conforming to an unfilled portion of the trench after the etching back;

forming a semiconductor channel atop the middle conductor;

forming a gate electrode surrounding the semiconductor channel; and forming an upper conductor atop the semiconductor channel.

2. The method according to claim 1, wherein the unfilled portion of the trench decreases in width towards the lower conductor to culminate in a point spaced over the lower conductor.

3. The method according to claim 1, wherein the forming of the middle conductor comprises:

depositing a conductive layer filling the unfilled portion of the trench; and performing a planarization into the conductive layer to clear the conductive layer from atop the first dielectric layer, wherein a portion of the conductive layer in the trench corresponds to the middle conductor.

4. The method according to claim 1, wherein the forming of the semiconductor channel comprises:

depositing a semiconductor layer over the middle conductor; and patterning the semiconductor layer into a columnar structure atop the middle conductor, wherein the columnar structure corresponds to the semiconductor channel.

5. The method according to claim 1, wherein the forming of the middle conductor comprises:

depositing a sacrificial layer filling the unfilled portion of the trench;

performing a planarization into the sacrificial layer to clear the sacrificial layer from atop the first dielectric layer;

depositing an etch stop layer overlying the first dielectric layer and the sacrificial layer;

patterning the etch stop layer to form an opening exposing the sacrificial layer; and replacing the sacrificial layer with semiconductor material, which corresponds to the middle conductor.

6. The method according to claim 1, wherein the forming of the gate electrode comprises:

depositing a conductive layer overlying the semiconductor channel and lining sidewalls of the semiconductor channel; and etching back the conductive layer so a top surface of the conductive layer is recessed relative to a top surface of the semiconductor channel, wherein a portion of the conductive layer persisting on the sidewalls of the semiconductor channel corresponds to the gate electrode.

7. The method according to claim 1, further comprising depositing an etch stop layer overlying a top surface of the gate electrode, and wherein the forming of the upper conductor comprises:

depositing a conductive layer overlying the semiconductor channel and the etch stop layer, and further on sidewalls of the semiconductor channel; and patterning the conductive layer into the upper conductor.

8. A method for forming a memory cell, comprising:

patterning a first dielectric layer to form a pair of trenches respectively overlying and exposing a pair of lower conductors;

depositing a second dielectric layer overlying the first dielectric layer and in the pair of trenches, wherein a pair of voids form in the second dielectric layer, respectively at the pair of trenches, and are sealed at completion of the depositing;

opening the pair of voids after the depositing;

forming a pair of middle conductors respectively filling the pair of voids;

forming a pair of semiconductor channels respectively overlying the pair of middle conductors; and forming a pair of gate electrodes respectively on sidewalls of the pair of semiconductor channels;

wherein the pair of voids form with different cross-sectional areas.

9. The method according to claim 8, wherein the opening comprises etching back the second dielectric layer to expose the first dielectric layer.

10. The method according to claim 8, further comprising:

depositing a conductive layer overlying the pair of semiconductor channels and on the sidewalls of the pair of semiconductor channels; and patterning the conductive layer to form a pair of upper electrodes respectively overlying the pair of semiconductor channels and into which the pair of semiconductor channels are respectively recessed.

11. The method according to claim 10, further comprising:

forming a first via extending to a first gate electrode of the pair of gate electrodes; and forming a second via extending to a first upper electrode of the pair of upper electrodes, wherein a top surface of the second via is elevated relative to a top surface of the first via.

12. The method according to claim 8, wherein the pair of middle conductors are formed with individual heights that are different and individual top surfaces that are about level with each other.

13. The method according to claim 8, wherein the forming of the pair of gate electrodes comprises:

depositing a conductive layer overlying the pair of semiconductor channels and on the sidewalls of the pair of semiconductor channels;

patterning the conductive layer to form the pair of gate electrodes; and recessing individual top surfaces of the pair of gate electrodes to below individual top surfaces of the pair of semiconductor channels after the patterning of the conductive layer.

14. The method according to claim 8, further comprising:

forming a pair of transistors on a first substrate and sharing a source or drain;

forming a first interconnect structure electrically coupled to individual gate electrodes of the pair of transistors on a first side of the pair of transistors;

bonding the first substrate to a second substrate with the pair of transistors and the first interconnect structure between the first and second substrates;

removing the first substrate;

forming a contact plug extending to the source or drain on a second side of the pair of transistors opposite the first side; and forming a second interconnect structure electrically coupled to the pair of transistors via the contact plug on the second side, wherein the pair of lower conductors are formed on the second side of the pair of transistors, separated from the pair of transistors by a portion of the second interconnect structure.

15. A method for forming a memory cell, comprising:

patterning a dielectric layer to form a trench exposing a lower conductor;

depositing an insulator layer lining the trench and only partially filling the trench;

etching back the insulator layer to clear the insulator layer from a top surface of the dielectric layer;

depositing a sacrificial layer overlying the dielectric layer and filling a remainder of the trench over the insulator layer after the etching back;

performing a planarization to clear the sacrificial layer from the top surface of the dielectric layer;

depositing an etch stop layer overlying the dielectric and sacrificial layers;

patterning the etch stop layer to form an opening exposing the sacrificial layer;

removing the sacrificial layer to partially clear the trench;

forming a semiconductor structure in the opening with a bottom protrusion protruding into a portion of the insulator layer in the trench; and forming a gate electrode surrounding the semiconductor structure.

16. The method according to claim 15, further comprising:

forming an upper conductor overlying the semiconductor structure; and forming a pair of vias overlying and extending respectively to the gate electrode and the upper conductor, wherein individual top surfaces of the pair of vias are level with each other.

17. The method according to claim 15, further comprising:

forming an upper conductor overlying the semiconductor structure;

forming a first via extending to the gate electrode; and forming a second via extending to the upper conductor, wherein a top surface of the second via is elevated relative to a top surface of the first via.

18. The method according to claim 15, wherein the forming of the semiconductor structure comprises:

depositing a semiconductor layer overlying the etch stop layer and filling the opening; and patterning the semiconductor layer to form the semiconductor structure with a columnar structure.

19. The method according to claim 15, further comprising:

depositing an additional dielectric layer overlying the gate electrode;

recessing a top surface of the additional dielectric layer to below a top surface of the gate electrode and a top surface of the semiconductor structure; and recessing the top surface of the gate electrode to about level with the top surface of the additional dielectric layer after the recessing of the top surface of the additional dielectric layer.

20. The method according to claim 19, further comprising:

forming an additional etch stop layer overlying the gate electrode and the additional dielectric layer with a top surface recessed relative to the top surface of the semiconductor structure; and forming an upper conductor overlying the additional etch stop layer and the semiconductor structure, and on sidewalls of the semiconductor structure.

* * * * *